US007586504B2

(12) United States Patent
Nakahira et al.

(10) Patent No.: US 7,586,504 B2
(45) Date of Patent: *Sep. 8, 2009

(54) AMPLIFIER CIRCUIT, DRIVING CIRCUIT OF DISPLAY APPARATUS, PORTABLE TELEPHONE AND PORTABLE ELECTRONIC APPARATUS

(75) Inventors: Yoshihiko Nakahira, Tokyo (JP); Hiroshi Tsuchi, Tokyo (JP)

(73) Assignee: NEC Corporation, Tokyo (JP)

( * ) Notice: Subject to any disclaimer, the term of this patent is extended or adjusted under 35 U.S.C. 154(b) by 460 days.

This patent is subject to a terminal disclaimer.

(21) Appl. No.: 11/294,605

(22) Filed: Dec. 6, 2005

(65) Prior Publication Data

US 2006/0098032 A1 May 11, 2006

Related U.S. Application Data

(62) Division of application No. 10/358,245, filed on Feb. 5, 2003, now Pat. No. 7,005,916.

(30) Foreign Application Priority Data

| Feb. 6, 2002 | (JP) | ............................. 2002-028895 |
| Mar. 13, 2002 | (JP) | ............................. 2002-067769 |

(51) Int. Cl.
*G09G 3/36* (2006.01)
*G09G 5/10* (2006.01)
(52) U.S. Cl. ........................... 345/690; 345/89; 345/100
(58) Field of Classification Search .................... 345/87, 345/89, 98–100, 204, 211, 690
See application file for complete search history.

(56) References Cited

U.S. PATENT DOCUMENTS 4,567,465 A 1/1986 Komiya

| 4,928,308 | A | | 5/1990 | Roessler |
| 5,648,791 | A | * | 7/1997 | Date et al. .................... 345/89 |
| 5,789,974 | A | | 8/1998 | Ferguson, Jr. et al. |
| 6,232,946 | B1 | * | 5/2001 | Brownlow et al. ............ 345/98 |
| 6,310,593 | B1 | * | 10/2001 | Nakao ........................ 345/87 |
| 6,323,848 | B1 | * | 11/2001 | Abe .......................... 345/204 |

(Continued)

FOREIGN PATENT DOCUMENTS

EP 0 243 792 11/1987

(Continued)

OTHER PUBLICATIONS

R.M. A. Dawson et al., Design of an Improved Pixel for a Polysilicon Active-Matrix Organic LED Display, SID 98 Digest, p. 11-14.

*Primary Examiner*—Sumati Lefkowitz
*Assistant Examiner*—Seokyun Moon
(74) *Attorney, Agent, or Firm*—Young & Thompson

(57) ABSTRACT

To obtain an amplifier circuit capable of realizing low power consumption and high-precision output. A controlling unit controls each switch of an offset correction circuit to select one capacitor associated with a voltage level of an input signal selected by an input signal selection unit, have an offset voltage of an operational amplifier generated according to the voltage level of the input signal stored by the selected capacitor, and correct an output of the operational amplifier by using the offset voltage held by the selected capacitor.

20 Claims, 50 Drawing Sheets

U.S. PATENT DOCUMENTS

| | | |
|---|---|---|
| 6,480,178 B1 | 11/2002 | Itakura et al. |
| 6,727,749 B1 | 4/2004 | Quinn |
| 2002/0033786 A1 * | 3/2002 | Akimoto et al. ............... 345/87 |

FOREIGN PATENT DOCUMENTS

| | | |
|---|---|---|
| EP | 1 094 440 | 4/2001 |
| JP | 59-154808 | 9/1984 |
| JP | 62-261205 | 11/1987 |
| JP | 2-91514 | 3/1990 |
| JP | 5-216430 | 8/1993 |
| JP | 6-213435 | 8/1994 |
| JP | 7-147518 | 6/1995 |
| JP | 09-093055 | 4/1997 |
| JP | 09-244590 | 9/1997 |
| JP | 9-259597 | 10/1997 |
| JP | 2885151 | 2/1999 |
| JP | 11-249624 | 9/1999 |
| JP | 2001-67047 | 3/2001 |
| JP | 2001-94884 | 4/2001 |
| JP | 2001-100704 | 4/2001 |

* cited by examiner

AMPLIFIER CIRCUIT, DRIVING CIRCUIT OF DISPLAY APPARATUS, PORTABLE TELEPHONE AND PORTABLE ELECTRONIC APPARATUS

This application is a division of co-pending application Ser. No. 10/358,245, filed on Feb. 5, 2003, the entire contents of which are hereby incorporated by reference.

BACKGROUND OF THE INVENTION

1. Field of the Invention

The present invention relates to an amplifier circuit for driving a load and a controlling method thereof, a driving circuit of a display apparatus and a controlling method thereof a portable telephone and a portable electronic apparatus, and in particular, to the amplifier circuit for correcting an offset voltage of an operational amplifier and a driving circuit of the display apparatus for performing multiple gray scale level display.

2. Description of the Prior Art

In the past, an amplifier circuit for driving a load has a problem that an offset voltage arises due to variations in characteristics of active elements constituting the amplifier circuit. To solve this problem, various methods of correcting the offset voltage have been used so far. Of these methods, the amplifier circuits described in Japanese Patent Laid-Open No. 62-261205 and Japanese Patent Laid-Open No. 9-244590 can be named as representative examples of the amplifier circuits having offset voltage correction means using a capacitor.

FIG. 46 is a diagram showing a configuration of the amplifier circuit in the past described in Japanese Patent Laid-Open No. 62-261205. The amplifier circuit in the past shown in FIG. 46 has operational amplifiers 641 and 642 having differential inputs +IN and −IN applied to a non-inverting input terminal and an inverting input terminal from circuit input terminals 621 and 622 respectively, capacitors 631 and 632 and transistor switches 601 to 612. The switches 601, 602, 608, 609, 610 and 611 form a first switch group, and the switches 603, 604, 605, 606, 607 and 612 form a second switch group. The first and second switch groups are controlled to be alternately on.

Operation of the amplifier circuit shown in FIG. 46 will be described. In FIG. 46, first, control is exerted so that the first switch group is in an on state and the second switch group is in an off state. As the switches 601, 602 and 611 are closed in these states, the operational amplifier 641 outputs a differential signal supplied to the input terminal to an output terminal. On the other hand, the non-inverting input terminal of the operational amplifier 642 is grounded, and an offset voltage portion is outputted to the output terminal. The capacitor 632 is charged by this offset voltage so as to hold the offset voltage.

Next, the control is exerted so that the first switch group is in the off state and the second switch group is in the on state. As the switches 606, 607 and 612 are closed and the capacitor 632 is connected in series between the input terminal 622 and the inverting input terminal of the operational amplifier 642 in these states, the differential signal −IN has the offset voltage of a reverse polarity superimposed thereon and is applied to the inverting input terminal of the operational amplifier 642. As a result of this, the output of the operational amplifier 642 has the offset voltage set off therefrom and is corrected.

As the alternate operations of the above switch groups are repeated, the same operation as the operational amplifier 642 is also performed as to the operational amplifier 641, so that the offset voltage of the operational amplifier 641 is also corrected. The corrected output voltages of the operational amplifiers 641 and 642 are alternately outputted to an output terminal 623 so as to allow high-precision output in the amplifier circuit in FIG. 46.

FIG. 47 is a diagram showing the configuration of the amplifier circuit in the past described in Japanese Patent Laid-Open No. 9-244590. The amplifier circuit in the past shown in FIG. 47 has an operational amplifier 703 and an offset correction circuit 704, where the offset correction circuit 704 has a capacitor 705 and switches 706 to 708. An input voltage Vin supplied from the outside is inputted to the non-inverting input terminal of the operational amplifier 703 via an input terminal 701 of the amplifier circuit. The output voltages Vout of the operational amplifier 703 are outputted to the outside via an output terminal 702 of the amplifier circuit.

The switches 706 and 707 are connected in series between the non-inverting input terminal of the operational amplifier 703 and the output terminal of the operational amplifier 703. The capacitor 705 is connected between a connection point of the switches 706 and 707 and the inverting input terminal of the operational amplifier 703. In addition, the switch 708 is connected between the inverting input terminal of the operational amplifier 703 and the output terminal of the operational amplifier 703.

Next, the operation of the amplifier circuit shown in FIG. 47 will be described by using the drawings. FIG. 48 is a timing chart showing the operation of the amplifier circuit shown in FIG. 47. As shown in FIGS. 47 and 48, first, only the switch 707 is in the on state and the other switches 706 and 708 are in the off state in a period T1 having a previous state. Thus, the output terminal and the inverting input terminal of the operational amplifier 703 are connected via the capacitor 705. In this state, the voltage level of the output voltage Vout is continued by a previous output voltage.

In a period T2, the switch 708 is on in addition to the switch 707. If the voltage level of the input voltage Vin changes, the output voltage Vout changes accordingly, and it becomes Vin+Voff including the offset voltage Voff. At this time, the capacitor 705 is short-circuited, and both ends of the capacitor 705 are at the same potential. In addition, the switches 707 and 708 are turned on so that both ends of the capacitor 705 are connected to the output terminal of the operational amplifier 703, and so the potentials of both ends of the capacitor 705 become Vout (=Vin+Voff) due to the output of the operational amplifier 703.

In a period T3, the switch 707 is turned off while keeping the switch 708 on, and thereafter, the switch 706 is turned on. Thus, one end of the capacitor 705 is connected to the input terminal, and the potential thereof changes from Vout to Vin. As the switch 708 is on, the potential of the other end of the capacitor 705 remains at the output voltage Vout. Therefore, the voltage applied to the capacitor 705 is Vout−Vin=Vin+Vout−Vin=Voff, and the capacitor 705 is charged by a charge equivalent to the offset voltage Voff.

In a period T4, the switches 706 and 708 are turned off, and thereafter, the switch 707 is turned on. As the switches 706 and 708 are turned off, the capacitor 705 is directly connected between the inverting input terminal and the output terminal of the operational amplifier 703 so that the offset voltage Voff is held by the capacitor 705. The switch 707 is turned on so that the offset voltage Voff is applied to the inverting input terminal of the operational amplifier 703 in reference to the potential of the output terminal. As a result of this, the output voltage Vout becomes Vout=Vin+Voff−Voff=Vin, and so the offset voltage is set off and the operational amplifier 703 can output a high-precision voltage.

However, as for the amplifier circuit shown in FIG. 46, it is necessary to constantly raise the potential of one end of the capacitor from a ground potential to the level of the input signal −IN. For that reason, there is a problem that it requires significant power consumption because it is accompanied by charge and discharge of the capacitor in an offset correcting operation.

On the other hand, as for the amplifier circuit shown in FIG. 47, a potential difference between both ends of the capacitor is only the amount of the offset voltage, so that the power consumption by charge and discharge of the capacitor can be lower than that of the amplifier circuit shown in FIG. 46.

However, the amount of the offset voltage generated to the operational amplifier is different according to the voltage level of the input signal. Moreover, fluctuation of the offset voltage due to the change in the voltage level of the input signal is the fluctuation in the units of mV. In the case where the amplifier circuit is used for a driving circuit for driving a liquid crystal display for instance, however, this fluctuation in the units of mV influences gray scale level display of the liquid crystal display. In particular, in the case where multiple gray scale level display and high-definition display are required by the liquid crystal display, it is essential to deal with the fluctuation of the offset voltage.

Therefore, in the case where the voltage level of the input signal supplied to, the amplifier circuit shown in FIG. 47 changes in each output period, the amount of the offset voltage generated to the operational amplifier 703 changes in each output period, and so it is necessary to perform the offset correcting operation in each output period in order to realize high-precision output in the amplifier circuit shown in FIG. 47. If the offset correcting operation is performed in each output period, the capacitor for storing the offset voltage must be charged and discharged in each output period, and thus there is a problem that the power consumption on the offset correcting operation is significant even in the case of the amplifier circuit shown in FIG. 47.

In addition, if the offset correcting operation is performed by switch control, there is also a problem that output precision lowers due to influence of capacity coupling occurring on switching. This is because, as a parasitic capacity exists in an MOS transistor used for each switch, movement of a charge arises via the parasitic capacity on switching, and the charge equivalent to the offset voltage stored and held in the capacitor is influenced thereby. While it is possible to curb the lowering of the output precision occurring due to the influence of the capacity coupling on switching by increasing the capacity of the capacitor for storing the offset voltage, there is a problem that, if the capacity is increased, the power consumption increases due to the charge and discharge of the capacitor by the offset correcting operation performed in each output period.

While the problems of the amplifier circuits shown in FIGS. 46 and 47 were described above, the other amplifier circuits having offset correction means using the capacitor also have the same problems.

As the liquid crystal display has advantages of a low profile, light weight and low power, it is used for the display apparatuses of various types of equipment such as a note-sized personal computer. In particular, the liquid crystal display using an active matrix driving method is in increasing demand since it has advantages of allowing fast response, high-definition display and multiple gray scale level display.

A display portion of the liquid crystal display using an active matrix driving method generally has a semiconductor substrate on which transparent picture electrodes and thin-film transistors (TFT) are placed and an opposed substrate forming one transparent electrode on the entire surface, and is constituted by having these two substrates facing each other and inserting liquid crystal between them. And the TFT having a switching function is controlled to apply a predetermined voltage to each picture electrode, and transmittance of the liquid crystal is changed by the potential difference between each picture electrode and an opposed electrode provided on the opposed substrate so as to display an image. The semiconductor substrate has a data line for sending a plurality of level voltages (gray scale level voltages) to be applied to each picture electrode and a scanning line for sending a switching control signal of the TFT wired thereon, and application of gray scale level voltages to each picture electrode is performed via the data line. While various data line driving circuits have been used so far as a method of driving the data line, a representative example of the data line driving circuit thereof will be described below.

FIG. 49 is a diagram showing a configuration of a first data line driving circuit in the past. The driving circuit shown in FIG. 49 has a plurality of gray scale level voltages generated by a resistance string 421 impedance-converted by operational amplifiers 423-1 to 423-n (n is a positive integer) provided to the respective gray scale level voltages and has the voltages necessary for driving selected, of the impedance-converted gray scale level voltages, by selectors 422-1 to 422-m (m is a positive integer) and outputs them to a data line load so as to drive the data line. As this driving circuit has each of the plurality of gray scale level voltages generated by the resistance string 421 impedance-converted by the operational amplifiers 423-1 to 423-n, it has a high data line driving capability, and so it can increase a resistance value of the resistance string 421 for generating the gray scale level voltages and decrease the current running in the resistance string 421 so as to lower the power consumption of the driving circuit.

On the other hand, in the case of a large-sized liquid crystal display, it has a large number of data lines and the capacity of each data line is larger, so that a high driving capability is required of the data line driving circuit. As for the driving circuit in FIG. 49, there are the cases where a plurality of data lines are driven by one gray scale level voltage, and so it is short of the driving capability in case of being used for the large-sized liquid crystal display. Consequently, a second data line driving circuit in the past shown in FIG. 50 can be named as the data line driving circuit capable of obtaining sufficient driving capability even in case of being used for the large-sized liquid crystal display. The driving circuit in FIG. 50 has the gray scale level voltages necessary for driving selected, of the plurality of gray scale level voltages generated by a resistance string 421, by selectors 422-1 to 422-m, and has them impedance-converted by operational amplifiers 424-1 to 424-m provided to each data line as a data line output circuit, and outputs them to one data line load to apply a predetermined gray scale level voltage to each data line. As this driving circuit has the gray scale level voltages selected by the selectors impedance-converted by the operational amplifier provided to each data line, it has the sufficient driving capability even in case of being used for the large-sized liquid crystal display.

In recent years, portable apparatuses centering on a portable telephone and a personal digital assistant and so on are drastically becoming popular, and a mobile display is in highly increasing demand as the display apparatus for the portable apparatus. Although the capabilities required of the mobile display was centered on low power consumption in the past, the high-definition and multiple gray scale level display capabilities are also required in conjunction with diffusion of the portable apparatuses these days.

As for the liquid crystal display for performing the multiple gray scale level display, high output precision is required of the driving circuit because the potential difference between the adjacent gray scale level voltages is small. However, the driving circuit shown in FIG. 49 has a problem that, as each of the operational amplifiers 423-1 to 423-n has the offset voltage generated due to variations in characteristics of the transistors constituting the operational amplifiers, variations arise as to precision of the output voltage and display quality is lowered. The driving circuit shown in FIG. 50 also has the problem that, as each of the data line output circuits 424-1 to 424-m has the offset voltages generated as with the driving circuit in FIG. 49, the variations arise as to the precision of the output voltage and color shading occurs.

To solve this problem, there are the cases where each of the data line output circuits 424-1 to 424-m of the driving circuit shown in FIG. 50 uses the operational amplifier to which an offset correcting function is added. To be more specific, there are the cases where each of the data line output circuits 424-1 to 424-m of the driving circuit shown in FIG. 50 uses the amplifier circuit shown in FIG. 47.

In addition, the liquid crystal display for performing the high-definition display generally has the number of data lines which is larger than the number of gray scale levels, and so the driving circuit in FIG. 50 requires a large number of circuits since the data line output circuits 424-1 to 424-m are provided to m pieces of data lines. For that reason, there is a problem that the required area increases and the cost also increases.

In addition, also in case of using the amplifier circuit shown in FIG. 47 as each of the data line output circuits of the driving circuit shown in FIG. 50, it is necessary to provide the amplifier circuit shown in FIG. 47 to each of m pieces of data lines so that the required area increases and the cost also increases as to the liquid crystal display having a large number of data lines.

Furthermore, as for the driving circuit shown in FIG. 50, there are the cases where the voltage level of the input signal inputted to each data line output circuit is different in each output period. As mentioned above, if the voltage level of the input signal changes, the amount of the offset voltage generated to the operational amplifier also changes, so that this fluctuation influences the gray scale level display of the liquid crystal display. Therefore, in the case where each of the data line output circuits of the driving circuit shown in FIG. 50 uses the amplifier circuit shown in FIG. 47, the amount of the offset voltage generated to the operational amplifier 703 in each output period changes as the voltage level of the input signal to each amplifier circuit changes in each output period, and so it is necessary for each amplifier circuit to perform the offset correcting operation in each output period in order to realize the high-precision output in each amplifier circuit and thereby realize the high-precision display and multiple gray scale level display in the liquid crystal display However, there is a problem that, if the offset correcting operation is performed in each output period, the capacitor for storing the offset voltage must be charged and discharged in each output period and thus the power consumption increase.

In addition, the offset correcting operation is performed by switch control, and so there are the cases, as mentioned above, where the output precision of each amplifier circuit lowers due to the influence of capacity coupling occurring on switching. If the capacity of the capacitor is increased to curb the lowering of the output precision, there is a problem that, the power consumption increases due to the charge and discharge of the capacitor by the offset correcting operation performed in each output period.

Moreover, Japanese Patent Laid-Open No. 2001-100704 describes a technology of, by providing a plurality of resistances for adjustment to a resistance dividing circuit for dividing the voltage of liquid crystal driving power, reducing the offset voltage of each amplifier according to the size of the resistance to enhance the output precision. However, there are variations in the resistances themselves in the first place, and so the offset voltage of each amplifier cannot be sufficiently reduced according to the size of the resistance even if so attempted, so that sufficient output precision cannot be obtained.

BRIEF SUMMARY OF THE INVENTION

An object of the present invention is to provide an amplifier circuit capable of realizing the lower power consumption and high-precision output and a controlling method thereof.

In addition, another object of the present invention is to provide a driving circuit of a display apparatus, controlling method thereof, portable telephone and portable electronic apparatus for realizing the low power consumption, high-precision output and low costs.

An amplifier circuit according to the present invention is characterized by including an operational amplifier for amplifying an input signal capable of having a plurality of voltage levels, storing means for storing each of offset voltages generated to the above described operational amplifier according to the voltage level of the above described input signal, and controlling means for correcting output of the above described operational amplifier by using the above described offset voltage stored in the above described storing means.

The above described amplifier circuit is characterized in that the above described storing means is comprised of a plurality of capacitors for storing the above described offset voltages respectively.

In addition, the above described amplifier circuit is characterized in that the above described controlling means performs selective control for selecting one of the above described plurality of capacitors according to the voltage level of the above described input signal, and has the offset voltage of the above described operational amplifier stored in the selected capacitor in a first term of one output period.

In addition, the above described amplifier circuit is characterized in that the above described controlling means corrects the output of the above described operational amplifier by using the above described offset voltage stored in the above described selected capacitor in a second term of the above described one output period.

A controlling method according to the present invention is that of the amplifier circuit including the operational amplifier for amplifying the input signal and the plurality of capacitors, characterized by including a first step of selecting one of the above described plurality of capacitors according to the voltage level of the above described input signal and having the offset voltage of the above described operational amplifier stored in the selected capacitor in the first term of one output period, and a second step of correcting the output of the above described operational amplifier by using the above described offset voltage stored in the above described selected capacitor in the second term of the above described one output period.

The amplifier circuit according to the present invention has each of the offset voltages generated in the operational amplifier stored in the storing means according to the voltage level of the input signal. Therefore, it can reduce the power consumption compared with the amplifier circuit in the past which erased a stored offset voltage and stored a new offset voltage each time the voltage level of the input signal changed.

In addition, it uses a plurality of capacitors as the storing means, and the controlling means has the offset voltages stored and held in one of the capacitors selected according to the voltage level of the input signal, and corrects the output of the operational amplifier by using the offset voltage which is held. For that reason, it is possible to perform a high-precision offset correcting operation so as to allow the high-precision output. Moreover, once the offset voltages are stored and held, the same capacitor is selected when the input signal having the same voltage level is supplied to the amplifier circuit next, and the output of the operational amplifier is corrected by using the offset voltage stored and held in this capacitor, so that there is little power consumption due to the charge and discharge in the capacitor and the power consumption by the offset correcting operation can be curbed to the minimum.

A driving circuit of a display apparatus according to the present invention is characterized by including gray scale level voltage generating means for generating a plurality of gray scale level voltages, a plurality of gray scale level output circuits, provided to a plurality of output terminals of the gray scale level voltage generating means respectively, each of them having the operational amplifier for impedance-converting the input signal inputted via the output terminal of the above described gray scale level voltage generating means, and selection means for, of output signals of the plurality of gray scale level output circuits, selecting a signal necessary for driving the display apparatus, and each of the above described plurality of gray scale level output circuits has storing means for storing in advance each of the offset voltages generated in the above described operational amplifier according to a gray scale level voltage level of the above described input signal, and includes the controlling means for controlling each of the above described plurality of gray scale level output circuits to correct output of the above described operational amplifier by using the above described offset voltages stored in the above described storing means.

In addition, the above described driving circuit is characterized in that the above described storing means of each of the above described plurality of gray scale level output circuits is comprised of a plurality of capacitors for storing the above described offset voltages respectively.

In addition, the above described driving circuit is characterized in that the above described controlling means selects one of the above described plurality of capacitors according to the gray scale level voltage level of the above described input signal, and controls each of the above described plurality of gray scale level output circuits to have the offset voltage of the above described operational amplifier stored by the selected capacitor in a first term of one output period. Moreover, the above described driving circuit is characterized in that the above described controlling means controls each of the above described plurality of gray scale level output circuits to correct output of the above described operational amplifier by using the above described offset voltages stored in the above described selected capacitor in a second term of the above described one output period.

Another driving circuit of a display apparatus according to the present invention is characterized by including the gray scale level voltage generating means for generating the plurality of gray scale level voltages, the plurality of gray scale level output circuits, provided to the plurality of output terminals of the gray scale level voltage generating means respectively, each of them having the operational amplifier for impedance-converting the gray scale level voltage inputted via the output terminal of the above described gray scale level voltage generating means, the selection means for, of the gray scale level voltages outputted from the plurality of gray scale level output circuits, selecting the voltage necessary for driving the display apparatus, and providing one capacitor to each of the above described plurality of gray scale level output circuits, and including controlling means for, in one output period, having an offset voltage generated in the above described operational amplifier due to the above described gray scale level voltage stored in the above described capacitor and controlling each of the above described plurality of gray scale level output circuits to correct the output of the above described operational amplifier by using the stored offset voltage, and in each output period later than the above described one output period, controlling each of the above described plurality of gray scale level output circuits to correct the output of the above described operational amplifier by using the above described offset voltage stored in the above described capacitor in the above described one output period.

A further driving circuit of a display apparatus according to the present invention is characterized by including the gray scale level voltage generating means for generating the plurality of gray scale level voltages, the plurality of gray scale level output circuits, provided to the plurality of output terminals of the gray scale level voltage generating means respectively, each of them having an operational amplifier for impedance-converting the input signal inputted via the output terminal of the above described gray scale level voltage generating means, and selection means for, of the output signals of the plurality of gray scale level output circuits, selecting a signal necessary for driving the display apparatus, and one of a pair of input terminals of the above described operational amplifier is connected to a circuit input terminal of the above described gray scale level output circuit to which the input signal is supplied, and each of the above described plurality of gray scale level output circuits has two capacitors, a first switch connected between the other one of the above described pair of input terminals and the output terminal of the above described operational amplifier, a second switch of which one end is connected to one of the above described pair of input terminals, a third switch connected between the other end of the above described second switch and the above described output terminal, two capacitor selection switches connected between the other end of the above described second switch and one ends of the above described two capacitors respectively, two capacitor selection switches connected between the other one of the above described pair of input terminals and the other ends of the above described two capacitors respectively, and switch controlling means for controlling each of the above described switches of the above described plurality of gray scale level output circuits to have the offset voltage of the above described operational amplifier stored in one of the above described two capacitors according to a polarity of the gray scale level voltage of the above described input signal.

The controlling method of the display apparatus according to the present invention is characterized by including the gray scale level voltage generating means for generating the plurality of gray scale level voltages, the plurality of gray scale level output circuits, provided to the plurality of output terminals of the gray scale level voltage generating means respectively, each of them having the operational amplifier for impedance-converting the input signal inputted via the output terminal of the above described gray scale level voltage generating means and the plurality of capacitors, and the selection means for, of the output signals of the plurality of gray scale level output circuits, selecting the signal necessary for driving the display apparatus, and comprising a first step of controlling each of the above described plurality of gray scale level output circuits to select one of the above described plurality of capacitors according to the gray scale level voltage level of the above described input signal and have the offset voltage of the above described operational amplifier stored in the selected capacitor in the first term of one output period, and a second step of controlling each of the above described plurality of gray scale level output circuits to correct the output of the above described operational amplifier by using the above described offset voltage stored in the above described selected capacitor in the second term of the above described one output period.

Another controlling method of the display apparatus according to the present invention is characterized by having the gray scale level voltage generating means for generating the plurality of gray scale level voltages, the plurality of gray scale level output circuits, provided to the plurality of output terminals of the gray scale level voltage generating means respectively, each of them having the operational amplifier for impedance-converting the input signal inputted via the output terminal of the above described gray scale level voltage generating means, and the selection means for, of the output signals of the plurality of gray scale level output circuits, selecting the signal necessary for driving the display apparatus, and one of the pair of input terminals of the above described operational amplifier is connected to the circuit input terminal of the above described gray scale level output circuit to which the input signal is supplied, and each of the above described plurality of gray scale level output circuits has the two capacitors, the first switch connected between the other one of the above described pair of input terminals and the output terminal of the above described operational amplifier, the second switch of which one end is connected to one of the above described pair of input terminals, the third switch connected between the other end of the above described second switch and the above described output terminal, the two capacitor selection switches connected between the other end of the above described second switch and one ends of the above described two capacitors respectively, the two capacitor selection switches connected between the other one of the above described pair of input terminals and the other ends of the above described two capacitors respectively, and including the step of controlling each of the above described switches of the above described plurality of gray scale level output circuits to have the offset voltage of the above described operational amplifier stored in one of the above described two capacitors according to the polarity of the gray scale level voltage of the above described input signal.

The driving circuit of the display apparatus according to the present invention has each of the offset voltages generated in the operational amplifier according to the gray scale level voltage level of the input signal from the gray scale level voltage generating means stored in the storing means of each gray scale level output circuit. Therefore, it can reduce the power consumption compared with the cases where the offset voltage already stored is erased and a new offset voltage is stored each time the gray scale level voltage level of the input signal changes.

In addition, each gray scale level output circuit uses the plurality of capacitors as the storing means, and has the offset voltages stored and held in one of the capacitors selected according to the gray scale level voltage level of the input signal so as to correct the output of the operational amplifier by using the held offset voltages. For that reason, it is possible to perform high-precision correction of the output of the operational amplifier so as to allow the high-precision output. Moreover, once the offset voltages are stored and held, the same capacitor is selected when the input signal having the same gray scale level voltage level is supplied to the gray scale level output circuit next, and the output of the operational amplifier is corrected by using the offset voltages stored and held in this capacitor, so that there is little power consumption due to the charge and discharge in the capacitor and the power consumption can be curbed to the minimum.

In addition, the gray scale level output circuits are provided to the plurality of output terminals of the gray scale level voltage generating means respectively. To be more specific, the gray scale level output circuit is provided for each gray scale level so that, in the case where the number of gray scale levels is smaller than the number of data lines, the number of output circuits can be further reduced compared to the configuration for providing the output circuit for each data line. Thus, the area of the circuits can be reduced and the lower costs can be realized.

DETAILED DESCRIPTION OF THE PREFERRED EMBODIMENTS

Figure 1:
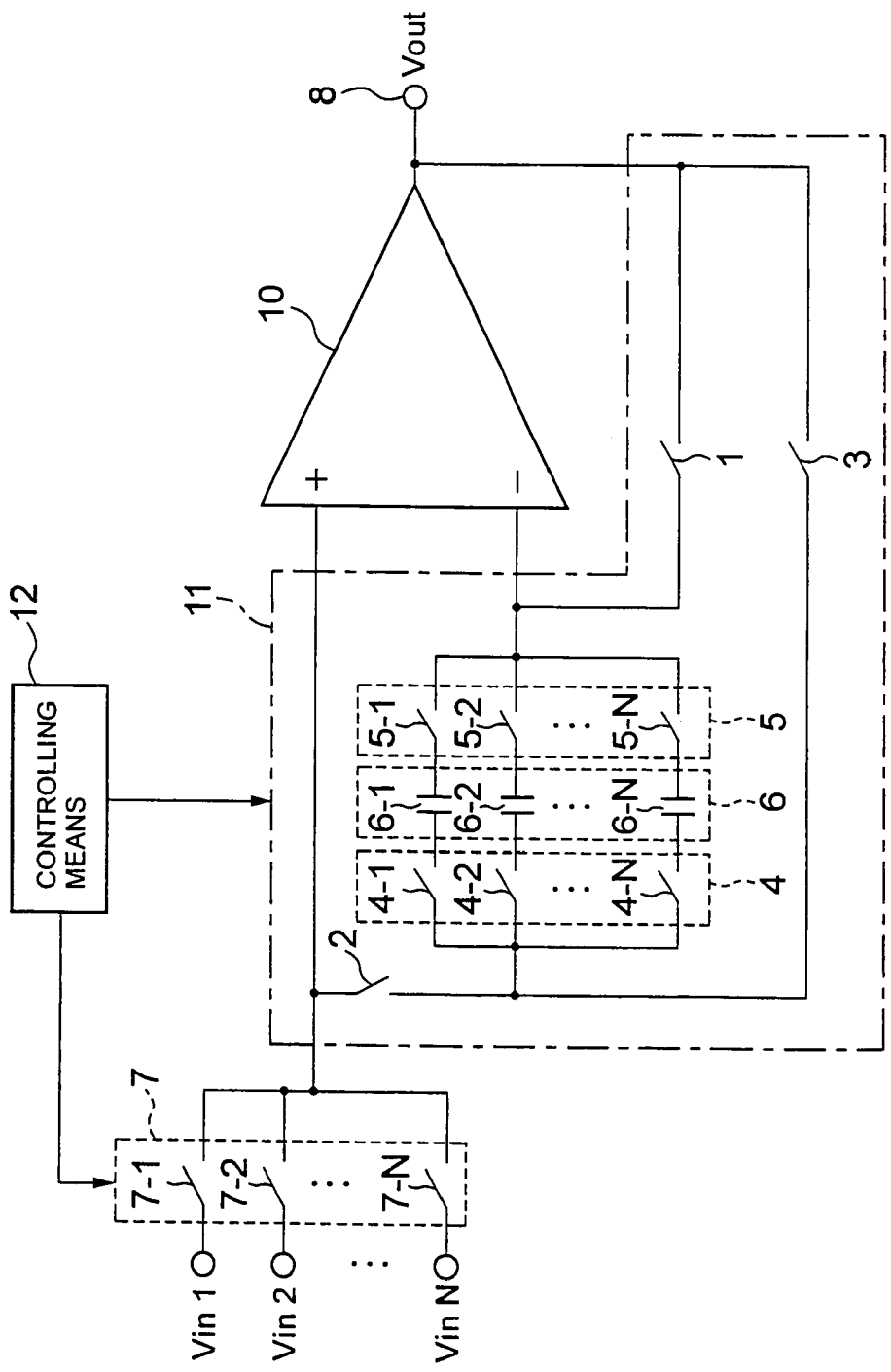
FIG. 1 is a diagram showing a configuration of an amplifier circuit according to a first embodiment of the present invention.

Hereafter, embodiments of the present invention will be described by using the drawings. FIG. 1 is a diagram showing a configuration of an amplifier circuit according to a first embodiment of the present invention. Moreover, equivalent portions are indicated by the same reference numerals in all the drawings shown below.

In FIG. 1, the amplifier circuit according to the first embodiment of the present invention has input signal selection means 7, an operational amplifier 10, an offset correction circuit 11 and controlling means 12. The input signal selection means 7 has input signal selection switches 7-1 to 7-N connected respectively between N pieces (N is a positive integer) of a circuit input terminal (input terminal of the amplifier circuit) to which N pieces of an input signal (voltage levels of the input signals are Vin1 to VinN respectively) from the outside are supplied and a non-inverting input terminal of the operational amplifier 10.

The input signal selection means 7 selects one of the N pieces of input signal according to control of the controlling means 12, and the selected input signal is inputted to the non-inverting input terminal of the operational amplifier 10. Here, selection of the input signal is performed in each predetermined period (one output period). The operational amplifier 10 of a voltage follower outputs an output voltage Vout equal to the voltage of the input signal selected by the input signal selection means 7 to the outside via a circuit output terminal 8 (output terminal of the amplifier circuit).

The offset correction circuit 11 has switches 1 to 3, a capacitor group 6 having a plurality of capacitors 6-1 to 6-N, a switch group 4 having a plurality of capacitor selection switches 4-1 to 4-N, and a switch group 5 having a plurality of capacitor selection switches 5-1 to 5-N. The switch 1 is connected between the inverting input terminal of the operational amplifier 10 and the output terminal of the operational amplifier 10, and the switches 2 and 3 are serially connected between the non-inverting input terminal of the operational amplifier 10 and the output terminal of the operational amplifier 10.

In addition, one end of each of the plurality of capacitors 6-1 to 6-N is connected in common to a connection point of the switches 2 and 3 via the switch group 4, and the other ends of the plurality of capacitors 6-1 to 6-N are connected to the inverting input terminal of the operational amplifier 10 via the switch group 5.

The controlling means 12 controls the input signal selection switches 7-1 to 7-N of the input signal selection means 7 according to an instruction supplied from the outside or generated inside. In addition, the controlling means 12 controls the capacitor selection switches 4-1 to 4-N and 5-1 to 5-N to select one capacitor of the plurality of capacitors 6-1 to 6-N according to the instruction. In other words, the controlling means 12 controls the switches 4-1 to 4-N and 5-1 to 5-N according to the voltage level of the input signal selected by the input signal selection means 7. In addition, the controlling means 12 controls offset correcting operation by controlling the switches 1 to 3.

Moreover, the voltage levels Vin1 to VinN of the N pieces of input signals are mutually different values, and the plurality of capacitors 6-1 to 6-N are associated with the voltage levels Vin1 to VinN one for one so that the controlling means 12 selects one capacitor associated with the voltage level of the input signal.

However, it is not limited to the cases where the plurality of capacitors 6-1 to 6-N are associated with the voltage levels Vin1 to VinN one for one, and for instance, the controlling means 12 can exert control so that the capacitor selected in the case where the voltage level of the input signal is Vin1 and the capacitor selected in the case where the voltage level is Vin2 are the same.

To be more specific, there may be a value which is the same or approximately the same among the voltage levels Vin1 to VinN, and in the above-mentioned example, the voltage levels Vin1 and Vin2 are mutually the same or approximately the same level. Therefore, the controlling means 12 selects one capacitor according to the voltage level of the input signal.

Figure 2:
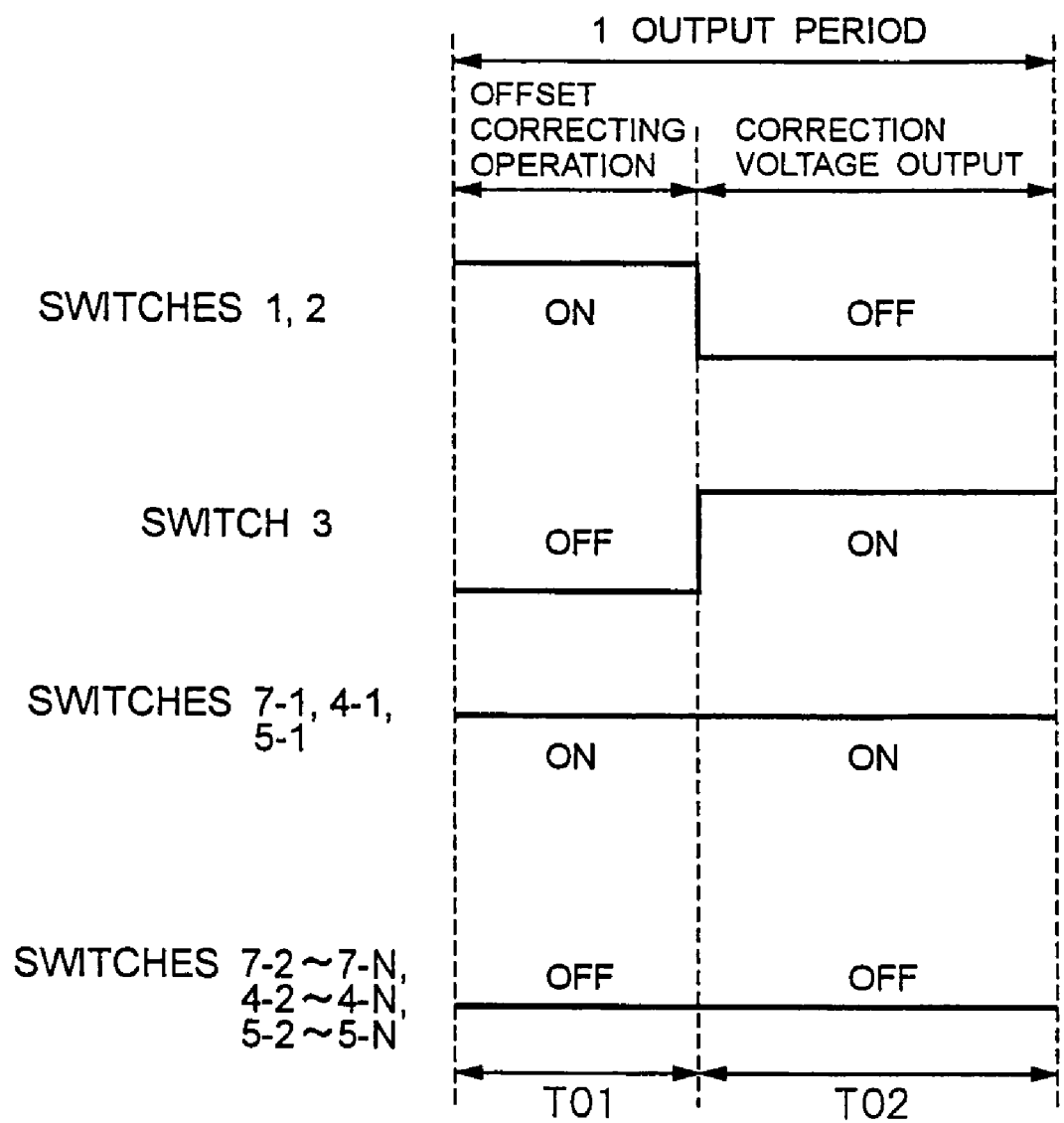
FIG. 2 is a timing chart showing an operation example of the amplifier circuit shown in FIG. 1.
Figure 3:
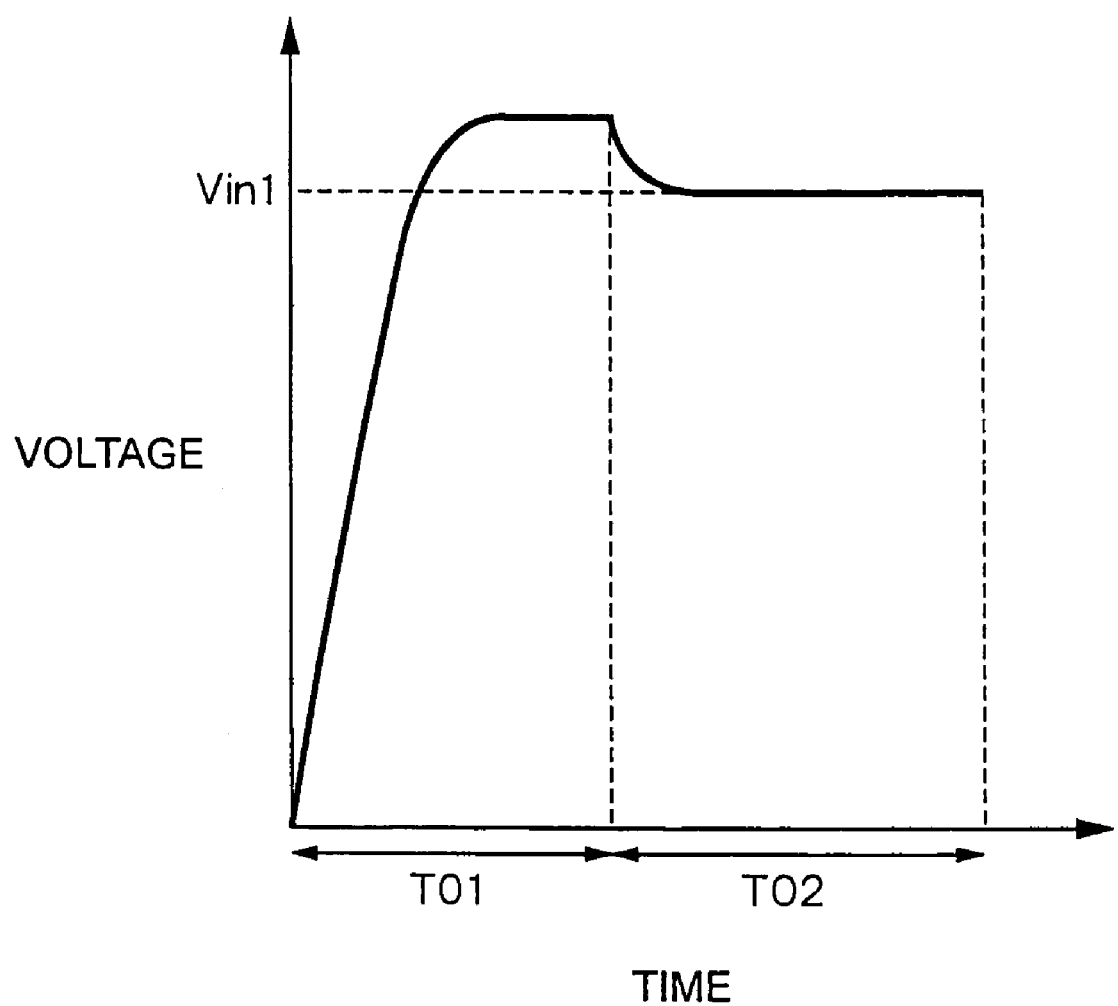
FIG. 3 is a diagram showing an output voltage waveform according to the operation example shown in FIG. 2.

Hereafter, the operation of the amplifier circuit shown in FIG. 1 will be described by using the drawings. FIG. 2 is a timing chart showing an operation example of the amplifier circuit shown in FIG. 1, and shows on and off states of each switch in one output period. In addition, FIG. 3 is a diagram showing an output voltage waveform according to the operation example shown in FIG. 2.

One output period is a period for outputting one signal voltage, and FIG. 2 shows the case where it is constituted by two terms of a first term T01 for performing offset correcting operation (offset voltage storing operation) and a second term T02 for having a correction voltage outputted. In addition, this diagram shows the operation in the case where the voltage level of the input signal in one output period is Vin1 shown in FIG. 1. Moreover, the switch groups 4, 5 and 7 and the switches 1 to 3 shown in FIG. 1 are controlled by the controlling means 12.

As shown in FIGS. 1 and 2, first, in the first term T01 of one output period, the switches 7-1, 4-1 and 5-1 are turned on and the switches 7-2 to 7-N and 4-2 to 4-N and 5-2 to 5-N are turned off. In addition, the switches 1 and 2 are turned on and the switch 3 is turned off. Thus, as shown in FIG. 3, the output voltage Vout becomes Vin1+Voff including the offset voltage Voff. At this time, a potential of one end of the capacitor 6-1 becomes equal to the input voltage Vin1, the potential of the other end becomes equal to the output voltage Vout, and the capacitor 6-1 has charged thereto an charge equivalent to the offset voltage Voff generated to the operational amplifier 10 in the case where the input voltage is Vin1.

Next, in the second term T02 of one output period in FIG. 2, the switches 1 and 2 are turned off and the switch 3 is turned on while the switches 7-1, 4-1 and 5-1 remain on and the switches 7-2 to 7-N and 4-2 to 4-N and 5-2 to 5-N remain off as in the term T01. At this time, the capacitor 6-1 is directly connected between the inverting input terminal and the output terminal of the operational amplifier 10, and the offset voltage Voff is held by the capacitor 6-1. As the switch 3 is turned on, the offset voltage Voff is applied to the inverting input terminal of the operational amplifier 10 in reference to the potential of the output terminal. As a result of this, as shown in FIG. 3, the output voltage Vout becomes Vout=Vin1+Voff−Voff=Vin1, and so the offset voltage is set off and it becomes the voltage equal to the input voltage Vin1.

Figure 4:
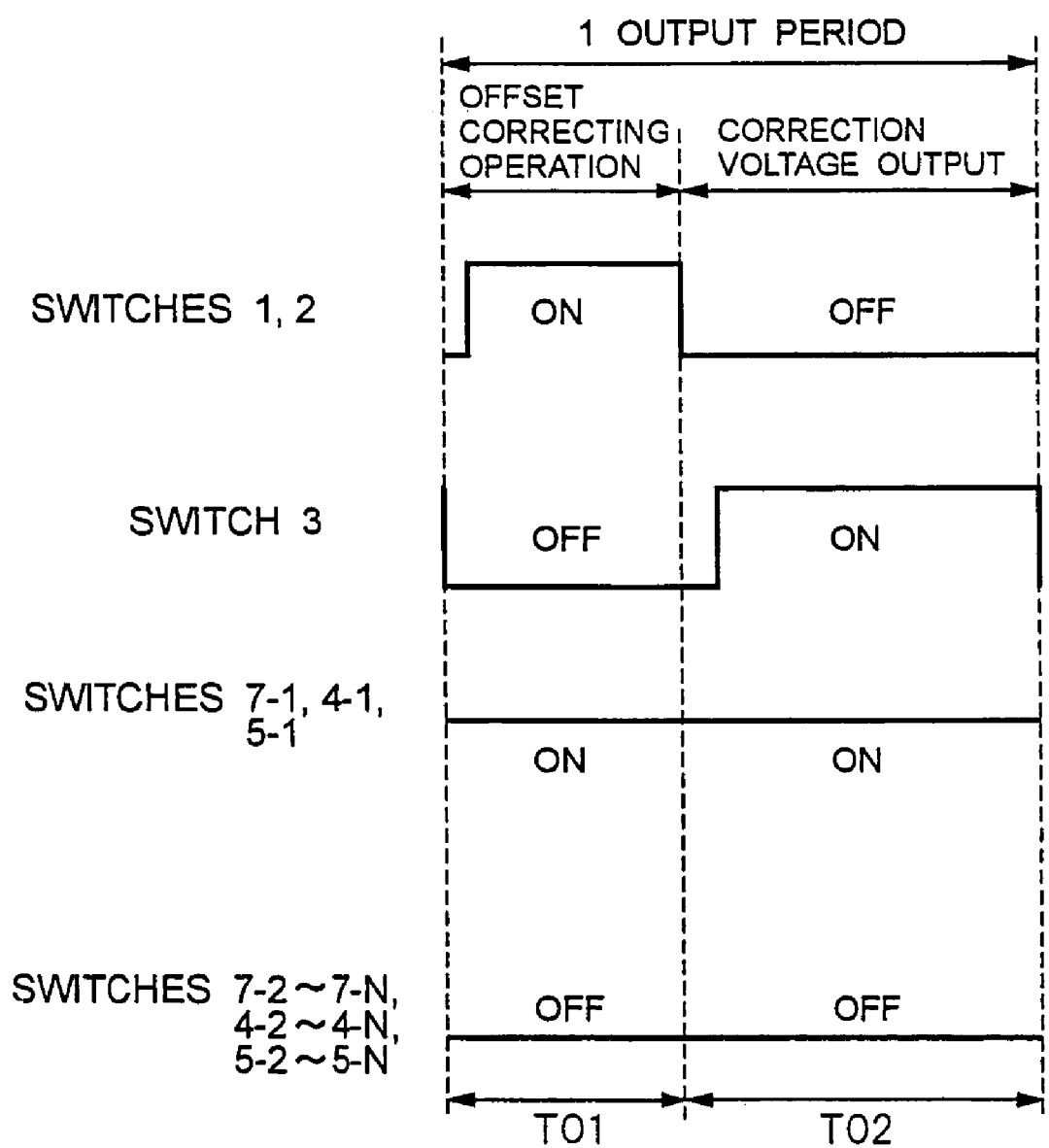
FIG. 4 is a timing chart showing an operation example of the amplifier circuit in FIG. 1 in case of considering a delay of each switch.

Moreover, the timing chart in FIG. 2 shows the case where each switch has no delay and the controlling means 12 simultaneously controls the switches. In the case where each switch has a delay, however, the switch control is performed in consideration of the delay so that the switches 1 and 2 will not be in a conductive state before the switch 3 is in a nonconductive state in the first term T01 and so that the switch 3 will not be in the conductive state before the switches 1 and 2 are in the nonconductive state in the second term T02. Moreover, FIG. 4 shows the timing chart showing an operation example of the amplifier circuit in case of considering the delay.

The offset voltage generated to the amplifier circuit is different according to the input voltage level. The amplifier circuit shown in FIG. 1 has the N pieces of capacitor 6-1 to 6-N provided thereto, and so it is possible to associate the input voltages with the capacitors one for one so as to have each capacitor store and hold the offset voltage of the operational amplifier according to the input voltage level corresponding thereto. Once the capacitor corresponding to the input voltage stores and holds the offset voltage, it is not necessary to charge and discharge the capacitor in one output period in which the same input voltage is inputted next, and it is sufficient to replenish the charge changed due to the influence of the capacity coupling occurring on switching. For that reason, the capacitor requires little power consumption due to the charge and discharge of the charge, and thus lower power consumption is possible.

Thus, as for the amplifier circuit shown in FIG. 1, the input voltages are associated with the capacitors one for one, and the offset voltage according to the input voltage level is stored and held by the capacitor associated with the input voltage level, so that it is possible to perform high-precision offset correcting operation and curb the power consumption by the offset correcting operation to the minimum.

Furthermore, once the offset voltage is stored and held by the capacitor, the capacitor requires little power consumption due to the charge and discharge in one output period in which the same input voltage is inputted next to the amplifier circuit because it corrects the output of the operational amplifier by using the offset voltage already held by the capacitor, and so output precision can be enhanced without increasing the power consumption even if the capacity of the capacitor is increased in order to curb the influence of the capacity coupling occurring on switching.

While the case where the input voltage in one output period is Vin1 was described as to FIG. 2, the amplifier circuit shown in FIG. 1 can have the offset voltages according to a plurality of the input voltages stored and held by different capacitors so that, even in the case where the input voltage in one output period is any one of Vin2 to VinN, it is possible to perform high-precision offset correcting operation as in the case where it is Vin1 and curb the power consumption by the offset correcting operation to the minimum.

Moreover, the operational amplifier 10 used for the amplifier circuit shown in FIG. 1 can be in any form.

Figure 5:
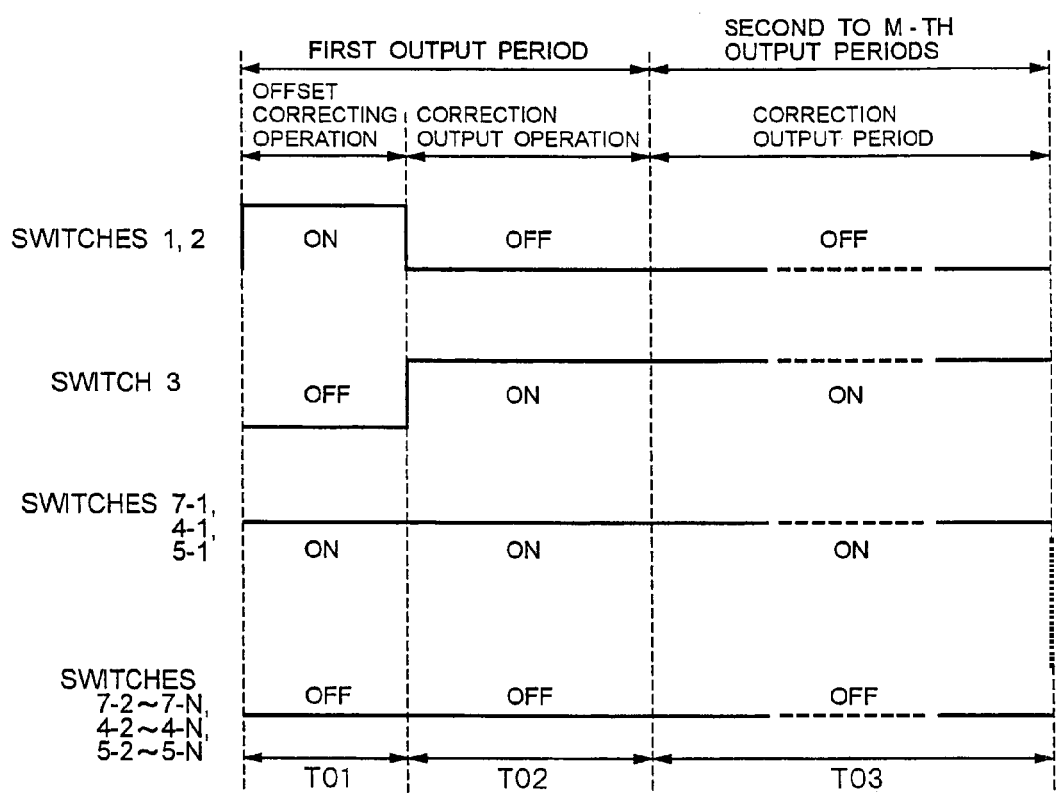
FIG. 5 is a timing chart showing an operation example of the amplifier circuit shown in FIG. 1 in the case where the same voltage is successively inputted.

FIG. 5 is a timing chart showing an operation example of the amplifier circuit shown in FIG. 1 in the case where the same voltage is successively inputted. The operation according to the timing chart in FIG. 5 allows the power consumption to be rendered lower than the operation according to the timing chart in FIG. 2 because the switch control different from that in FIG. 2 is performed. FIG. 5 shows the case where the input voltage is Vin1 in successive M (M is an integer of 2 or more) pieces of output period (first to M-th output periods). Moreover, as with FIG. 2, the switch control according to the timing chart in FIG. 5 is performed by the controlling means 12 shown in FIG. 1.

In FIG. 5, the operations in the first term T01 and the second term T02 in the first output period are the same as those in the first term T01 and the second term T02 in FIG. 2, and so the description thereof will be omitted.

As shown in FIG. 5, in the term T03 equivalent to the second output period to the M-th output period, the state of each switch in the second term T02 of the first output period is maintained so that the output voltage equal to the input voltage Vin1 can also be obtained in the second to M-th output periods.

It is possible, by having the amplifier circuit shown in FIG. 1 operated by the controlling means 12 according to the timing chart in FIG. 5, to have the offset voltages generated in the operational amplifier 10 in the case where the input voltage is Vin1 stored and held once by the capacitor 6-1 in the term T01 for performing the offset correcting operation so as to allow high-precision offset without performing the offset correcting operation in the subsequent second to M-th output periods. Thus, only the term T01 is the term accompanied by the charge and discharge of the charge in the first to M-th output periods, and so the power consumption can be curbed further in the operation according to the timing chart in FIG. 5 than in case of following the timing chart in FIG. 2.

Moreover, the timing chart in FIG. 5 shows the case where each switch has no delay and the controlling means 12 simultaneously controls the switches as in FIG. 2. In the case where each switch has a delay, however, the switch control is performed in consideration of the delay as in FIG. 4 so that the switches 1 and 2 will not be in the conductive state before the switch 3 is in the nonconductive state in the first term T01 and so that the switch 3 will not be in the conductive state before the switches 1 and 2 are in the nonconductive state in the second term T02.

In addition, the capacitor for storing the offset voltage requires little power consumption due to the charge and discharge once the offset voltage is stored, and so the output precision can be enhanced without increasing the power consumption even if the capacity of the capacitor is increased in order to curb the influence of the capacity coupling occurring on switching.

While the case where the input voltage is Vin1 was described as the case of inputting the same voltage in the successive first to M-th periods in FIG. 5, the amplifier circuit shown in FIG. 1 has N pieces of capacitor equal to the number of input voltages N provided thereto, and can have the offset voltages according to the input voltages stored and held by different capacitors so that the input voltage is not limited to Vin1, and even in the case where the input voltage is each of Vin2 to VinN, it is possible to perform high-precision offset correcting operation and curb the power consumption by the offset correcting operation to the minimum.

Hereafter, the amplifier circuit according to the first embodiment of the present invention will be described by referring to the drawings while taking as an example a representative operational amplifier in order to describe the above first embodiment further in detail.

Figure 6:
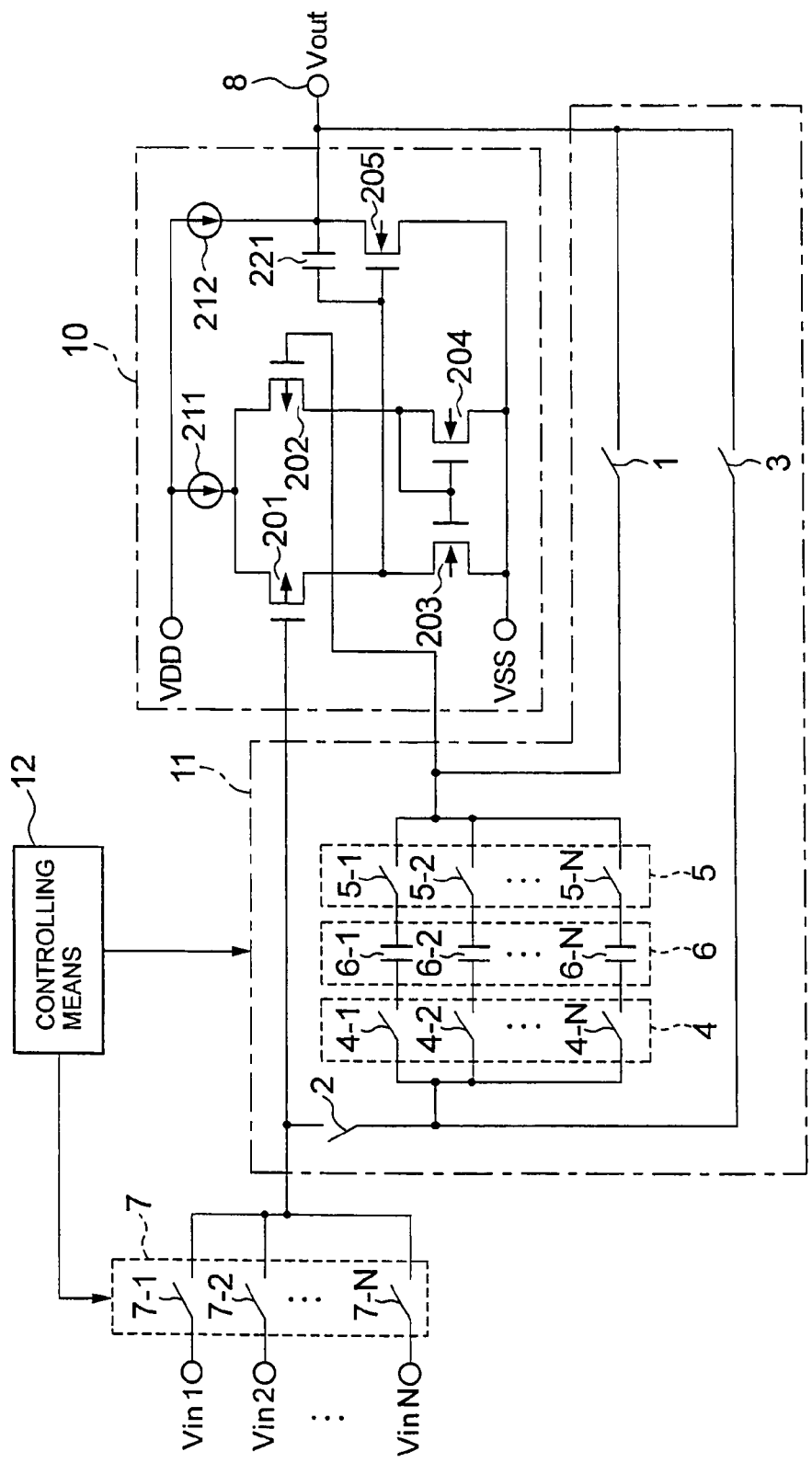
FIG. 6 is a diagram showing the configuration of the amplifier circuit in case of applying an operational amplifier in FIG. 7 to the amplifier circuit in FIG. 1.
Figure 7:
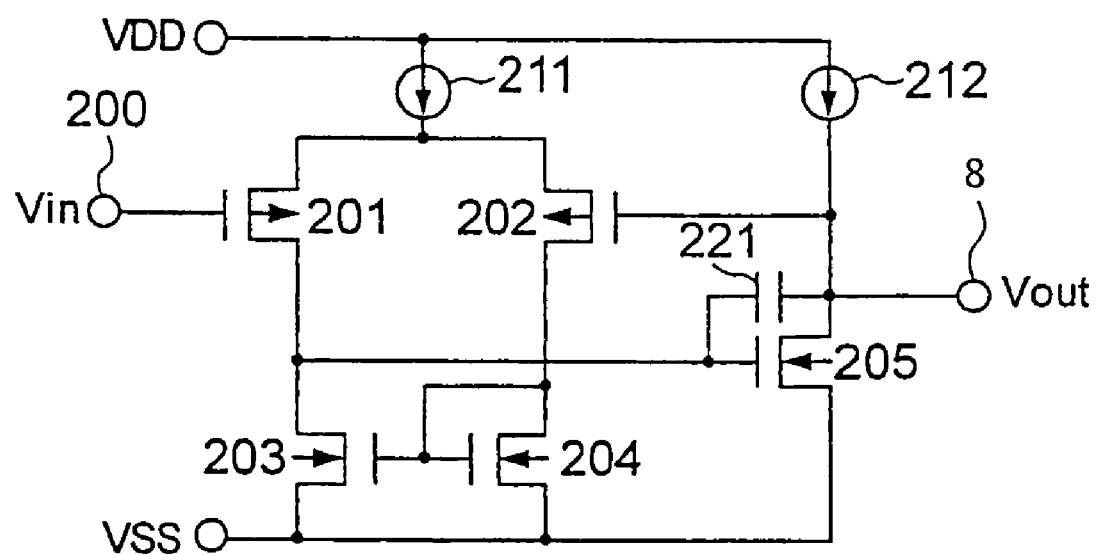
FIG. 7 is a diagram showing a configuration of a first operational amplifier.

FIG. 6 is a diagram showing the configuration of the amplifier circuit in case of using the feedback-type operational amplifier in the past shown in FIG. 7 for the operational amplifier 10 of the amplifier circuit shown in FIG. 1. In addition. FIG. 7 is a diagram showing the configuration of a first feedback-type operational amplifier (voltage follower circuit).

Referring to FIG. 7, the operational amplifier shown in FIG. 7 has PMOS transistors 201 and 202 having a source connected in common, gates connected to an input terminal 200 and an output terminal 8 respectively connected and constituting a differential pair, a constant current source 211 connected between the connected sources of the PMOS transistors 201 and 202 and a high-order side power supply VDD, an NMOS transistor 203 having its source connected to a low-order side power supply VSS, its gate connected to the gate of the NMOS transistors 204 and its drain connected to the drain of the PMOS transistor 201, an NMOS transistor 204 having its source connected to the low-order side power supply VSS and its drain and gate connected to the drain of the PMOS transistor 202, a constant current source 212 connected between the high-order side power supply VDD and the output terminal 8, an NMOS transistor 205 having its gate to which the output of the differential pair is inputted, its source connected to the low-order side power supply VSS and its drain connected to the connection point of the output terminal 8 and the constant current source 212, and a phase compensation capacity 221 connected to the connection point of the output terminal 8 and the gate of the PMOS transistor 202 and the gate terminal of the NMOS transistor 205.

The operational amplifier shown in FIG. 7 can lower the output voltage Vout to Vin by discharge action of the NMOS transistor 205 when it is Vin<Vout, and raise the output voltage Vout to Vin by the constant current source 211 when it is Vin>Vout. However, there are the cases where the operational amplifier shown in FIG. 7 has the offset voltage generated due to characteristic variations of active elements constituting the operational amplifier, and so it cannot output the output voltage equal to the input voltage.

On the other hand, as shown in FIG. 6, in the case where the operational amplifier shown in FIG. 7 is applied to the operational amplifier 10 of the amplifier circuit shown in FIG. 1, the amplifier circuit shown in FIG. 6 has the switch groups 4, 5 and 7 and the switches 1 to 3 controlled according to the input voltage level by the controlling means 12, so that the offset voltage corresponding to the input voltage level is stored and held in the capacitor corresponding to the input voltage one for one so as to correct the output of the operational amplifier 10 by using the offset voltage held in the capacitor. Therefore, the high-precision output is possible and there is little power consumption by the offset correcting operation, and so the power consumption by the offset correcting operation can be curbed to the minimum.

Furthermore, once the offset voltage is stored, the capacitor for storing the offset voltage requires little power consumption due to the charge and discharge, and thus it is possible to enhance the output precision without increasing the power consumption even if the capacity of the capacitor is increased in order to curb the influence of the capacity coupling occurring on switching.

Figure 8:
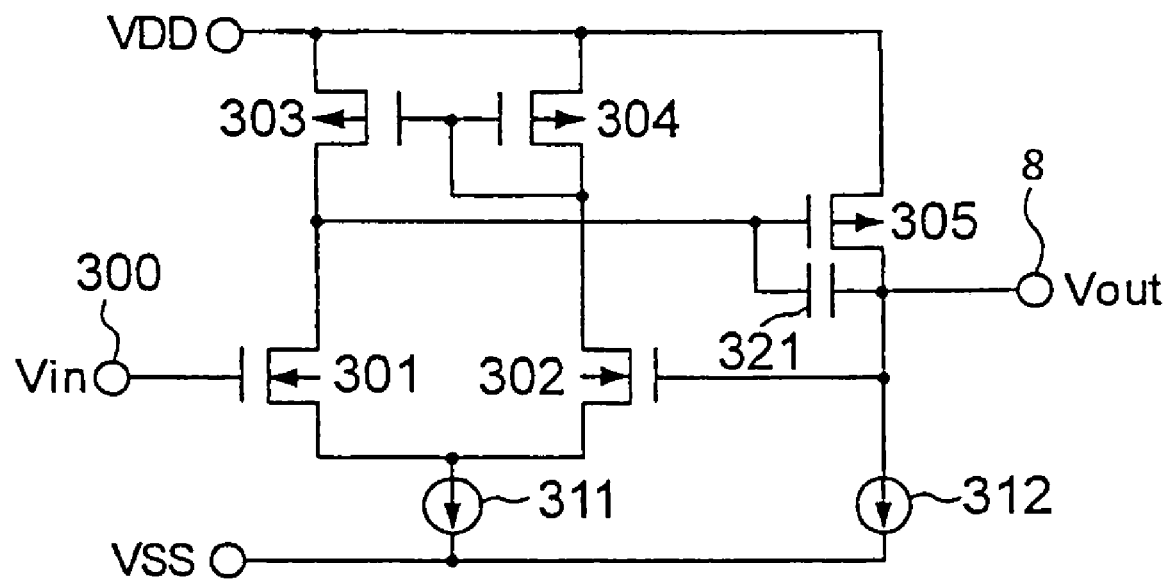
FIG. 8 is a diagram showing a configuration of a second operational amplifier.

Moreover, in the case where a second feedback-type operational amplifier comprised of NMOS differential pair 301 and 302 shown in FIG. 8 is applied to the operational amplifier 10 of the amplifier circuit shown in FIG. 1, it is also possible, as a matter of course, to obtain the output voltage equal to the input voltage and curb the power consumption by the offset correcting operation to the minimum as with the amplifier circuit shown in FIG. 6.

Figure 9:
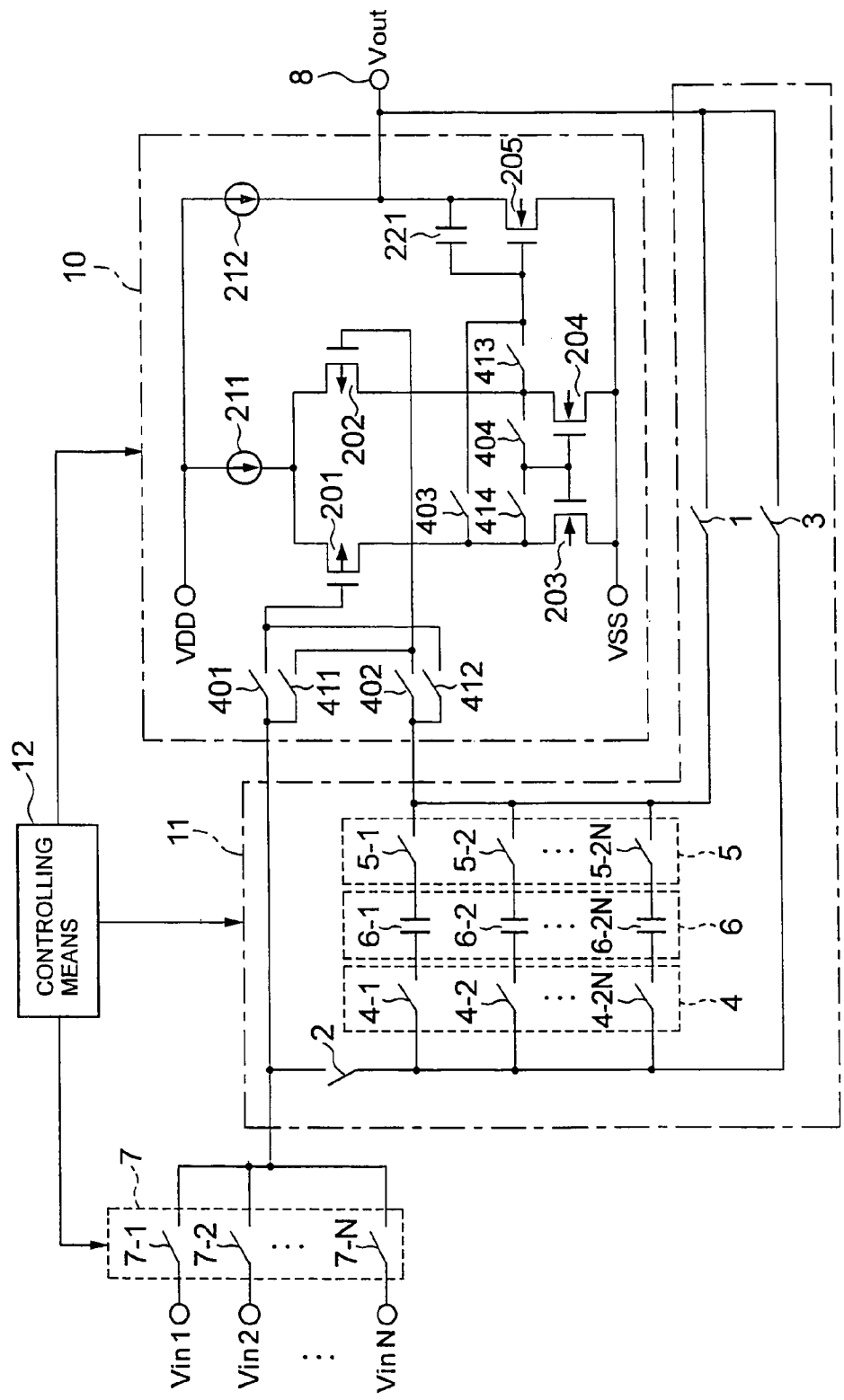
FIG. 9 is a diagram showing a configuration of the amplifier circuit in case of applying the operational amplifier in FIG. 10 to the amplifier circuit in FIG. 1.
Figure 10:
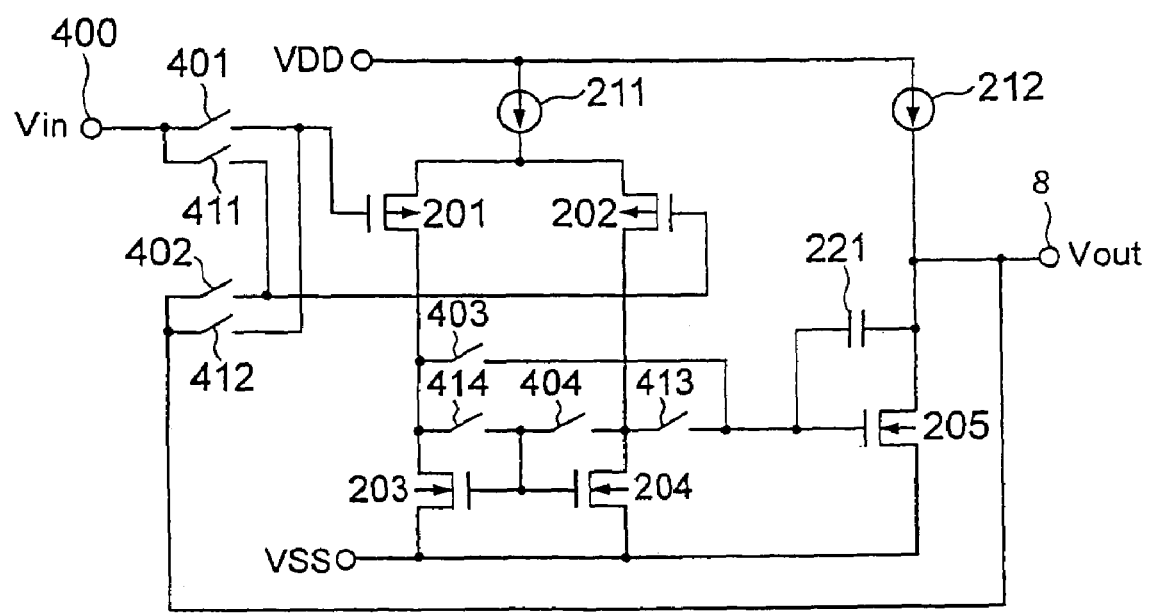
FIG. 10 is a diagram showing a configuration of a third operational amplifier.

FIG. 9 is a diagram showing a configuration of the amplifier circuit in the case where an operational amplifier shown in FIG. 10 is applied to the operational amplifier 10 of the amplifier circuit shown in FIG. 1. In addition, FIG. 10 is a diagram showing the configuration of a third operational amplifier. As for the operational amplifier shown in FIG. 10, it performs operation of alternately switching between a MOS transistor of an input stage to which the input voltage is applied and a MOS transistor of an input stage to which the output voltage is returned in a predetermined cycle so as to temporally average the offset voltage. Thus, it is possible to enhance the output precision in the operational amplifier shown in FIG. 10.

Figure 11:
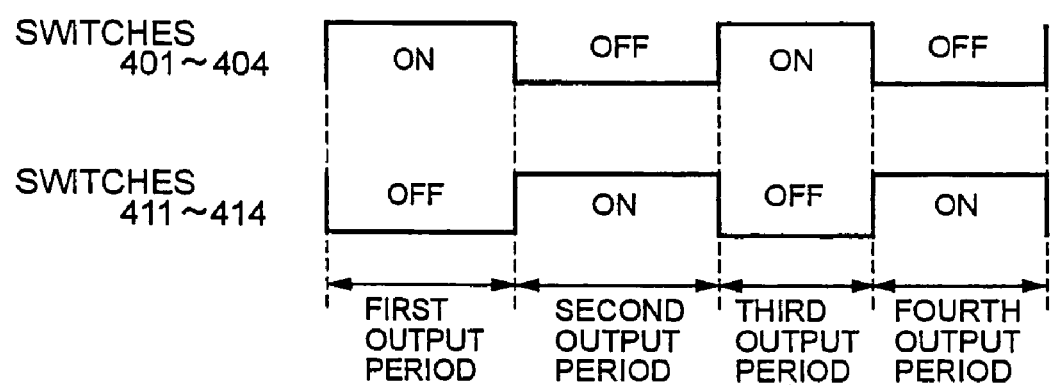
FIG. 11 is a timing chart showing operation of the operational amplifier in FIG. 10.
Figure 12:
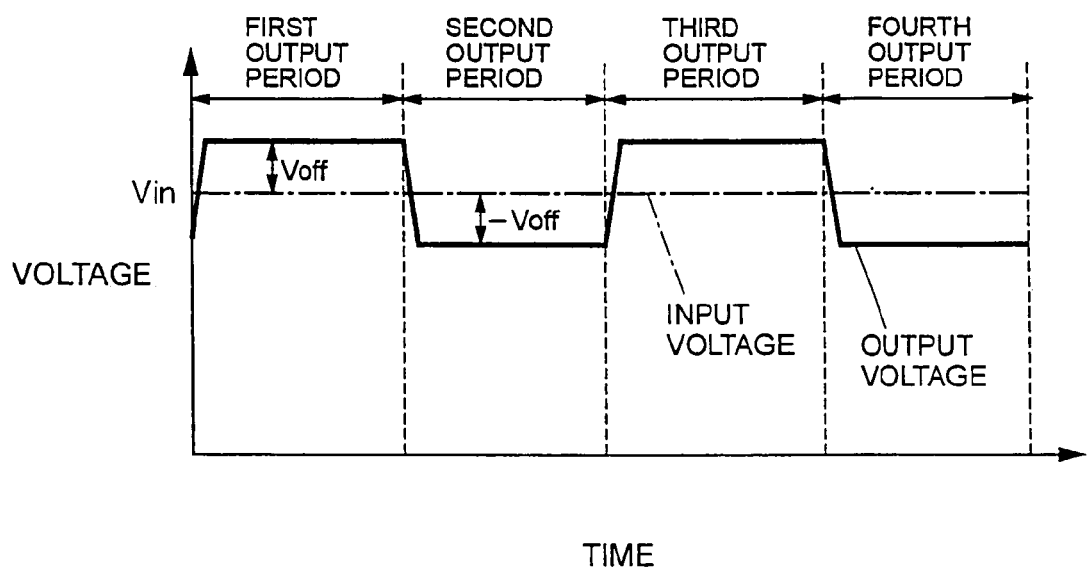
FIG. 12 is a diagram showing an output voltage waveform in the case where the operational amplifier shown in FIG. 10 is controlled according to the timing chart in FIG. 11.

Hereafter, the configuration and operational overview of the operational amplifier shown in FIG. 10 will be described by using the drawings. FIG. 11 is a timing chart showing the switching operation of the switches 401 to 404 and 411 to 414 provided to the operational amplifier shown in FIG. 10. In addition, FIG. 12 is a diagram showing the output voltage waveform in the case where the operational amplifier shown in FIG. 10 is controlled according to the timing chart in FIG. 11.

In FIG. 10, the operational amplifier shown therein is the one wherein the operational amplifier shown in FIG. 7 additionally has the switches 401 and 412 for connecting the gate electrode of the PMOS transistor 201 of the input stage to an input terminal 400 or the output terminal 8, the switches 402 and 411 for connecting the gate electrode of the PMOS transistor 202 of the input stage to the output terminal 8 or the input terminal 400, the switches 403 and 413 for connecting the gate electrode of the NMOS transistor 205 of the output stage to the drain electrode of the PMOS transistor 201 of the input stage or the drain electrode of the PMOS transistors 202 of the input stage, and the switches 404 and 414 for connecting the gate electrodes of the NMOS transistors 203 and 204 constituting a current Miller circuit to the drain electrode of the PMOS transistor 202 of the input stage or the drain electrode of the PMOS transistor 201 of the input stage.

In FIG. 10, the switches 411 to 414 are controlled to be off when the switches 401 to 404 are on, and consequently the input voltage Vin is applied to the gate electrode of the MOS transistor 201 of the input stage and the output voltage Vout is applied to the gate electrode of the MOS transistor 202 of the input stage. On the other hand, the switches 401 to 404 are controlled to be off and the switches 411 to 414 are controlled to be on, and consequently the input voltage Vin is applied to the gate electrode of the MOS transistor 202 of the input stage and the output voltage Vout is applied to the gate electrode of the MOS transistor 201 of the input stage.

Therefore, the state in which the switches 401 to 404 are on and the switches 411 to 414 are off and the state in which the switches 401 to 404 are off and the switches 411 to 414 are on are alternately repeated, so that the input voltage Vin and the output voltage Vout are alternately applied to the gate electrodes of the MOS transistors 201 and 202 of the input stage.

In the first output period in FIGS. 10 and 11, the switches 401 to 404 are controlled to be on and the switches 411 to 414 are controlled to be off, and the offset voltage Voff is generated to the operational amplifier shown in FIG. 10 so that, as shown in FIG. 12, the output voltage Vout is Vout=Vin+Voff.

In addition, in the second output period, the switches 401 to 404 are controlled to be off and the switches 411 to 414 are controlled to be on, and the offset voltage −Voff is generated to the operational amplifier shown in FIG. 10 so that, as shown in FIG. 12, the output voltage Vout is Vout=Vin−Voff. Moreover, in the third output period, each switch is controlled as in the first output period, and in the fourth output period, each switch is controlled as in the second output period.

Therefore, in the case where each output period is short enough, the switches 401 to 404 and 411 to 414 are alternately turned on and off so that, as shown in FIG. 12, the offset voltages are temporally averaged in every two output periods. As the offset voltages are thus set off, the output precision can be enhanced.

An example of the amplifier circuit allowing the output precision to be enhanced by canceling the offset voltages by time average is described in Japanese Patent Laid-Open No. 11-249624.

As for picture signal line driving means of the liquid crystal display device for performing dot inversion drive described in Japanese Patent Laid-Open No. 11-249624, it is described that, to apply the gray scale level voltage to one pixel, a high-voltage side amplifier circuit for outputting the gray scale level voltage of positive polarity and a low-voltage side amplifier circuit for outputting the gray scale level voltage of negative polarity operate alternately on each frame according to the polarity, and the MOS transistor of the input stage to which the input voltage of the amplifier circuit is applied and the MOS transistor of the input stage to which the output voltage is returned are alternately switched on every two frames, so that the offset voltages generated to each amplifier circuit are temporally averaged on every four frames. It thereby prevents rise and decrease in luminance caused by variations in the voltages applied to the pixel by the offset voltages.

However, as for the operational amplifier shown in FIG. 10, the offset voltage itself cannot be rendered lower so that, in the case where the operational amplifier shown in FIG. 10 is constituted by using polycrystalline silicon thin film transistors for instance, variations in the elements are generally significant and thus the offset voltages are high, and the changes in the output voltages inversely become more remarkable by performing the time average. For that reason, in the case where the picture signal line driving means of the liquid crystal display device described in Japanese Patent Laid-Open No. 11-249624 is constituted by the transistors having significant variations in the elements, the changes in the output voltages become more significant by performing the time average and the changes in the luminance are also significant, and thus display quality cannot be improved even if the time average is performed.

Next, the case where the operational amplifier shown in FIG. 10 is applied to the operational amplifier 10 of the amplifier circuit shown in FIG. 1 will be described. As the operational amplifier shown in FIG. 10 alternately switches the MOS transistor of the input stage to which the input voltage is applied and the MOS transistor of the input stage to which the output voltage is returned, the offset voltages of the same amount but different polarities are generated to each input voltage level. For that reason, the amplifier circuit shown in FIG. 9 has two capacitors for storing the offset voltages provided to each input voltage level, and so 2N pieces of capacitor are provided in the case where the number of input voltages supplied from the outside is N (Vin1 to VinN).

In FIG. 9, the operational amplifier 10 has switching means (comprised of the switches 401 to 404 and 411 to 414) for switching one of the pair of input terminals of the operational amplifier 10 to the non-inverting input terminal or the inverting input terminal and switching the other one of the pair of input terminals to the inverting input terminal or the non-inverting input terminal, and the controlling means 12 controls the switching means in each output period so as to switch the state of the pair of input terminals of the operational amplifier 10 to a first state in which one of the pair of input terminals is the non-inverting input terminal and the other one is the inverting input terminal or a second state in which one of the pair of input terminals is the inverting input terminal and the other one is the non-inverting input terminal.

The capacitors 6-1 to 6-2N are divided into two capacitor groups associated with the two states of the pair of input terminals of the operational amplifier 10 respectively. And the controlling means 12 selects one capacitor, according to the voltage level of the input signal, of the capacitor group associated with the state of the pair of input terminals, and controls the switch groups 4 and 5 and the switches 1 to 3 to have the offset voltage stored in the selected capacitor in a first term of one output period.

Moreover, the plurality of capacitors of each of the capacitor groups are associated with the input voltages Vin1 to VinN one for one respectively, and it is a matter of course that the controlling means 12 may select one capacitor associated with the voltage level of the input signal, of the capacitor group associated with the state of the pair of input terminals.

In addition, the controlling means 12 controls the switches 1 to 3 to correct the output of the operational amplifier 10 by using the offset voltage held in the selected capacitor in a second term of one output period. Thus, the amplifier circuit shown in FIG. 9 corrects and temporally averages the offset voltages according to the input voltage levels.

Therefore, even in the case where the operational amplifier 10 of the amplifier circuit shown in FIG. 9 is constituted by transistors having significant variations in the elements, the offset voltage itself is rendered low enough by performing the offset correcting operation, and furthermore, the offset voltages are temporally averaged by switching the state of the pair of input terminals of the operational amplifier 10 in each output period as shown in FIG. 11 so that it is possible to realize high output precision.

In addition, in case of using the amplifier circuit shown in FIG. 9 as the picture signal line driving means of the liquid crystal display device, it performs the offset voltage correcting operation and the operation of alternately switching between the MOS transistor of the input stage to which the input voltage of the amplifier circuit is applied and the MOS transistor of the input stage to which the output voltage is returned. Even in the case where the amplifier circuit is constituted by the transistors having significant variations in the elements, the offset voltages themselves generated to the operational amplifier can be rendered low enough by performing the offset correcting operation, and furthermore, the offset voltages can be temporally averaged on every four frames by switching the transistors of the input stage on every two frames for instance. It thereby temporally averages the rise and decrease in luminance caused by the offset voltages so that the display quality can be improved even in the case where the amplifier circuit is constituted by the transistors having the significant variations in the elements.

Moreover, the amplifier circuit shown in FIG. 9 can realize the same effect as the amplifier circuit shown in FIG. 1. To be more specific, it has the offset voltages according to the input voltage levels stored and held in the capacitors selected according to the input voltage levels, and corrects the offset voltages by using the offset voltages held by the capacitor, and so it is possible to perform high-precision offset correcting operation. In addition, once the offset voltages are stored and held by the capacitor, there is little power consumption due to the charge and discharge in the capacitor and the power consumption by the offset correcting operation can be curbed to the minimum.

Furthermore, once the offset voltages are stored, the capacitor for storing the offset voltages requires little power consumption due to the charge and discharge, and so the output precision can be enhanced without increasing the power consumption even if the capacity of the capacitor is increased in order to curb the influence of the capacity coupling occurring on switching.

In addition, in the case where, as with the operational amplifier in FIG. 10 wherein the function of temporally averaging the offset voltages is provided to the operational amplifier in FIG. 7, the operational amplifier wherein the function of temporally averaging the offset voltages is provided to the feedback-type operational amplifier comprised of NMOS differential pair shown in FIG. 8 is applied to the operational amplifier 10 of the amplifier circuit shown in FIG. 1, it is also possible, as a matter of course, to obtain the same effects as the amplifier circuit shown in FIG. 9.

Figure 13:
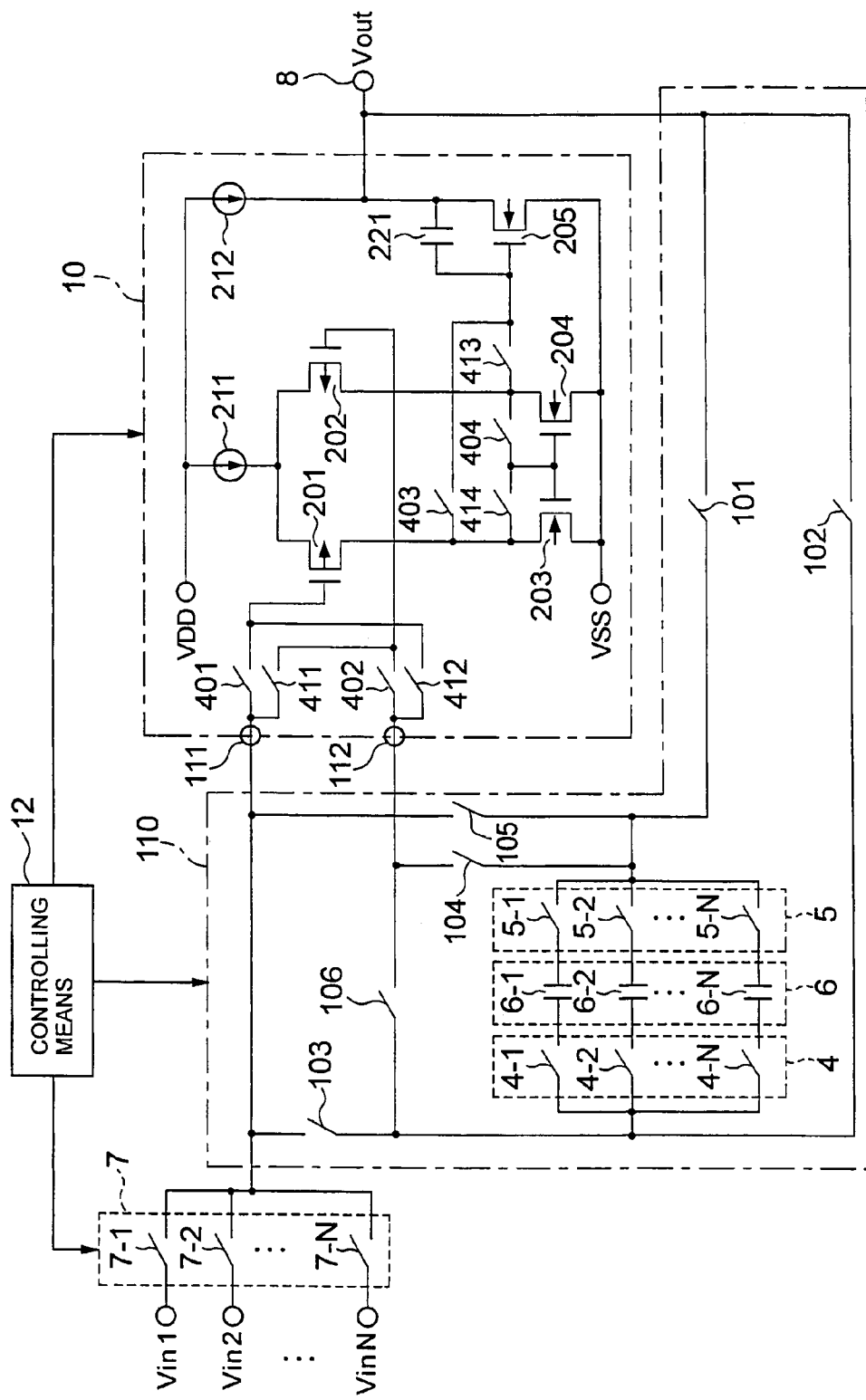
FIG. 13 is a diagram showing another configuration of the amplifier circuit in case of applying the operational amplifier in FIG. 10 to the amplifier circuit in FIG. 1.

FIG. 13 is a diagram showing another configuration of the amplifier circuit in the case where the operational amplifier shown in FIG. 10 is applied to the operational amplifier 10 of the amplifier circuit shown in FIG. 1. The amplifier circuit shown in FIG. 9 has two capacitors for storing the offset voltages provided to each input voltage level, and so 2N pieces of capacitor are required in the case where the number of input voltages supplied from the outside is N. However, the amplifier circuit shown in FIG. 13 can realize the same effect as the amplifier circuit shown in FIG. 9 with the number of capacitors smaller than those of the amplifier circuit shown in FIG. 9 by switching the connections of the capacitors for storing the offset voltages according to the state of the pair of input terminals of the operational amplifier 10.

As for the amplifier circuit shown in FIG. 13, only an offset correction circuit 110 is different from the amplifier circuit shown in FIG. 9, and so only the configuration and operation of the offset correction circuit 110 will be described below.

In FIG. 13, of the N pieces of input voltages Vin1 to VinN supplied from the outside, one voltage selected by the input signal selection means 7 is inputted to an input terminal 111 of the operational amplifier 10. One end of a switch 103 is connected to the input terminal 111 of the operational amplifier 10, and one end of a switch 102 is connected to the output terminal of the operational amplifier 10, and the other ends of the switches 102 and 103 are connected in common. One end of a switch 105 is connected to the input terminal 111, and one end of a switch 101 is connected to the output terminal of the operational amplifier 10, and the other ends of the switches 101 and 105 are connected in common.

A switch 104 is connected between an input terminal 112 of the operational amplifier 10 and the connection point of the switches 105 and 101, and a switch 106 is connected between the connection point of the switches 103 and 102 and the input terminal 112. In addition, one ends of the plurality of capacitors 6-1 to 6-N are connected in common to the connection point of the switches 103 and 102 via the switch group 4, and the other ends of the plurality of capacitors 6-1 to 6-N are connected in common to the connection point of the switches 105 and 101 via the switch group 5.

Moreover, the controlling means 12 controls the switches 7-1 to 7-N of the input signal selection means 7, and also controls the switches 401 to 404 and 411 to 414 of the switching means of the operational amplifier 10 in each output period. In addition, the controlling means 12 selects one capacitor of the plurality of capacitors 6-1 to 6-N according to the voltage level of the input signal, stores the offset voltage in the selected capacitor, and controls the switches 4 and 5 and the switches 101 to 106 to correct the output of the operational amplifier 10 by using the stored offset voltage. Here, when controlling the switches 101 to 106, the controlling means 12 controls them according to the state of the pair of input terminals 111 and 112 of the operational amplifier 10.

Figure 14:
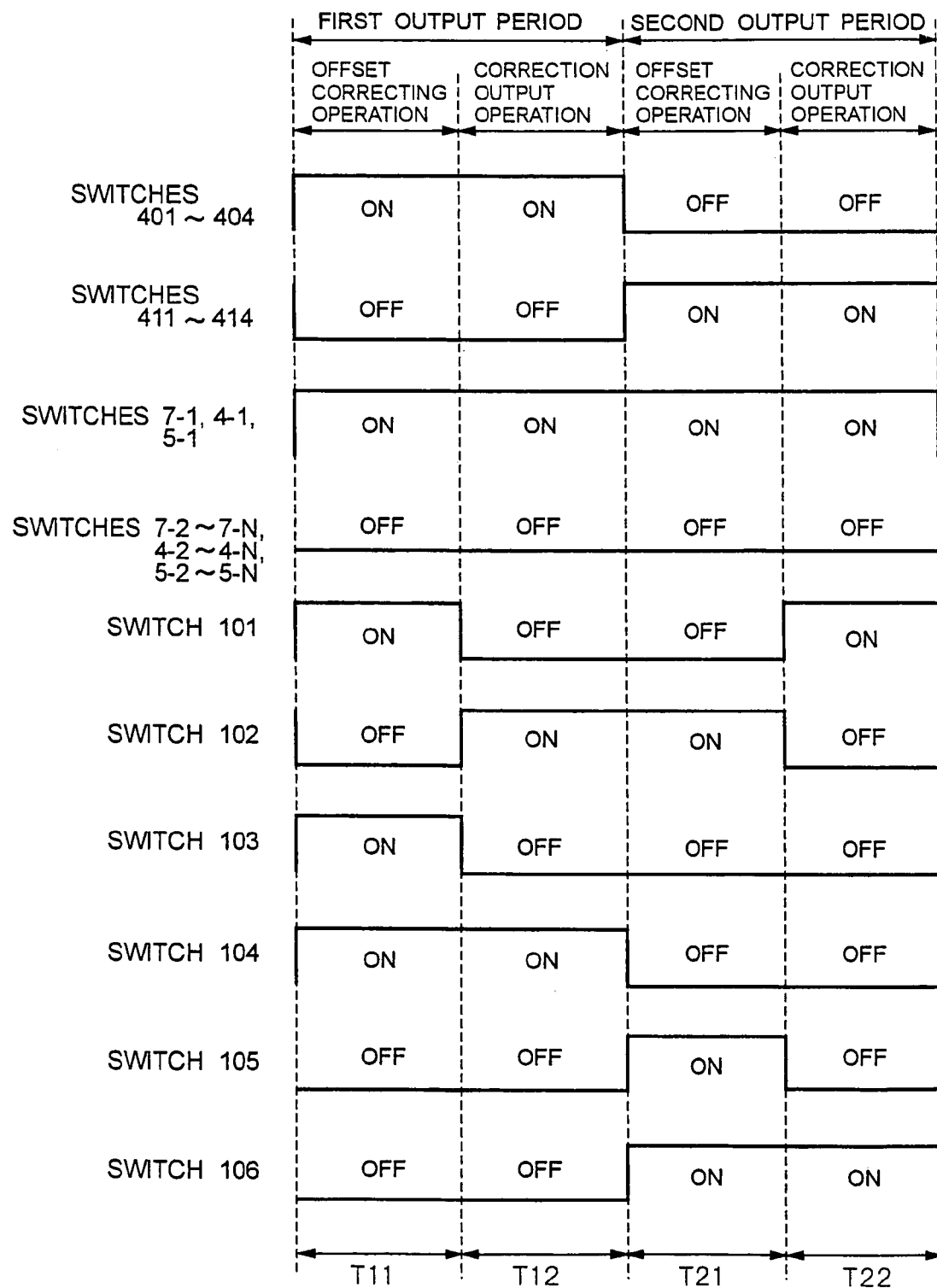
FIG. 14 is a timing chart showing an operation example of the amplifier circuit in FIG. 13.
Figure 15A:
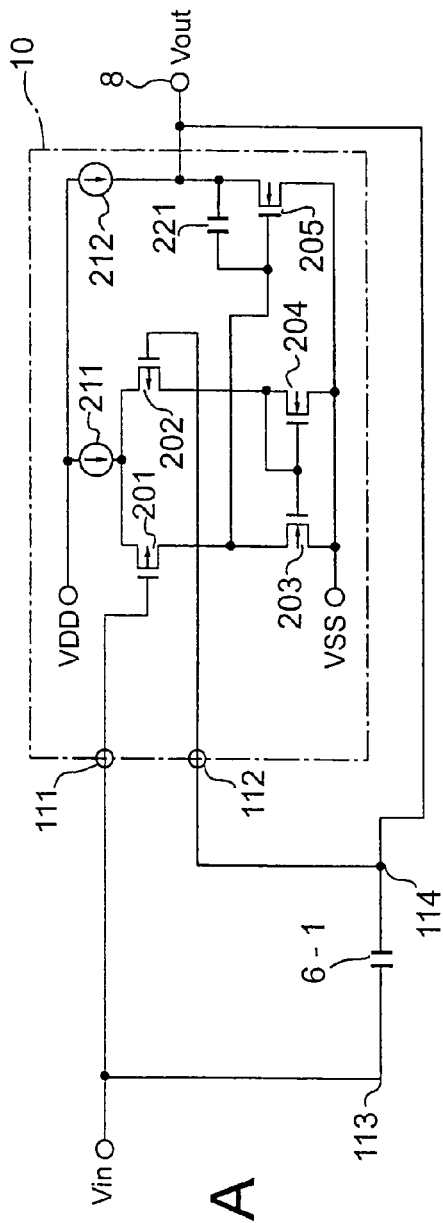
FIG. 15A is a diagram showing a connection state of the amplifier circuit in FIG. 13 in a term T11 shown in FIG. 14.
Figure 15B:
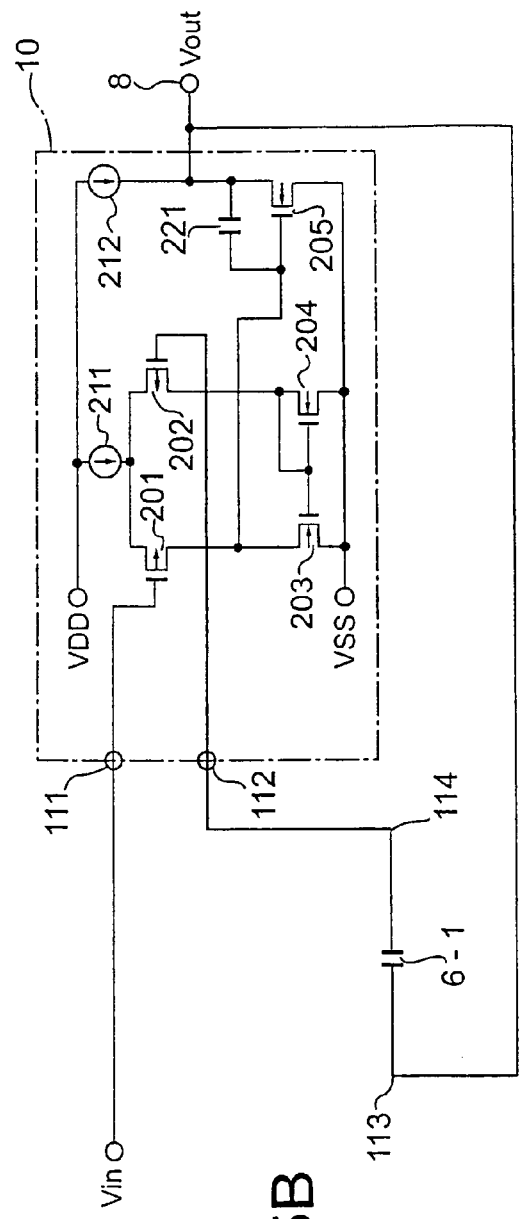
FIG. 15B is a diagram showing the connection state of the amplifier circuit in FIG. 13 in a term T12 shown in FIG. 14.
Figure 16A:
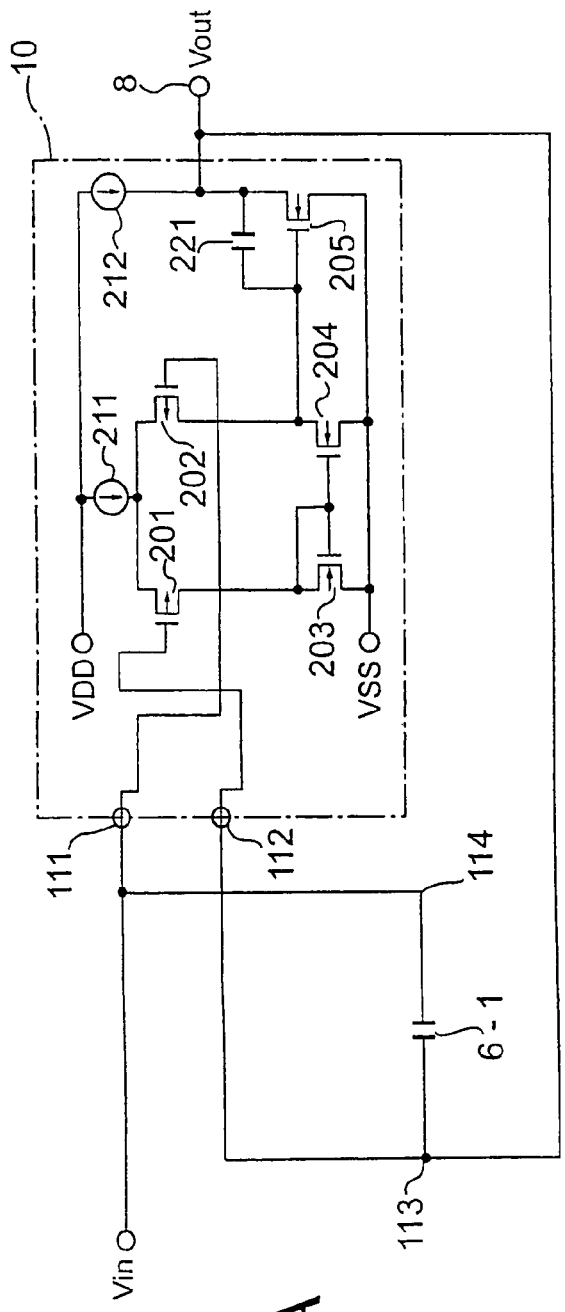
FIG. 16A is a diagram showing the connection state of the amplifier circuit in FIG. 13 in a term T21 shown in FIG. 14.
Figure 16B:
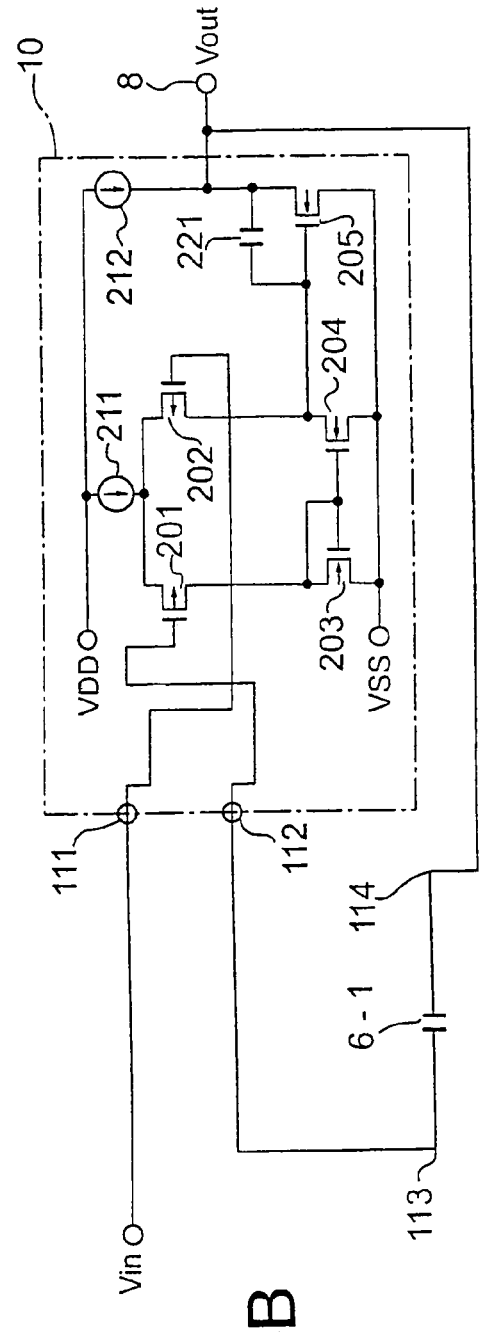
FIG. 16B is a diagram showing the connection state of the amplifier circuit in FIG. 13 in a term T22 shown in FIG. 14.

Hereafter, the operation of the amplifier circuit shown in FIG. 13 will be described by using the drawings. FIG. 14 is a timing chart showing the operation of the amplifier circuit shown in FIG. 13. FIG. 15A is a diagram showing the connection state of the amplifier circuit in FIG. 13 in a period T11 in FIG. 14. FIG. 15B is a diagram showing the connection state in a period T12 in FIG. 14, FIG. 16A is a diagram showing the connection state in a period T21 in FIG. 14, and FIG. 16B is a diagram showing the connection state in a period T22 in FIG. 14. Moreover, the following description takes as an example the case where the input voltages in both the first output period and the second output period shown in FIG. 14 are Vin 1.

In the first output period in FIGS. 13 and 14, the switch groups 4 and 5 are controlled to select one capacitor 6-1 according to the voltage level Vin1 of the input signal. In addition, in the first output period, the switches 401 to 404 are turned on and the switches 411 to 414 are turned off so that the input terminals 111 and 112 of the operational amplifier 10 are connected to the gate electrodes of the transistors 201 and 202 respectively. In addition, in the first output period, the switch 104 is turned on and the switches 105 and 106 are turned off according to the state of the pair of input terminals 111 and 112.

In a first term T11 in the first output period, the switch 102 is turned off and the switches 101 and 103 are turned on according to the state of the pair of input terminals 111 and 112, and consequently the amplifier circuit shown in FIG. 13 is put in the connection state shown in FIG. 15A. At this time, the output voltage Vout includes the offset voltage Voff, and so it is Vout=Vin+Voff. In addition, the potential of one end 113 (refer to FIG. 15) of the capacitor 6-1 becomes equal to the input voltage Vin and the potential of the other end 114 (refer to FIG. 15) becomes equal to the output voltage Vout, and so the capacitor 6-1 is charged with the charge equivalent to the offset voltage Voff.

In a second term T12 in the first output period, the switches 101 and 103 are turned off and the switch 102 is turned on, and consequently the amplifier circuit shown in FIG. 13 is put in the connection state shown in FIG. 15B. At this time, the capacitor 6-1 is directly connected between the input terminal 112 of the operational amplifier and the output terminal, and the offset voltage is applied to the input terminal 112 in reference to the potential of the output terminal. As a result of this, the output voltage Vout becomes Vout=Vin+Voff−Voff so that the offset voltage is set off and the output voltage equal to the input voltage can be obtained.

Next, in the second output period, the switch groups 4 and 5 are also controlled to select one capacitor 6-1 because the input voltage level is Vin1. In addition, in the second output period, the switches 401 to 404 are turned off and the switches 411 to 414 are turned on so that the input terminals 111 and 112 are connected to the gate electrodes of the transistors 202 and 201 respectively. In addition, in the second output period, the switches 103 and 104 are turned off and the switch 106 is turned on according to the state of the pair of input terminals 111 and 112.

In a first term T21 in the second output period, the switches 102 and 105 are turned on and the switch 101 is turned off according to the state of the pair of input terminals 111 and 112, and consequently the amplifier circuit shown in FIG. 13 is put in the connection state shown in FIG. 16A. At this time, the output voltage Vout includes the offset voltage −Voff, and so it is Vout=Vin−Voff. In addition, the potential of one end 114 of the capacitor 6-1 becomes equal to the input voltage Vin and the potential of the other end 113 becomes equal to the output voltage Vout, and so the capacitor 6-1 is charged with the charge equivalent to the offset voltage −Voff.

In a second term T22 in the second output period, the switches 102 and 105 are turned off and the switch 101 is turned on, and consequently the amplifier circuit shown in FIG. 13 is put in the connection state shown in FIG. 16B. At this time, the capacitor 6-1 is directly connected between the input terminal 112 of the operational amplifier 10 and the output terminal, and the offset voltage is applied to the input terminal 112 of the operational amplifier 10 in reference to the potential of the output terminal. As a result of this, the output voltage Vout becomes Vout=Vin−Voff+Voff so that the offset voltage is set off and the output voltage equal to the input voltage can be obtained.

In the output periods from the second output period onward, the operations in the first and second output periods are repeated, so that the high-precision output can be realized as with the amplifier circuit shown in FIG. 9.

As described above, in the first term T11 in the first output period, one end 113 and the other end 114 of the capacitor 6-1 are connected to the circuit input terminal and the output terminal 8 respectively so that the potential of the one end 113 becomes Vin and the potential of the other end 114 becomes Vout (=Vin+Voff), whereas, in the first term T21 in the second output period in which the state of the pair of input terminals 111 and 112 is different from that in the first output period, one end 113 and the other end 114 of the capacitor 6-1 are connected to the output terminal 8 and the circuit input terminal so that the potential of the one end 113 becomes Vout (=Vin−Voff) and the potential of the other end 114 becomes Vin, and so both ends of the capacitor 6-1 are charged with the equal voltage in the first and second output periods. Thus, the connection of the capacitor for storing the offset voltages is switched according to the state of the pair of input terminals 111 and 112, and thus the capacitor requires little power consumption due to the charge and discharge.

While the above described the case where the input voltage is Vin1 in both the successive first and second output periods, the same effect thereof can be obtained even in the case where the input voltages in the first and second output periods are mutually different.

In short, the switch control should be performed so that, in the first term in one output period in which the input terminal 111 is the non-inverting input terminal and the input terminal 112 is the inverting input terminal, one end of the capacitor selected according to the input voltage level supplied in that one output period is connected to the circuit input terminal and the other end is connected to the output terminal 8, and in first term in another output period in which the input terminal 111 is the inverting input terminal and the input terminal 112 is the non-inverting input terminal, one end of the capacitor selected according to the input voltage level supplied in that one output period is connected to the output terminal 8 and the other end is connected to the circuit input terminal.

Thus, as for the amplifier circuit shown in FIG. 13, the connection of the selected capacitor is switched according to the switching between the MOS transistor of the input stage to which the input voltage is applied and the MOS transistor of the input stage to which the output voltage is returned so that the offset voltages stored in the selected capacitor become equal, and so it is sufficient to provide one capacitor to each input voltage level, and in the case where the number of input voltages is N. N pieces of capacitors should be provided. Accordingly, the number of capacitors can be rendered less than the amplifier circuit shown in FIG. 9 so that the area of the circuit can be saved and the same effect as the amplifier circuit shown in FIG. 9 can be obtained.

In addition, in case of using the amplifier circuit shown in FIG. 13 as the picture signal line driving means of the liquid crystal display device, it performs the offset voltage correcting operation and the operation of alternately switching between the MOS transistor of the input stage to which the input voltage of the amplifier circuit is applied and the MOS transistor of the input stage to which the output voltage is returned. Even in the case where the amplifier circuit is constituted by the transistors having significant variations in the elements, the offset voltages themselves generated to the operational amplifier can be rendered low enough by performing the offset correcting operation, and furthermore, the offset voltages can be temporally averaged on every four frames by switching the transistors of the input stage on every two frames for instance. It thereby temporally averages the rise and decrease in the luminance caused by the offset voltages so that the display quality can be improved even in the case where the amplifier circuit is constituted by the transistors having the significant variations in the elements.

Moreover, it is not limited to the configuration shown in FIG. 13, but any amplifier circuit can realize the same effect as that of the amplifier circuit shown in FIG. 9 without increasing the number of capacitors for storing the offset voltages, as long as it is the amplifier circuit having the means for counterchanging and connecting a high-potential side terminal and a low-potential side terminal of the capacitor according to the switching between the MOS transistor of the input stage to which the input voltage is applied and the MOS transistor of the input stage to which the output voltage is returned.

In addition, the timing chart in FIG. 14 shows the case where each switch has no delay and the controlling means 12 simultaneously controls the switches. In the case where each switch has a delay, however, the switch control is performed in consideration of the delay so that the switches 101 and 103 will not be in a conductive state before the switch 102 is in a nonconductive state in the term T11, so that the switch 102 will not be in a conductive state before the switches 101 and 103 are in a nonconductive state in the term T12, and so that the switch 101 will not be in the conductive state before the switches 102 and 105 are in the nonconductive state in the term T22.

Figure 17:
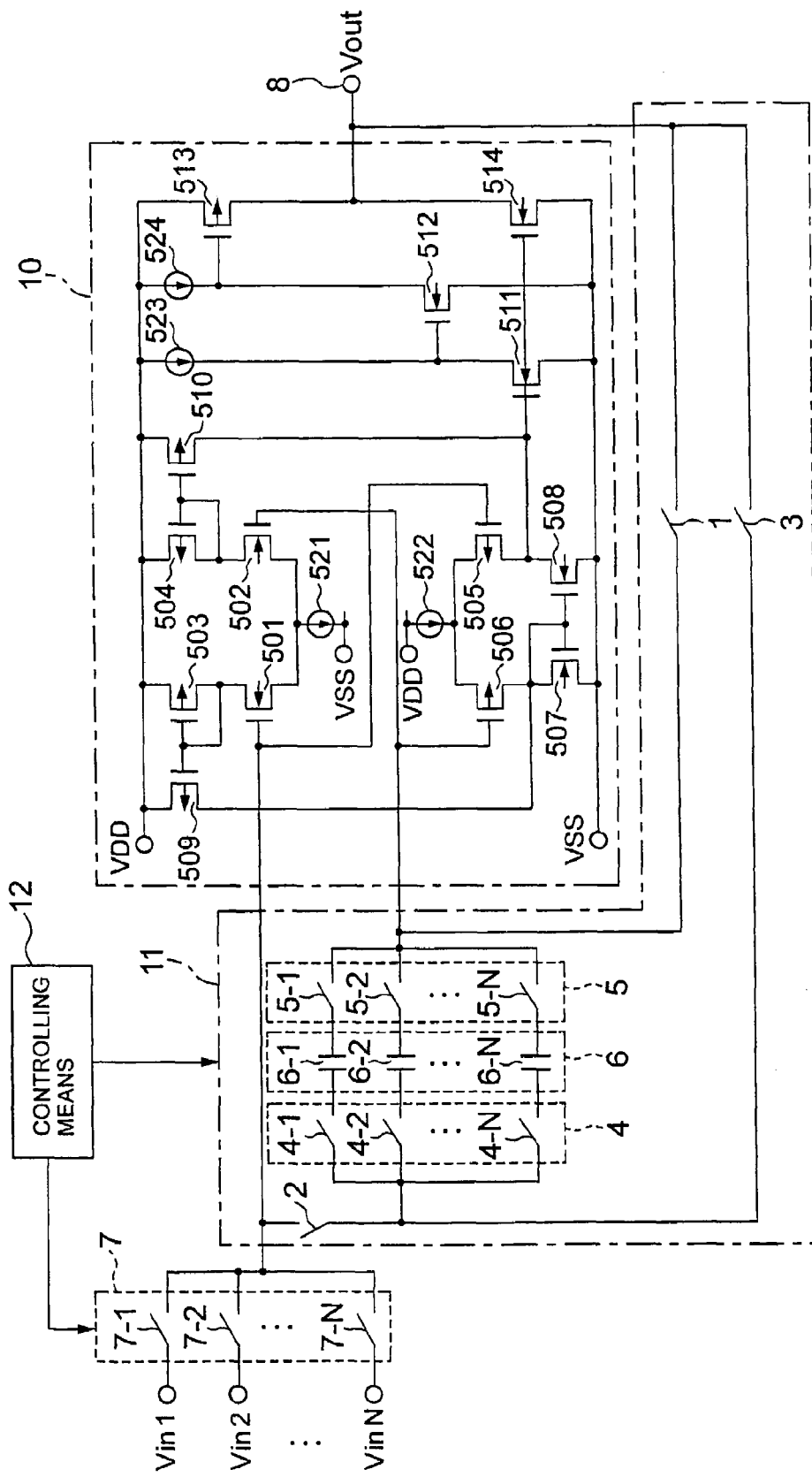
FIG. 17 is a diagram showing the configuration of the amplifier circuit in case of applying the operational amplifier in FIG. 18 to the amplifier circuit in FIG. 1.
Figure 18:
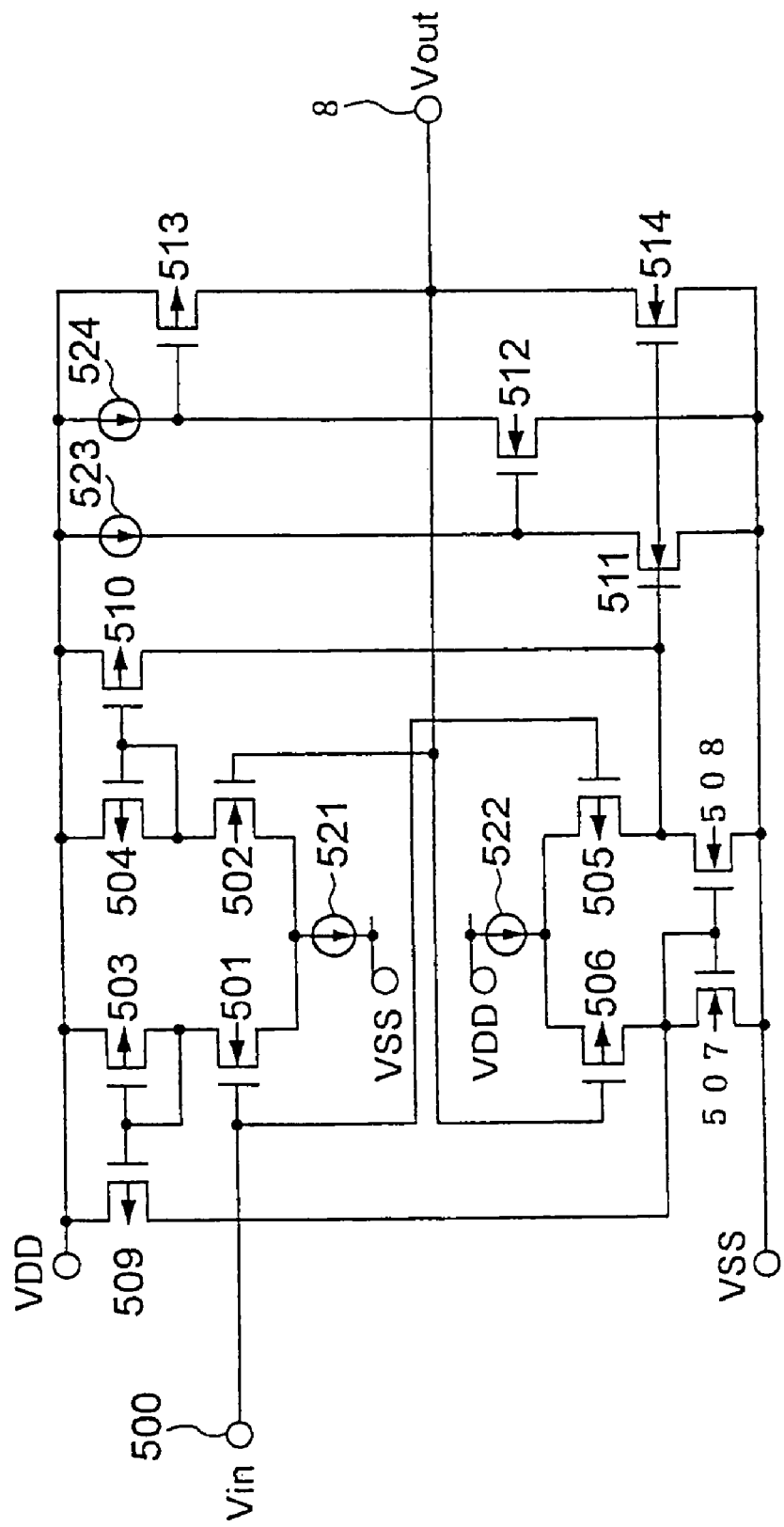
FIG. 18 is a diagram showing a configuration of a fourth operational amplifier.

FIG. 17 is a diagram showing the configuration of the amplifier circuit in the case where the operational amplifier shown in FIG. 18 is applied to the operational amplifier 10 of the amplifier circuit shown in FIG. 1. In addition, FIG. 18 is a diagram showing the configuration of a fourth operational amplifier. The operational amplifier shown in FIG. 18 has improved as to a problem of a narrow dynamic range of the operational amplifiers shown in FIGS. 7 and 8, and allows a wide input and output range. An example of the operational amplifier capable of such a wide input and output range is described in Japanese Patent Laid-Open No. 9-93055.

The operational amplifier shown in FIG. 18 has NMOS transistors 501 and 502 having the source connected in common and the gates connected to an input terminal 500 and the output terminal 8 respectively and constituting the differential pair, PMOS transistors 505 and 506 having the source connected in common and the gates connected to the input terminal 500 and the output terminal 8 respectively and constituting the differential pair, a constant current source 521 connected between the source of the NMOS transistors 501 and 502 and a low-order side power supply VSS, and a constant current source 522 connected between the source of the PMOS transistors 505 and 506 and a high-order side power supply VDD.

In addition, the operational amplifier shown in FIG. 18 has a first current Miller circuit comprised of a PMOS transistor 503 having the gate and drain connected to the drain of the NMOS transistor 501 and the source connected to the high-order side power supply VDD and a PMOS transistor 509 having the drain connected to the connection point of the drain of the PMOS transistor 506 and the drain of the NMOS transistor 507 and the source connected to the high-order side power supply VDD.

In addition, the operational amplifier shown in FIG. 18 has a second current Miller circuit comprised of a PMOS transistor 504 having the drain and gate connected to the drain of the NMOS transistor 502 and the source connected to the high-order side power supply VDD and a PMOS transistor 510 having the drain connected to the connection point of the drain of the PMOS transistor 505 and the drain of the NMOS transistor 508 and the source connected to the high-order side power supply VDD.

In addition, the operational amplifier shown in FIG. 18 has the current Miller circuit for working as an active load connected between the drains of the PMOS transistors 505 and 506 and the low-order side power supply VSS and comprised of the NMOS transistors 507 and 508.

In addition, the operational amplifier shown in FIG. 18 has constant current sources 523 and 524 of which one ends are connected to the high-order side power supply VDD respectively, an NMOS transistor 511 having the source connected to the low-order side power supply VSS, the gate connected to the connection point of the drain of the PMOS transistor 505 and the drain of the NMOS transistor 508 and the drain connected to the other end of the constant current source 523, and an NMOS transistor 512 having the source connected to the low-order side power supply VSS, the gate connected to the drain of the NMOS transistor 511 and the drain connected to the other end of the constant current source 524.

In addition, the operational amplifier shown in FIG. 18 has a PMOS transistor 513 having the source connected to the high-order side power supply VDD, the gate connected to the connection point of the drain of the NMOS transistor 512 and the other end of the constant current source 524 and the drain connected to the output terminal 8, and an NMOS transistor 514 having the source connected to the low-order side power supply VSS, the gate connected to the connection point of the drain of the PMOS transistor 505 and the drain of the NMOS transistor 508 and the drain connected to the output terminal 8.

In the operational amplifier in FIG. 18 thus constituted, the differential pair comprised of the NMOS transistors 501 and 502 and the differential pair comprised of the PMOS transistors 505 and 506 are constituted in parallel via the PMOS transistors 509 and 510 having the gate electrodes in common with the PMOS transistors 503 and 504 which are the active loads of the NMOS transistors 501 and 502 respectively, forming the input stage allowing a wide input range. In addition, it has an output range from the potential which lowered from the high-order side power supply VDD by the voltage between the drain and the source of the PMOS transistor 513 to the potential which rose from the low-order side power supply VSS by the voltage between the drain and the source of the NMOS transistor 514, forming the output stage allowing a wide output range.

Here, the offset voltage is generated in the case where a symmetry of the transistors constituting the differential pair collapses due to variations in threshold voltage of the transistors or gate width/gate length (W/L) and so on. In the operational amplifier shown in FIG. 18, the variations in the elements of the differential pair comprised of the NMOS transistors 501 and 502 are returned to the differential pair comprised of the PMOS transistors 505 and 506 via the PMOS transistors 509 and 510 constituting the current Miller circuit with the PMOS transistors 503 and 504, so that the offset voltages generated due to the variations in the elements of the two differential pairs are averaged in the input voltage range in which the two differential pairs operate together. Accordingly, as the offset voltages generated due to the characteristic variations in the elements of the respective differential pairs are corrected in the input voltage range in which the two differential pairs operate together, there is an advantage that the output voltage precision is high and the offset voltage is low.

In recent years, portable apparatuses centering on a portable telephone are in increasing demand, and low power consumption can be named as an important capability required of the portable apparatuses. In the case where the operational amplifier shown in FIG. 18 is used for the portable apparatuses, it is possible to realize low power consumption of the operational amplifier by lowering power supply voltage thereof. As for the operational amplifier shown in FIG. 18, however, the differential pair comprised of the NMOS transistors 501 and 502 does not operate in the case where the input voltage is lower than the threshold voltage of the transistor 501 and the differential pair comprised of the PMOS transistors 505 and 506 does not operate in the case of equal to or exceeding the potential wherein the input voltage is lowered from the high-order side power supply VDD by the threshold voltage of the transistor 505.

As off-leak currents increase by lowering the threshold voltage of the transistor, the threshold voltage cannot be lowered even if the power supply voltage is lowered. For that reason, in the case where the operational amplifier shown in FIG. 18 operates on a condition that the power supply voltage is low enough, the input voltage range in which the differential pair comprised of the NMOS transistors 501 and 502 and the differential pair comprised of the PMOS transistors 505 and 506 operate together becomes narrow against the power supply voltage range, and the input voltage range in which only one of the two differential pairs operates becomes wide. In the case where only one of the two differential pairs operates, the offset voltage is generated due to the influence of the characteristic variations of the active elements of the differential pair. To be more specific, even in the case of the operational amplifier capable of the high-precision output as described above, the high-precision output becomes difficult on the condition that the power supply voltage is low enough.

On the other hand, as for the amplifier circuit shown in FIG. 17, the controlling means 12 controls the switch groups 4 and 5 and the switches 1 to 3 according to the input voltage level, as with the amplifier circuit shown in FIG. 1, to have the offset voltage according to the input voltage level stored and held in the capacitor according to the input voltage level or the capacitor corresponding to the input voltage level one for one so as to perform the offset correcting operation. For that reason, in the case where the power supply voltage is low enough, the operational amplifier shown in FIG. 18 has the offset voltage generated and so the high-precision output becomes difficult, whereas the amplifier circuit shown in FIG. 17 is capable of the high-precision output.

In addition, there is little power consumption due to the charge and discharge of the charge by the offset correcting operation, and the power consumption by the offset correcting operation can be curbed to the minimum. Therefore, the amplifier circuit shown in FIG. 17 can realize the high output precision, low power consumption and wide input and output range.

Furthermore, once the offset voltage is stored in the capacitor for storing the offset voltage, there is little power consumption due to the charge and discharge, and so the output precision can be enhanced without increasing the power consumption even if the capacity of the capacitor is increased in order to curb the influence of the capacity coupling occurring on switching.

While the description was given by taking a representative example applied to the operational amplifier 10 of the amplifier circuit shown in FIG. 1 as above, any other operational amplifier is applicable, and also in that case, the same effect as that of the amplifier circuit shown in FIG. 1 can be realized.

Figure 19:
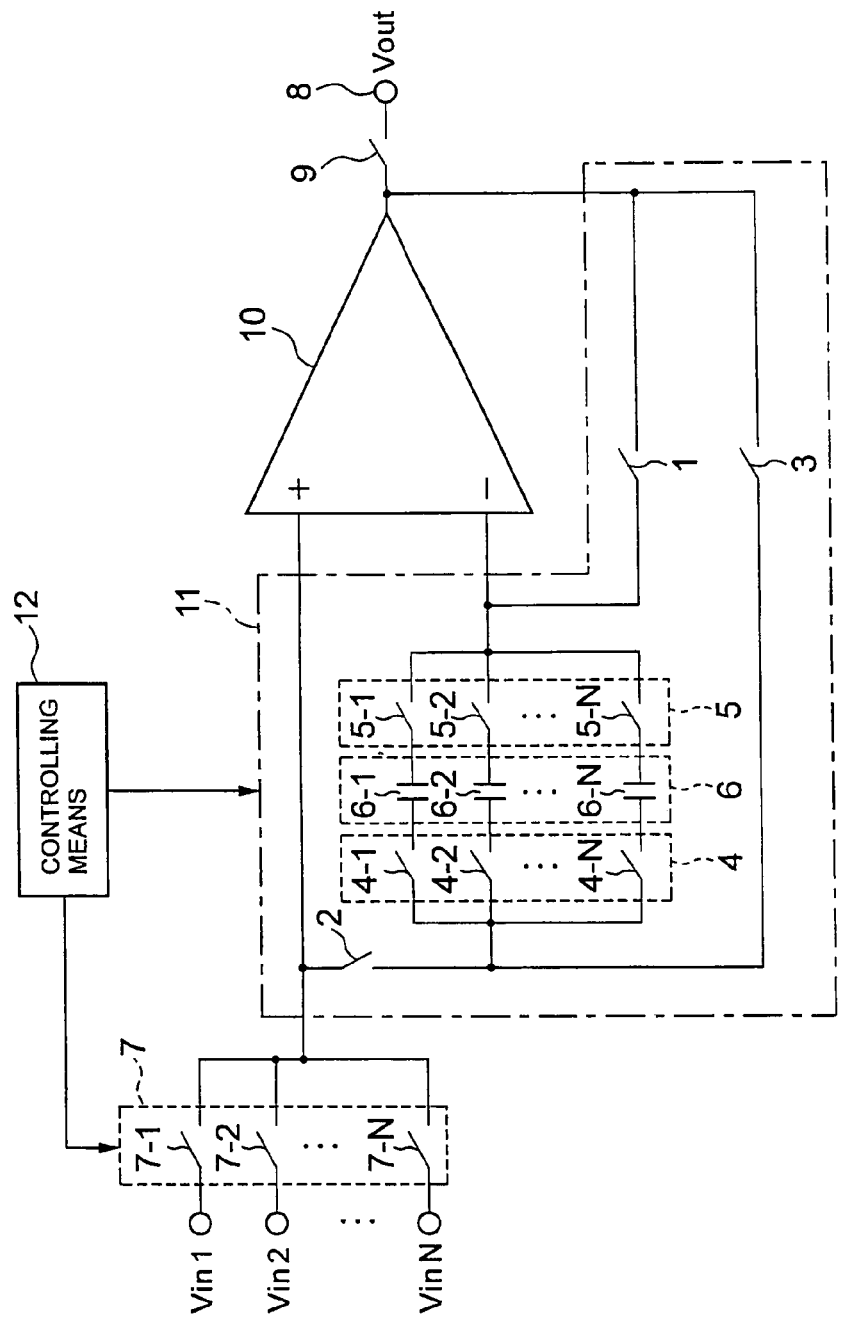
FIG. 19 is a diagram showing a modification example of the amplifier circuit shown in FIG. 1.
Figure 20:
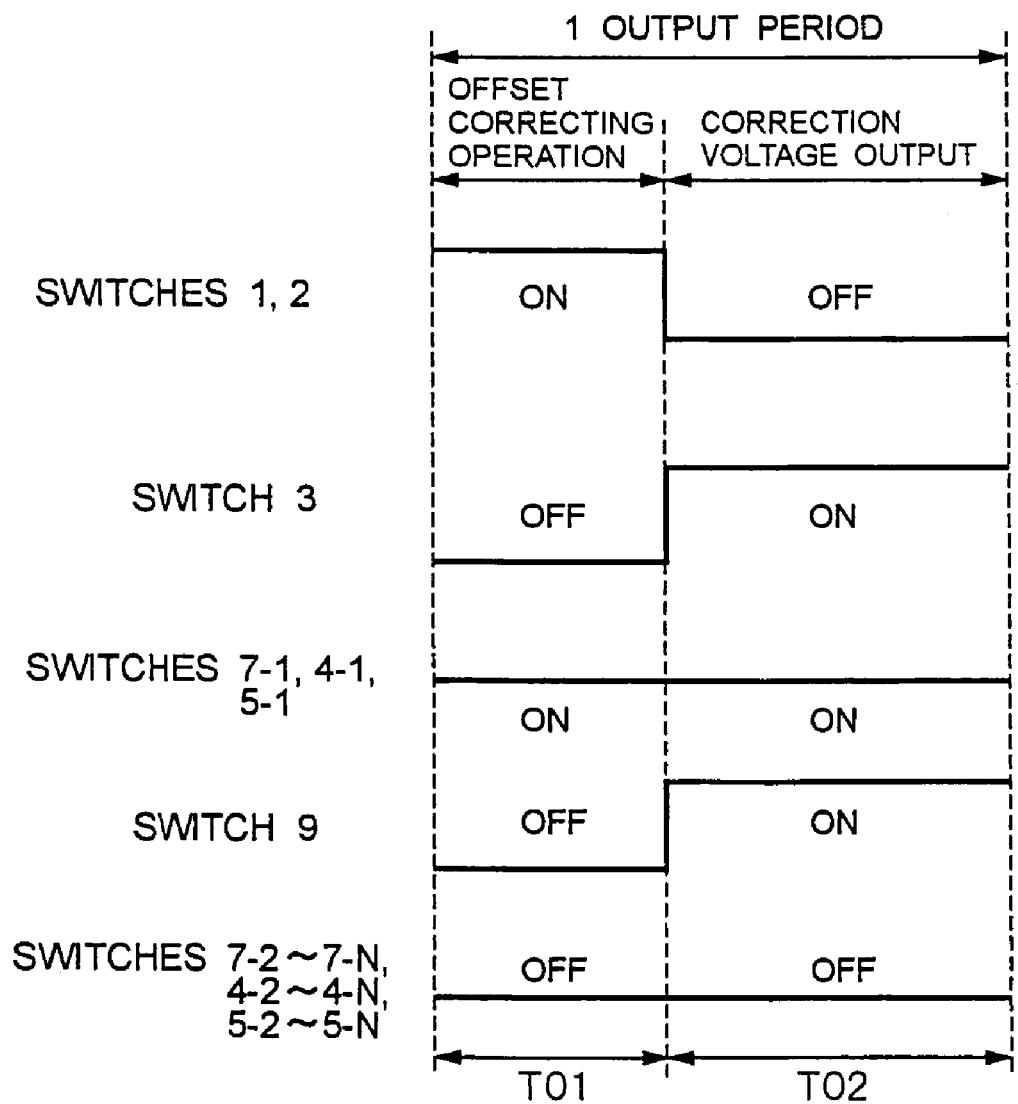
FIG. 20 is a timing chart showing an operation example of the amplifier circuit shown in FIG. 19.
Figure 21:
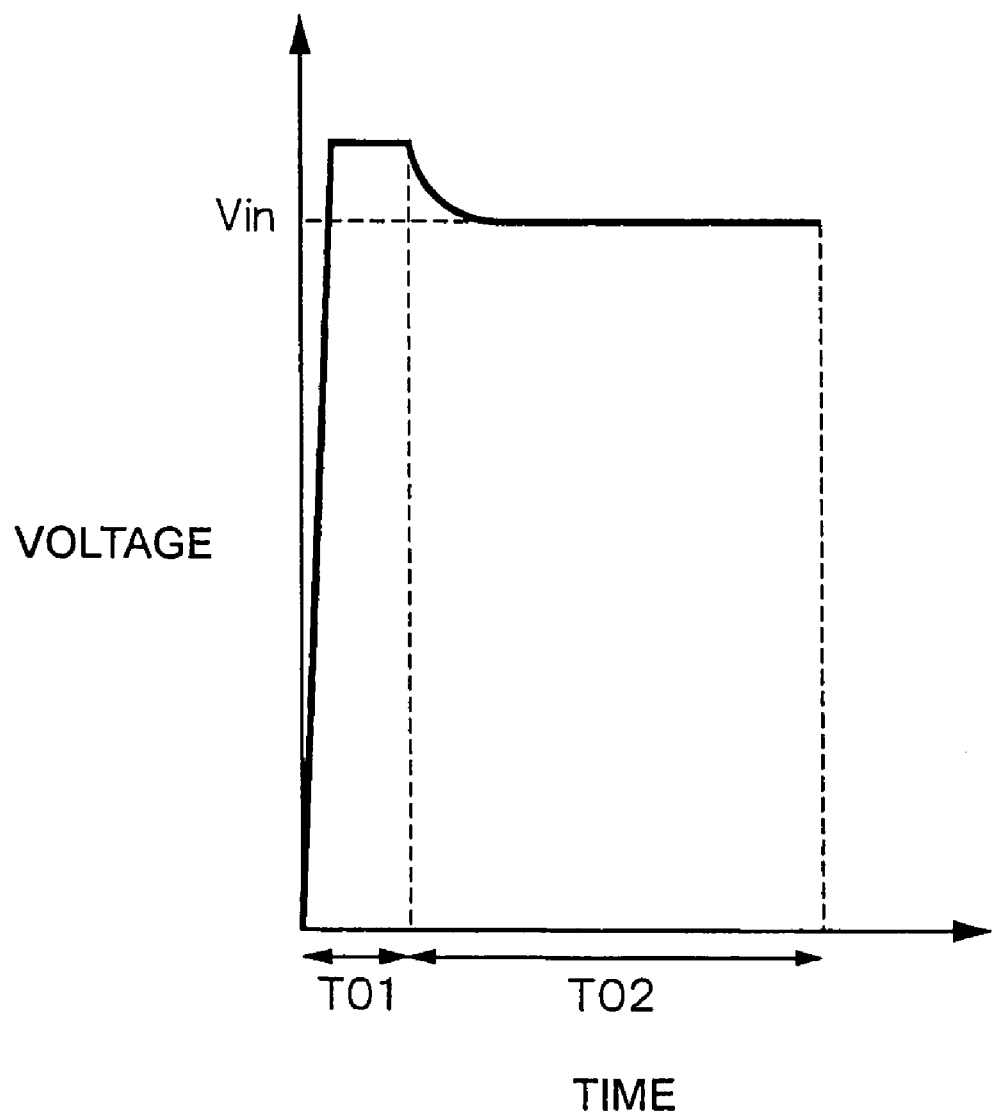
FIG. 21 is a diagram showing the output voltage waveform according to the operation example shown in FIG. 20.

FIG. 19 is a diagram showing a modification example of the amplifier circuit shown in FIG. 1. The amplifier circuit shown in FIG. 19 is different from the amplifier circuit shown in FIG. 1 in that a switch 9 is connected between the output terminal of the operational amplifier 10 and the circuit output terminal 8. In addition. FIG. 20 is a timing chart showing an operation example of the amplifier circuit shown in FIG. 19, and FIG. 21 is a diagram showing the output voltage waveform according to the operation example shown in FIG. 20. Moreover. FIG. 20 shows the operation in the case where the voltage level of the input signal in one output period is Vin1 as in FIG. 2.

Hereafter, the difference from the amplifier circuit shown in FIG. 1 will be described by referring to the drawings. In the case where the amplifier circuit shown in FIG. 1 drives a large capacitive load, the term T01 for performing the offset voltage storing operation shown in FIG. 2 must be set as a sufficiently long period in which the output of the amplifier circuit becomes stable (refer to FIG. 3).

On the other hand, as for the amplifier circuit shown in FIG. 19, as shown in FIG. 20, the switch 9 is turned off in the term T01 for performing the offset voltage storing operation, and it is turned on in the term T02 for performing the output correction of the operational amplifier 10. Thus, even in the case where the amplifier circuit shown in FIG. 19 drives a large capacitive load, only the offset voltage is stored in the capacitor in the term T01, so that the output promptly becomes stable as shown in FIG. 21. For that reason, it is possible to shorten the term T01 and shorten one output period.

As a use of the amplifier circuit according to the first embodiment of the present invention described above, a driving circuit of a display apparatus can be named. Hereafter, a driving circuit of a display apparatus according to the embodiment of the present invention will be described.

Figure 22:
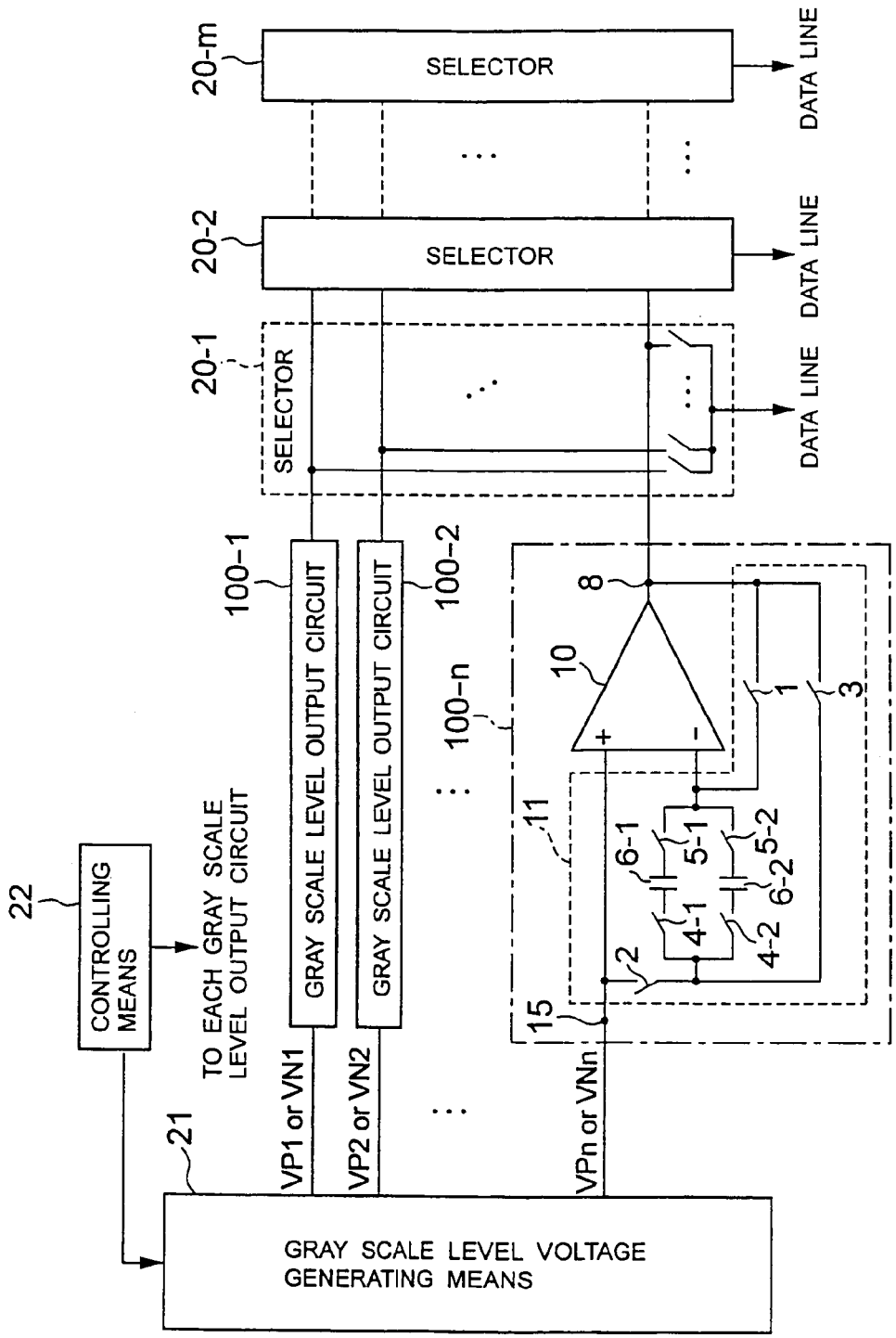
FIG. 22 is a diagram showing the configuration of the driving circuit of the display apparatus according to a second embodiment of the present invention.

FIG. 22 is a diagram showing the configuration of a driving circuit of a display apparatus according to a second embodiment of the present invention. The driving circuit shown in FIG. 22 is applicable to the driving circuit of the display apparatus having two polarities, and to be more specific, it is applicable to the driving circuit of the liquid crystal display apparatus having the two polarities which are positive and negative.

In FIG. 22, the driving circuit of the display apparatus according to the second embodiment of the present invention is comprised of a gray scale level voltage generating means 21 for outputting a plurality of positive gray scale level voltages VP1, VP2, ▌ , VPn (n is a positive integer) or a plurality of negative gray scale level voltages VN1, VN2, ▯, VNn, gray scale level output circuits 100-1 to 100-n for amplifying the gray scale level voltages VP1 to VPn or VN1 to VNn from the gray scale level voltage generating means 21, selectors 20-1 to 20-m (m is a positive integer), and a controlling means 22 for controlling the gray scale level voltage generating means 21 and the gray scale level output circuits.

Each of the selectors 20-1 to 20-m selects a voltage necessary for driving the display apparatus according to a video data signal among the gray scale level voltages amplified by the gray scale level output circuits 100-1 to 100-n, and outputs it to a data line. The gray scale level output circuits 100-1 to 100-n are provided to n pieces of output terminal of the gray scale level voltage generating means 21 respectively. To be more specific, the gray scale level output circuit is provided to each of gray scale levels. The gray scale level voltage generating means 21 is comprised of resistance strings serially connecting resistor elements for instance, and outputs the positive or negative gray scale level voltages from a ready access terminals in the resistance strings to the gray scale level output circuits 100-1 to 100-n respectively.

Moreover, liquid crystal used for the liquid crystal display apparatus needs to have AC voltage applied in order to prevent deterioration, and as the methods of AC-driving the liquid crystal, a method of performing an AC drive by fixing a common voltage (counter voltage) and a method of performing it by changing the common voltage according to the polarity are known. The former driving method is called a common DC driving method whereby the common voltage is fixed and the voltage applied to the liquid crystal is alternately inverted to positive and negative in reference to the common voltage. The latter driving method is called a common inversion driving method whereby the common voltage is changed according to the polarity and the voltage applied to the liquid crystal is alternately inverted to positive and negative in reference to the common voltage.

Figure 23A:
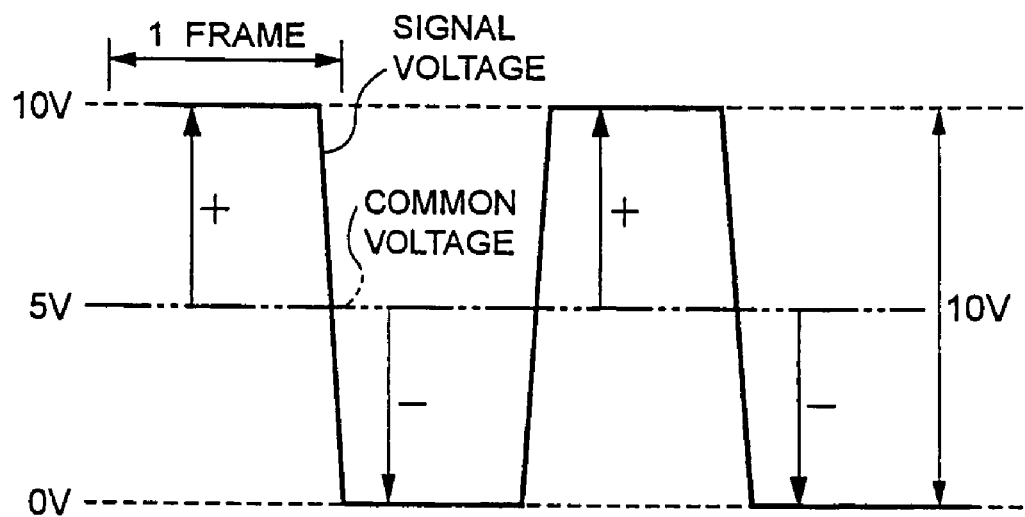
FIG. 23A is a diagram showing a waveform of a common voltage of one pixel by the common DC driving method and a waveform of a signal voltage of a maximum amplitude of the signal voltages applied to a liquid crystal.
Figure 23B:
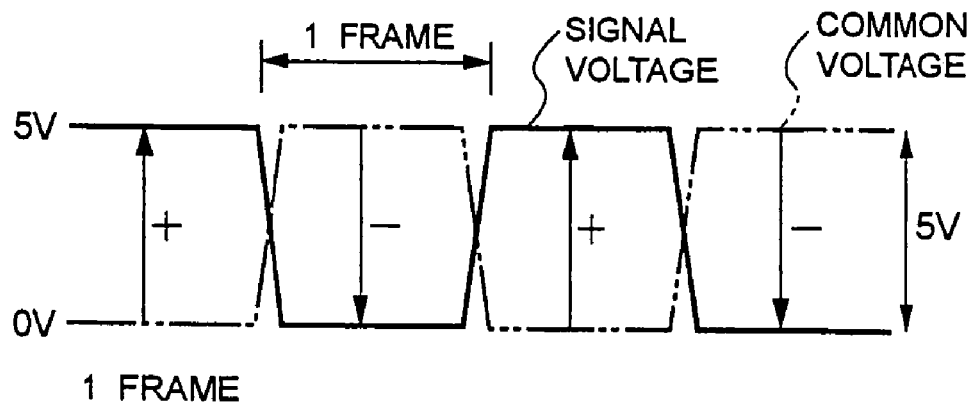
FIG. 23B is a diagram showing the waveform of the common voltage of one pixel by the common inversion driving method and the waveform of the signal voltage of the maximum amplitude of the signal voltages applied to the liquid crystal.

FIG. 23A is a diagram showing a waveform of the common voltage of one pixel by the common DC driving method and a waveform of the signal voltage of a maximum amplitude of the signal voltages applied to the liquid crystal, whereas FIG. 23B is a diagram showing a waveform of the common voltage of one pixel by the common inversion driving method and a waveform of the signal voltage of the maximum amplitude of the signal voltages applied to the liquid crystal. Moreover, in FIGS. 23A and 23B, inversion of polarity is performed for each frame, and the maximum applied voltage of the liquid crystal is 5V. With reference to FIG. 23A, as for the common DC driving method, the common voltage is constantly 5V so that the range of the signal voltage is 0 to 10V in order to apply to the liquid crystal 5V which is the maximum applied voltage in reference to the common voltage. On the other hand, with reference to FIG. 23B, as for the common inversion driving method, the common voltage changes such as 0V in a certain frame and 5V in the next frame so that the signal voltage is 5V when the common voltage is 0V and it is 0V when the common voltage is 5V, and thus the range of the signal voltage is 0 to 5V in order to apply to the liquid crystal 5V which is the maximum applied voltage in reference to the common voltage.

Figure 24A:
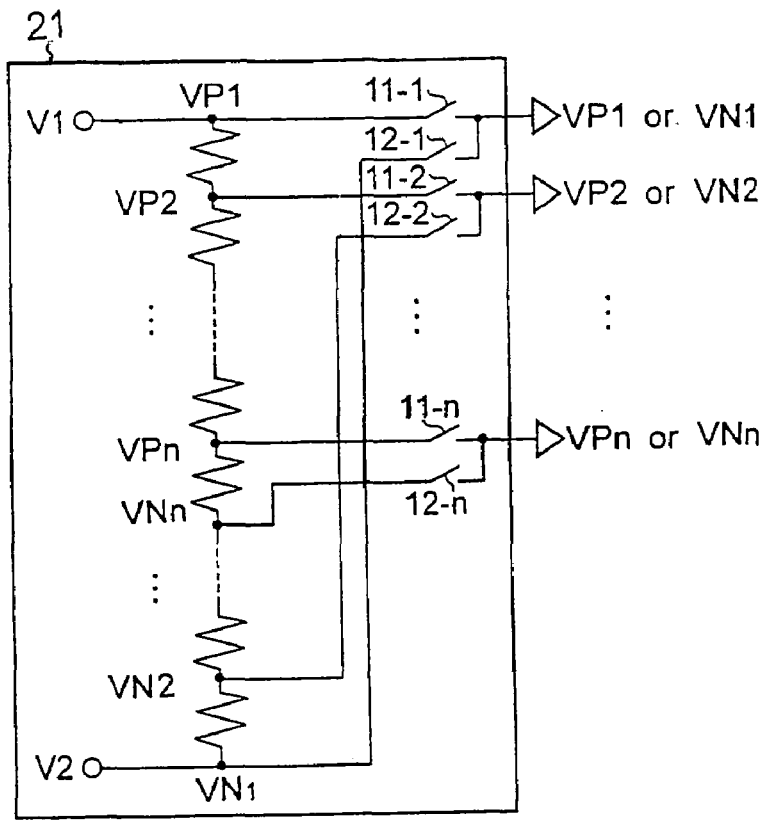
FIG. 24A is a diagram showing a configuration example of the gray scale level voltage generating means shown in FIG. 22 in case of using the common DC driving method.

The common DC driving method and the common inversion driving method are usable for the driving circuit of the display apparatus according to the second embodiment of the present invention. FIG. 24A is a diagram showing a configuration example of the gray scale level voltage generating means 21 shown in FIG. 22 in case of using the common DC driving method, and FIG. 24B is a diagram showing a configuration example of the gray scale level voltage generating means 21 in case of using the common inversion driving method.

With reference to FIG. 24A, as for the common DC driving method, a high power-supply voltage V1 is applied to one end of the resistance string and a low power-supply voltage V2 is applied to the other end thereof, and the positive gray scale level voltages VP1 to VPn and the negative gray scale level voltages VN1 to VNn are generated from the respective ready access terminals of the resistance string. In the case of the positive polarity in the common DC driving method, switches 11-1 to 11-n are turned on and switches 12-1 to 12-n are turned off so that the positive gray scale level voltages VP1 to VPn are selected and outputted. In addition, in the case of the negative polarity, the switches 11-1 to 11-n are turned off and the switches 12-1 to 12-n are turned on so that the negative gray scale level voltages VN1 to VNn are selected and outputted.

Figure 24B:
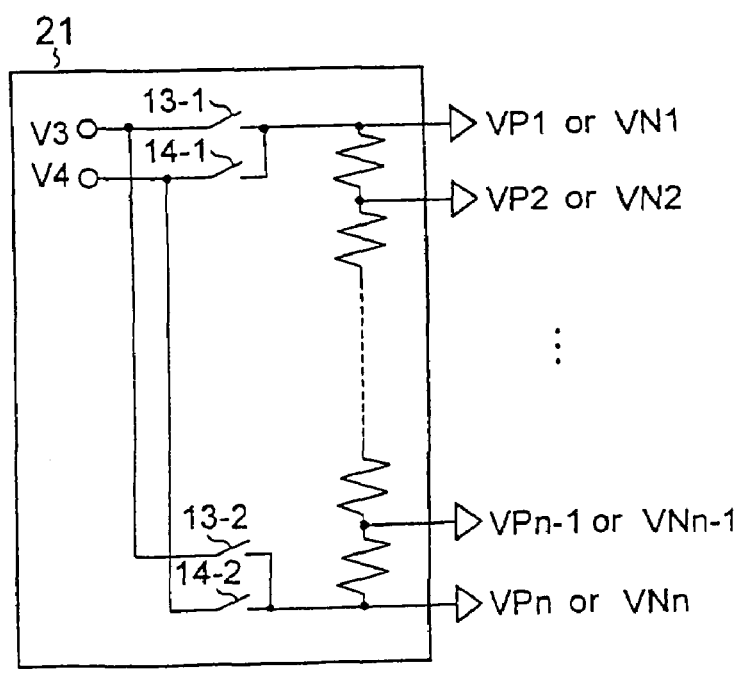
FIG. 24B is a diagram showing a configuration example of the gray scale level voltage generating means shown in FIG. 22 in case of using the common inversion driving method.

On the other hand, with reference to FIG. 24B, in the case of the positive polarity in the common inversion driving method, switches 13-1 and 14-2 are turned on and switches 13-2 and 14-1 are turned off so that a high power-supply voltage V3 is applied to one end of the resistance string and a low power-supply voltage V4 is applied to the other end thereof, and the positive gray scale level voltages VP1 to VPn are generated and outputted from the respective ready access terminals of the resistance string. In addition, in the case of the negative polarity, switches 13-1 and 14-2 are turned off and switches 13-2 and 14-1 are turned on so that the low power-supply voltage V4 is applied to one end of the resistance string and the high power-supply voltage V3 is applied to the other end thereof, and the negative gray scale level voltages VN1 to VNn are generated and outputted from the respective ready access terminals of the resistance string. As described above, it is possible, by the common inversion driving method, to invert the voltages applied to both ends of the resistance string according to the polarity so as to render a potential difference between the common voltage and each terminal equal between the positive and negative polarities.

Returning to FIG. 22, each of the gray scale level output circuits 100-1 to 100-n is comprised of a circuit input terminal 15, a circuit output terminal 8, an operational amplifier 10 and an offset correction circuit 11. The input terminal 15 has the positive or negative gray scale level voltages outputted from the gray scale level voltage generating means 21 inputted thereto. The operational amplifier 10 of the voltage follower outputs to the output terminal 8 the voltages equal to the positive or negative gray scale level voltages outputted from the gray scale level voltage generating means 21.

The offset correction circuit 11 is comprised of the switches 1 to 3, the two capacitors 6-1, 6-2 and capacitor selection means constituted by the switches 4-1, 4-2, 5-1 and 5-2. The switch 1 is connected between an inverting input terminal of the operational amplifier 10 and the output terminal 8, and the switches 2 and 3 are serially connected between the input terminal 15 and the output terminal 8. In addition, one end of each of the two capacitors 6-1 and 6-2 is connected in common to the connection point of the switches 2 and 3 via the switches 4-1 and 4-2, and the other end of each of the capacitors 6-1 and 6-2 is connected to the inverting input terminal of the operational amplifier 10 via the switches 5-1 and 5-2.

Figure 25:
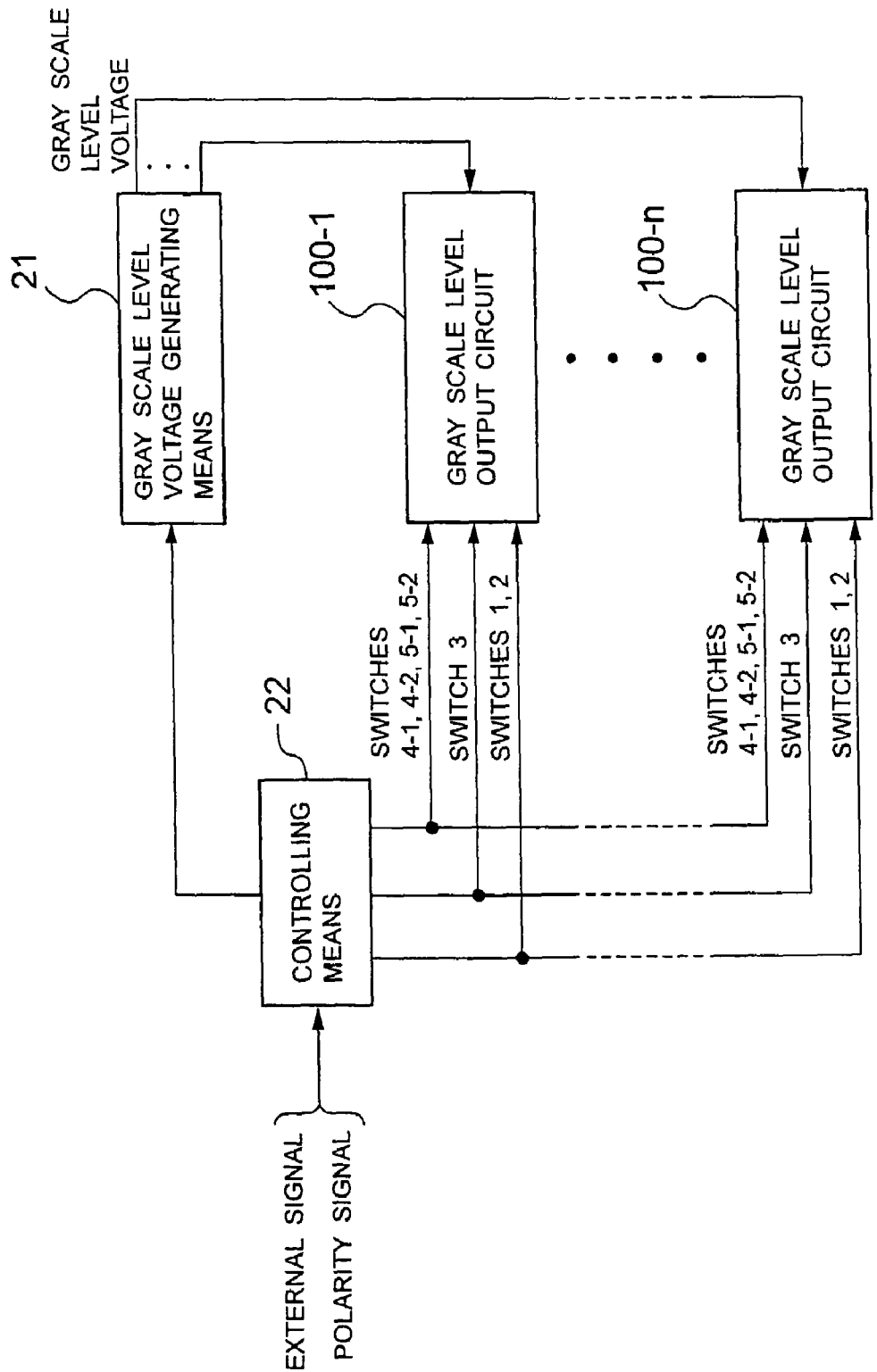
FIG. 25 is a diagram for explaining the operation of the controlling means 22 shown in FIG. 22.

FIG. 25 is a diagram for explaining the operation of the controlling means 22 shown in FIG. 22. In FIG. 25, the controlling means 22 controls the gray scale level voltage generating means 21 and each of the gray scale level output circuits based on an external signal and a polarity signal.

First, operation of the controlling means 22 for controlling the gray scale level voltage generating means 21 will be described by referring to FIG. 25. FIG. 22, FIGS. 24A and 24B.

In FIG. 25, the controlling means 22 controls turning on and off of the switches of the gray scale level voltage generating means 21 such as FIGS. 24A and 24B according to the external signal and polarity signal inputted to the controlling means 22. Moreover, the above external signal means the signal supplied from the outside of the driving circuit in FIG. 22, and is the signal which is a source of the control signal of each switch. In the case of the liquid crystal display apparatus, the polarity signal and external signal are normally supplied from a controller (not shown).

With reference to FIGS. 22 and 24A, in the case where the polarity signal is positive, the gray scale level voltage generating means 21 of the common DC driving method turns on the switches 11-1 to 11-n and turns off the switches 12-1 to 12-n according to the external signal and polarity signal supplied to the controlling means 22 from the outside so as to generate the positive gray scale level voltages (VP1 to VPn) and output them to the gray scale level output circuits. In the case where the polarity signal is negative, the gray scale level voltage generating means 21 turns off the switches 11-1 to 11-n and turns on the switches 12-1 to 12-n so as to output the negative gray scale level voltages (VN1 to VNn) to the gray scale level output circuits.

In addition, with reference to FIGS. 22 and 24B, in the case where the polarity signal is positive, the gray scale level voltage generating means 21 of the common inversion driving method turns on the switches 13-1 and 14-2 and turns off the switches 13-2 and 14-1 according to the external signal and polarity signal supplied to the controlling means 22 from the outside so as to generate the positive gray scale level voltages (VP1 to VPn) and output them to the gray scale level output circuits. In the case where the polarity signal is negative, the gray scale level voltage generating means 21 turns off the switches 13-1 and 14-2 and turns on the switches 13-2 and 14-1 so as to output the negative gray scale level voltages (VN1 to VNn) to the gray scale level output circuits.

Next, operation of the controlling means 22 for controlling the gray scale level output circuits 100-1 to 100-n will be described. In FIGS. 25 and 22, the controlling means 22 controls turning on and off of the switches of each gray scale level output circuit according to the external signal and polarity signal inputted to the controlling means 22. In each of the gray scale level output circuits, the capacitor selection means comprised of the switches 4-1, 4-2 and switches 5-1, 5-2 selects one of the capacitors 6-1 and 6-2 according to the polarity signal supplied to the controlling means 22 from the outside. To be more specific, the controlling means 22 controls the switches 4-1, 4-2 and switches 5-1, 5-2 of each gray scale level output circuit so as to select one of the capacitors 6-1 and 6-2 according to a gray scale level voltage level of the input signal of each gray scale level output circuit. For instance, the controlling means 22 exerts control to select the capacitor 6-1 of each gray scale level output circuit when the polarity signal is positive, that is, when the gray scale level voltage level of the input signal of each gray scale level output circuit is a positive gray scale level voltage, and exerts control to select the capacitor 6-2 of each gray scale level output circuit when the polarity signal is negative, that is, when the gray scale level voltage level of the input signal of each gray scale level output circuit is a negative gray scale level voltage. In addition, the controlling means 22 controls the operation of each gray scale level output circuit by controlling the switches 1 to 3 thereof.

Returning to FIG. 22, each of the selectors 20-1 to 20-m selects the voltage necessary for driving among the gray scale level voltages current-amplified by the operational amplifier 10 of the gray scale level output circuits 100-1 to 100-n according to the video data signal, and outputs it to the data line.

Figure 26:
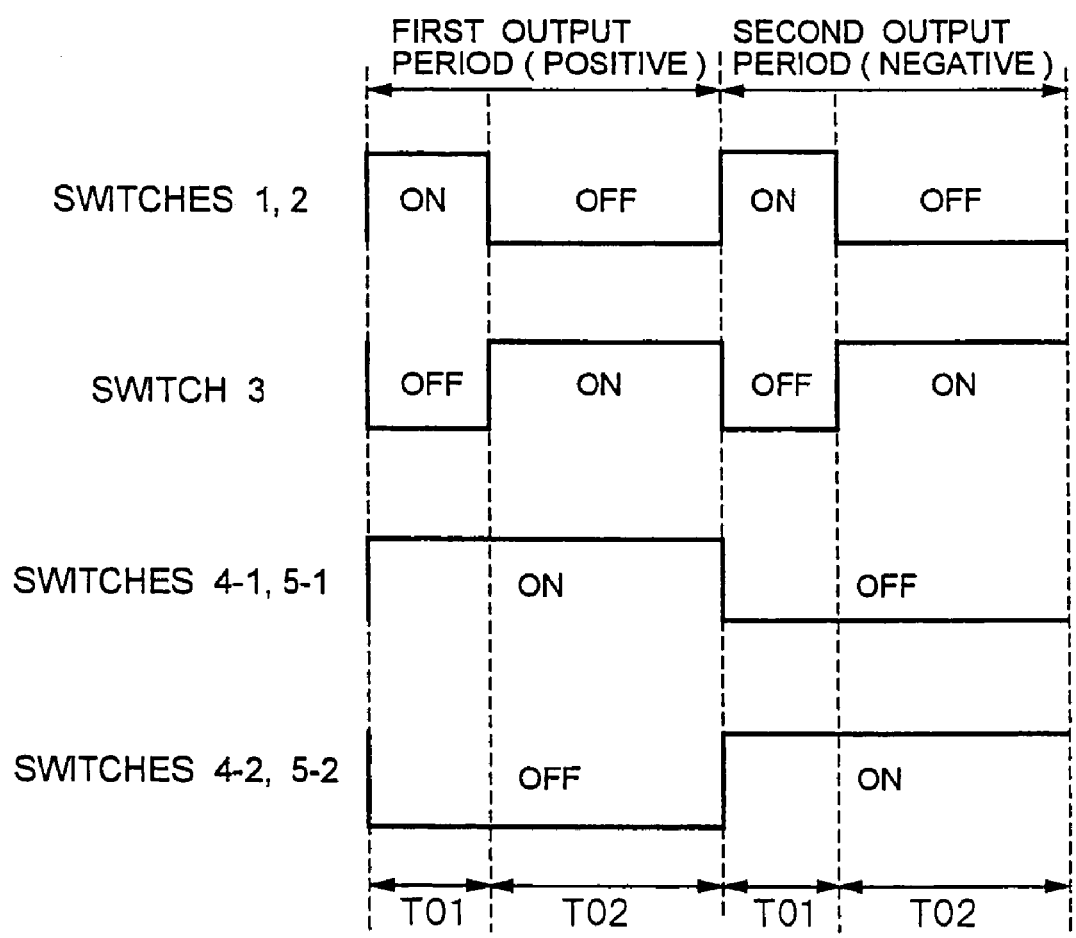
FIG. 26 is a timing chart showing an operation example of each gray scale level output circuit in FIG. 22.

Next, the operation of the driving circuit of the display apparatus according to the second embodiment of the present invention will be described. FIG. 26 is a timing chart showing an operation example of each gray scale level output circuit of the driving circuit shown in FIG. 22. FIG. 26 shows the state of the switches of each gray scale level output circuit in two output periods of a first output period for outputting the positive gray scale level voltage and a second output period for outputting the negative gray scale level voltage in the case where the positive and negative gray scale level voltages are periodically and alternately outputted from each of n pieces of output terminal of the gray scale level voltage generating means 21 in FIG. 22. Moreover, each output period is comprised of a first period T01 for performing the offset correcting operation (offset voltage storing operation) of the operational amplifier 10 and a second period T02 for performing a correction output operation thereof, and the switches 1 to 3 and the switches 4-1, 4-2, 5-1, 5-2 of each of the gray scale level output circuits are controlled by the controlling means 22.

With reference to FIGS. 26 and 22, in the first output period which is a positive output period, first, the switches 4-1 and 5-1 are turned on and the switches 4-2 and 5-2 are turned off to select the capacitor 6-1. In addition, in the first period T01 of the first output period, the switches 1 and 2 are turned on and the switch 3 is turned off, and then the output voltage Vout of the operational amplifier 10 becomes Vin+Voff wherein the input voltage Vin includes the offset voltage Voff. At this time, the potential of one terminal of the capacitor 6-1 becomes the input voltage Vin and the other terminal becomes Vout, and so the capacitor 6-1 is charged with a charge equivalent to the offset voltage Voff generated to the operational amplifier 10 according to the positive gray scale level voltage which is the input voltage.

In the second period T02 of the first output period, the switches 1 and 2 are turned off and the switch 3 is turned on. As the switches 1 and 2 are turned off, the capacitor 6-1 is directly connected between the inverting input terminal of the operational amplifier 10 and the output terminal 8, and the offset voltage Voff is held on the capacitor 6-1. As the switch 3 is turned on, the offset voltage Voff is applied to the inverting input terminal of the operational amplifier 10 in reference to the potential of the output terminal 8. As a result of this, in each of the gray scale level output circuits 100-1 to 100-n, the output voltage Vout becomes Vout=Vin+Voff−Voff=Vin, and so the offset voltage is set off, and the output voltage equal to the input voltage Vin can be obtained.

Next, in the second output period which is a negative output period, the switches 4-1 and 5-1 are turned off and the switches 4-2 and 5-2 are turned on to select the capacitor 6-2. In the first period T01 and the second period T02 of the second output period, the switches 1 to 3 are controlled as in the first period T01 and the second period T02 of the first output period. Thus, in each of the gray scale level output circuits 100-1 to 100-n, the capacitor 6-2 is charged with the offset voltage generated to the operational amplifier 10 according to the negative gray scale level voltage which is the input voltage, and so the offset voltage is set off as in the first output period.

In the unshown output periods after the second output period elapsed, the offset voltage is also corrected by controlling the switches according to the polarity as described above, so that the output voltage equal to the input voltage can be obtained. The voltage necessary for driving is selected by each of the selectors 20-1 to 20-m among the gray scale level voltages current-amplified by the gray scale level output circuits 100-1 to 100-n, and is outputted to the data line.

Moreover, the timing chart in FIG. 26 shows the case where the switches have no delay and are simultaneously controlled by the controlling means 22. In the case where the switches have delay, however, the switches are controlled in consideration of the delays so that the switches 1 and 2 will not be turned on before the switch 3 is turned off in the first period T01 and the switch 3 will not be turned on before the switches 1 and 2 are turned off in the second period T02.

The size of the offset voltage generated to the operational amplifier 10 is different according to the size of the input voltage. However, this embodiment provides two capacitors associated with two gray scale level voltages of positive and negative polarities which are the input voltages inputted to the gray scale level output circuits, and so the capacitor 6-1 can store and hold the offset voltage generated to the operational amplifier 10 when inputting the positive gray scale level voltage and the capacitor 6-2 can store and hold the offset voltage generated to the operational amplifier 10 when inputting the negative gray scale level voltage. Once the offset voltages are stored and held by the two capacitors respectively, it is not necessary to charge and discharge the capacitors in the output period for inputting the gray scale level voltage of the same polarity next, but it is sufficient to replenish the charge which changed due to influence of the capacity coupling occurring on the switching. For that reason, the capacitors have little power consumption due to the charge and discharge of the charge.

In addition, once the offset voltages are stored by the capacitors, there is little power consumption due to the charge and discharge so that it is possible to enhance the output precision without increasing the power consumption even if the capacity of the capacitors is increased in order to curb the influence of the capacity coupling occurring on the switching.

As described above, according to the second embodiment of the present invention, it is possible, by using the gray scale level output circuits of the low power consumption and high-precision offset correcting function, to realize the driving circuit of the display apparatus capable of the low power consumption and high-precision output.

Figure 50:
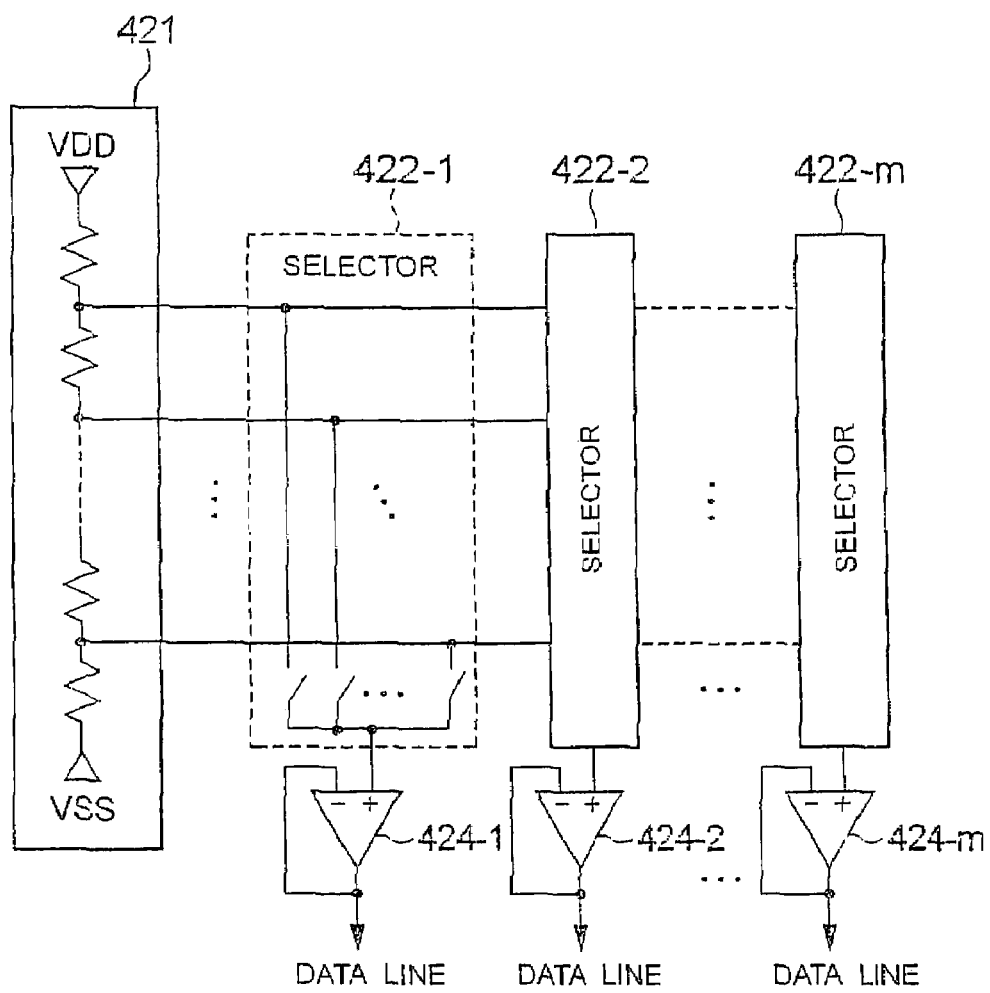
FIG. 50 is a diagram showing a configuration of a second data line driving circuit in the past.

In addition, as for the liquid crystal display apparatus used for the present portable telephone, the number of gray scale levels (n) is smaller than the number of the data lines (m) so that, compared to the configuration wherein the output circuits are provided to m pieces of data line respectively as shown in FIG. 50, the number of the circuits can be reduced in the driving circuit shown in FIG. 22 and thus reduction in costs can be realized. For instance, as for the liquid crystal display apparatus of 4,096 colors and 120×160 pixels used for the present portable telephone, the number of gray scale levels is 16 and the number of the data lines is 360 (120× RGB), where the number of gray scale levels is significantly smaller than the number of the data lines.

Furthermore, in the case where a plurality of the data lines are driven by the same gray scale level voltage, the driving circuit shown in FIG. 22 has no variation in the output voltage for each data line arising because the plurality of the data lines are driven by the gray scale level voltage amplified by the common gray scale level output circuit.

Moreover, the driving circuit shown in FIG. 22 has the gray scale level voltage generated by the gray scale level voltage generating means 21 amplified by the gray scale level output circuit, and has the amplified voltage selected by the selector so as to output the selected voltage to a data line load. Therefore, depending on the results of selection by the selector, there may be the cases where all the data lines are driven by one gray scale level output circuit. However, a low-definition small display such as a mobile display has a data line capacity small enough to be sufficiently driven even in such cases.

In addition, the operational amplifier used for each gray scale level output circuit of the driving circuit shown in FIG. 22 may be in any form.

Figure 27:
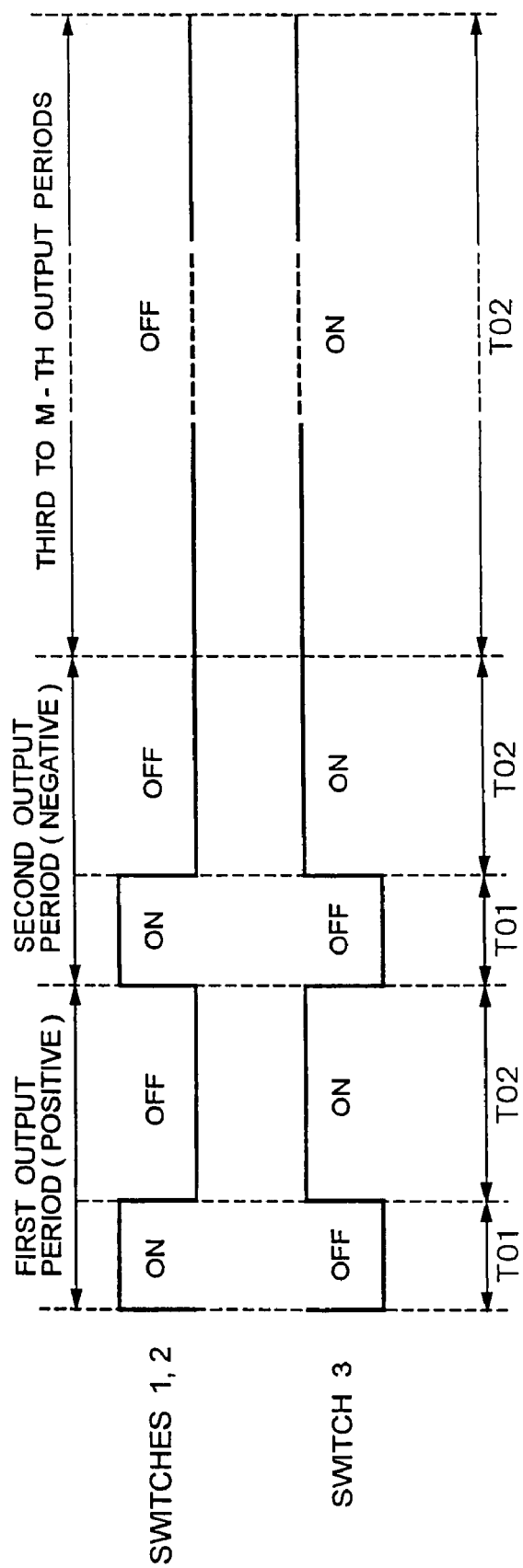
FIG. 27 is a timing chart showing another operation example of each gray scale level output circuit in FIG. 22.

FIG. 27 is a timing chart showing another operation example of each gray scale level output circuit of the driving circuit shown in FIG. 22. While the offset correcting operation (offset voltage storing operation) was performed without fail in each output period in FIG. 26, it is different in FIG. 27 in that the offset correcting operation is only performed in the initial first and second output periods in predetermined M (M is a positive even number of 4 or more) pieces of output period. The predetermined M pieces of output period must be set in periods in which the output precision of the gray scale level output circuit is not lowered due to a leak.

Figure 28:
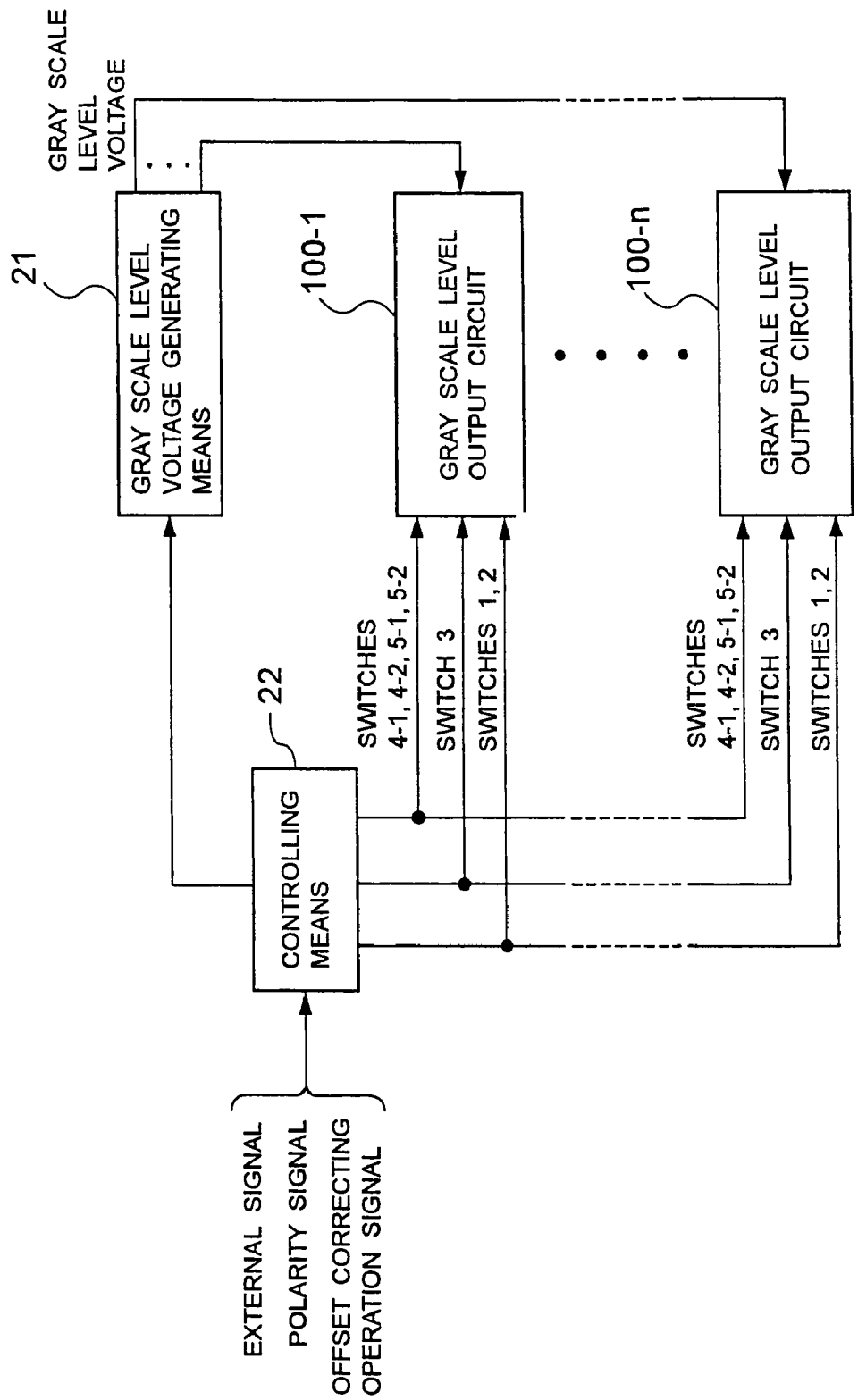
FIG. 28 is a diagram for showing the contents of control of the controlling means 22 in the case where each gray scale level output circuit in FIG. 22 is operated according to the timing chart in FIG. 27.

Moreover, the operation of each gray scale level output circuit according to the timing chart in FIG. 27 is controlled by the controlling means 22. FIG. 28 is a diagram for showing the contents of control of the controlling means 22 in the case where each gray scale level output circuit in FIG. 22 is operated according to the timing chart in FIG. 27. In FIG. 28, the controlling means 22 controls the gray scale level voltage generating means 21 and each gray scale level output circuit according to the external signal, polarity signal and offset correcting operation signal supplied from the outside to the controlling means 22. In this diagram, the gray scale level voltage generating means 21 and the switches 4-1, 4-2, 5-1, 5-2 of each gray scale level output circuit are controlled according to the polarity signal supplied from the outside to the controlling means 22 as in FIG. 25. As for the switches 1 to 3 of each gray scale level output circuit, in the case where the offset correcting operation signal is at an H (High) level, the operations of the first and second output periods for performing the offset correcting operation in FIG. 27 are implemented. And in the case where the offset correcting operation signal is at an L (Low) level, the operations of the third to M-th output periods for performing only a correction voltage output are implemented.

With reference to FIGS. 27 and 22, in the first and second output periods, the same control as the switch control in the first and second output periods in FIG. 26 is performed. Therefore, in the first output period, the capacitor 6-1 is charged with and holds the offset voltage generated to the operational amplifier 10 according to the positive gray scale level voltage inputted to each gray scale level output circuit, and the output of the operational amplifier 10 is corrected by using the offset voltage stored on the capacitor 6-1 so that the output voltage equal to the input voltage can be obtained in each gray scale level output circuit.

Likewise, in the second output period, the capacitor 6-2 is charged with and holds the offset voltage generated to the operational amplifier 10 according to the negative gray scale level voltage inputted to each gray scale level output circuit, and the output of the operational amplifier 10 is corrected by using the offset voltage stored on the capacitor 6-2 so that the output voltage equal to the input voltage can be obtained in each gray scale level output circuit.

Next, of the third to M-th output periods, in the output periods for having the positive gray scale level voltage inputted to each gray scale level output circuit (positive output periods), the capacitor 6-1 stores and holds the charge equivalent to the offset voltage generated to the operational amplifier 10 according to the positive gray scale level voltage in the first output period, and so the output of the operational amplifier 10 can be corrected without performing the offset correcting operation to be performed in the period T01.

Likewise, of the third to M-th output periods, in the output periods for having the negative gray scale level voltage inputted to each gray scale level output circuit (negative output periods), the capacitor 6-2 stores and holds the charge equivalent to the offset voltage generated to the operational amplifier 10 according to the negative gray scale level voltage in the second output period, and so the output of the operational amplifier 10 can be corrected without performing the offset correcting operation to be performed in the period T01.

It is possible, by having the driving circuit shown in FIG. 22 operated by the controlling means 22 according to the operation example in FIG. 27, to perform the offset correcting operation only in the initial first and second output periods of the first to M-th output periods and to output the correction voltage without performing the offset correcting operation in the third to M-th output periods thereafter. Therefore, it is possible to curb the power consumption in the first to M-th output periods compared to the case of following the timing chart in FIG. 26.

Thus, it is possible, by performing the operation according to the timing chart in FIG. 27, to perform high-precision offset correction as with the operation according to FIG. 26 and also to realize the power consumption lower than the case of having the driving circuit shown in FIG. 1 operated according to FIG. 26.

Moreover, the controlling means 22 may also exert control according to the external signal so as to perform the offset correcting operation without fail when turning on the power of the display apparatus using the driving circuit shown in FIG. 22 or when the driving circuit re-operates from a standstill.

Figure 29:
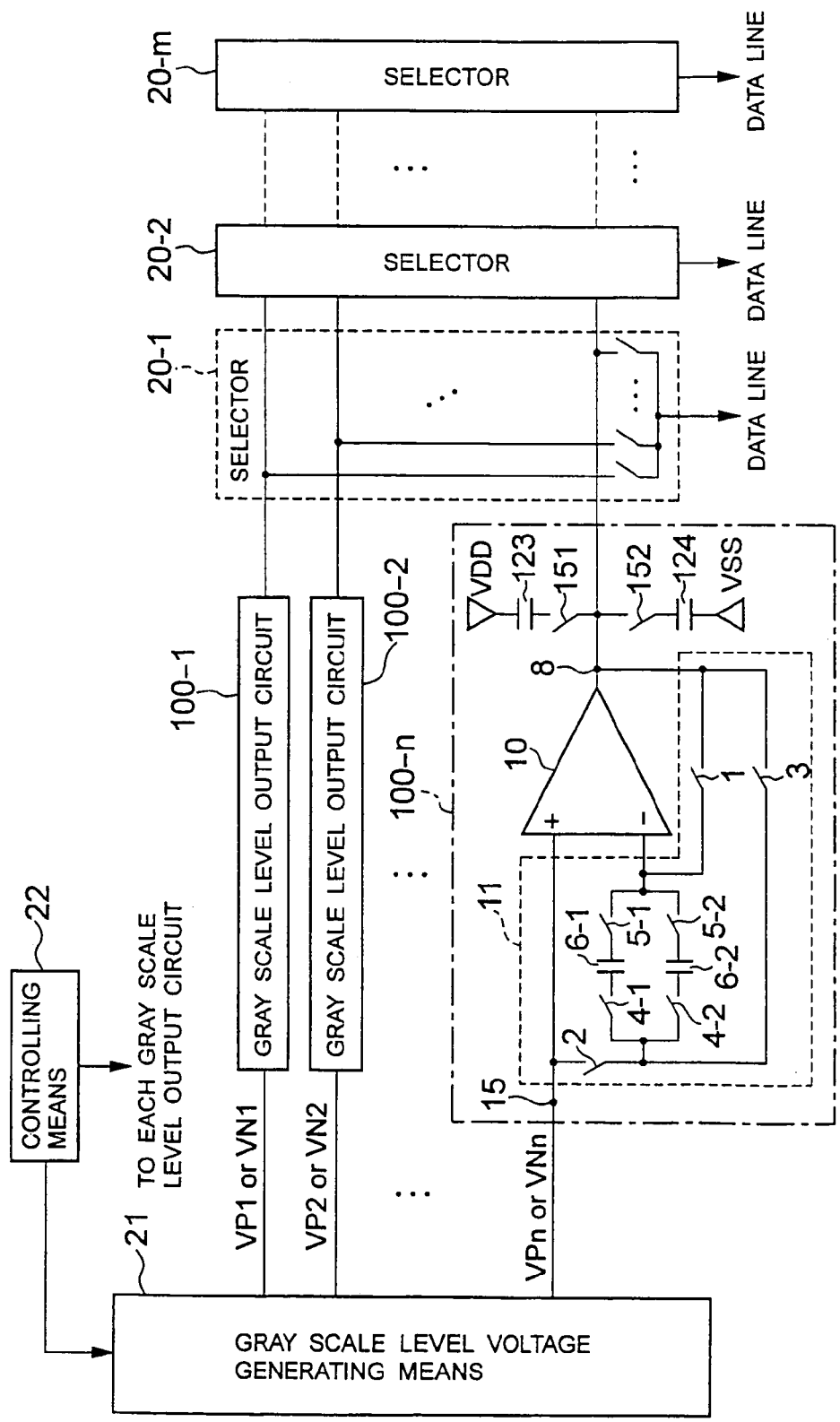
FIG. 29 is a diagram showing the configuration of the driving circuit of the display apparatus according to a third embodiment of the present invention.

FIG. 29 shows the configuration of the driving circuit of the display apparatus according to a third embodiment of the present invention. In FIG. 29, the portions equivalent to those in FIG. 22 are indicated by the same symbols. With reference to FIG. 29, each of the gray scale level output circuits 100-1 to 100-n has capacitors 123, 124 connected to the output terminal 8 via switches 151, 152 respectively and the other ends of the capacitors 123, 124 connected to the high-order side power supply VDD and low-order side power supply VSS respectively. Otherwise, the configuration is the same as that in FIG. 1.

Figure 30:
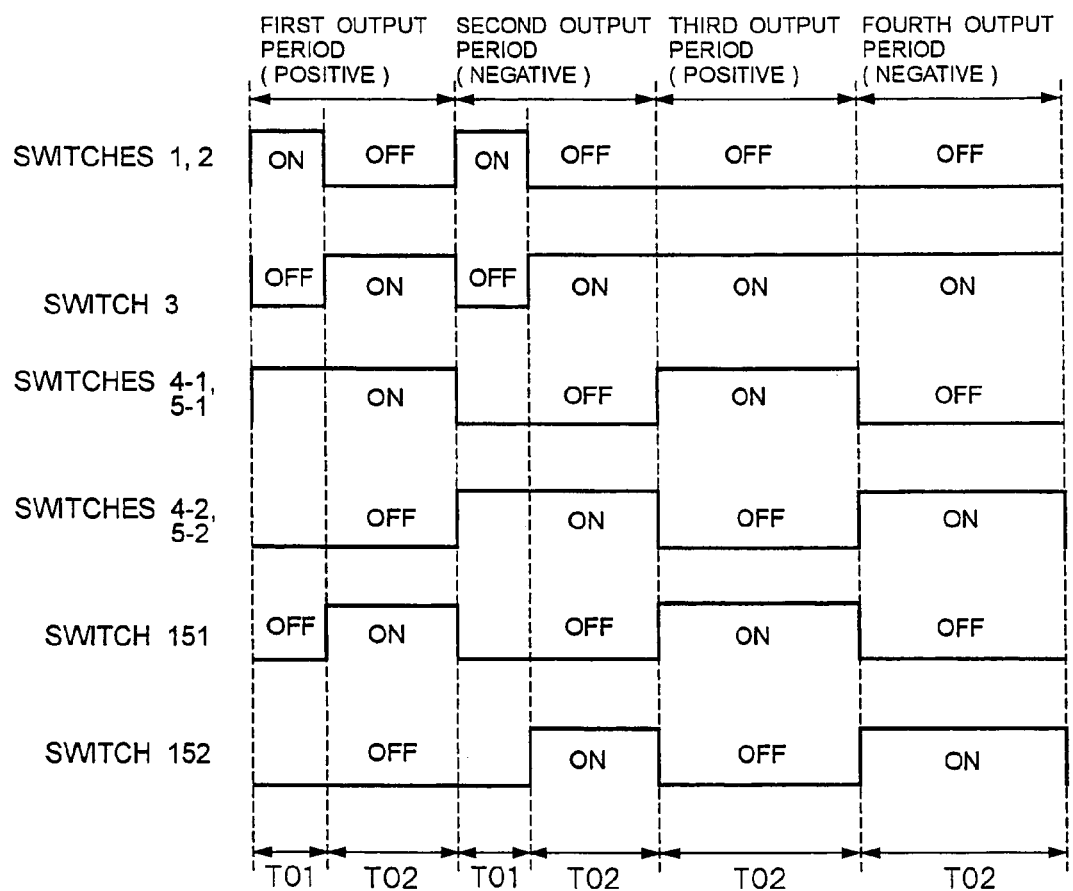
FIG. 30 is a timing chart showing the operation of each gray scale level output circuit in FIG. 29.

Next, the operation of the driving circuit of the display apparatus according to the third embodiment of the present invention will be described by referring to the drawings. FIG. 30 is a timing chart showing the operation of each gray scale level output circuit of the driving circuit shown in FIG. 29. Moreover, the switches 1 to 3 and the switches 4-1, 4-2, 5-1, 5-2, 151 and 152 of each gray scale level output circuit are controlled by the controlling means 22 according to the external signal, polarity signal and offset correcting operation signal inputted to the controlling means 22.

With reference to FIGS. 30 and 29, in the first output period which is positive, the switches 4-1, 5-1 are turned on and the switches 4-2, 5-2 are turned off to select the capacitor 6-1. In the first period T01 of the first output period, both the switches 151 and 152 connected to the output terminal 8 are turned off. In addition, in the first period T01 of the first output period, the switches 1 and 2 are turned on and the switch 3 is turned off so that the output voltage Vout becomes the voltage wherein the input voltage Vin includes the offset voltage Voff. At this time, the potential of one of the terminals of the capacitor 6-1 is the input voltage Vin and the potential of the other terminal is Vout, and the capacitor 6-1 is charged with the charge equivalent to the offset voltage Voff generated to the operational amplifier 10 according to the positive gray scale level voltage which is the input voltage.

Next, in the second period T02 of the first output period, the switches 1 and 2 are turned off and the switch 3 is turned on. At this time, the capacitor 6-1 is directly connected between the inverting input terminal of the operational amplifier 10 and the output terminal 8, and the offset voltage Voff is held by the capacitor 6-1. As the switch 3 is turned on, the offset voltage Voff is applied to the inverting input terminal of the operational amplifier 10 in reference to the potential of the output terminal 8. As a result of this, the output voltage Vout becomes Vout=Vin+Voff−Voff=Vin, and so the offset voltage is set off and the output voltage equal to input voltage Vin can be obtained. In addition, the switch 151 is turned on in the second period T02 of the first output period, and so the capacitor 123 is charged with corrected output voltage on the positive polarity.

Next, in the second output period which is negative, the switches 4-1, 5-1 are turned off and the switches 4-2, 5-2 are turned on to select the capacitor 6-2. The switches 1 to 3 are also controlled in the second output period as in the first period T01 and the second period T02 of the first output period. In addition, both the switches 151 and 152 connected to the output terminal 8 are turned off in the first period T01 of the second output period. And the switch 151 is turned off and the switch 152 is turned on in the second period T02 of the second output period.

The switches are controlled as above so that, also in the second output period, the capacitor 6-2 is charged with the offset voltage generated to the operational amplifier 10 according to the negative gray scale level voltage which is the input voltage, and the offset voltage is set off as in the first output period. In addition, the capacitor 124 is charged with the corrected output voltage on the negative polarity.

Next, in the third output period which is positive, the capacitor 6-1 has the charge equivalent to the offset voltage generated to the operational amplifier 10 in the first output period stored and held therein. For that reason, in the third output period, it is not necessary to perform the offset correcting operation (offset voltage storing operation) performed in the period T01 of the first output period, and the output of the operational amplifier 10 can be corrected by performing only the same operation as in the period T02 of the first output period.

In addition, the capacitor 123 holds the output voltage on the positive polarity charged with in the first output period so that, as the switch 151 is turned on, the charge is supplied form the capacitor 123 to the data line capacity in the initial stage of the third output period. Therefore, change in the voltage of the data line is accelerated.

Next, in the fourth output period which is negative, the capacitor 6-2 has the charge equivalent to the offset voltage generated to the operational amplifier 10 in the second output period stored and held therein. For that reason, in the fourth output period, it is not necessary to perform the offset correcting operation performed in the period T01 of the second output period, and the output of the operational amplifier 10 can be corrected by performing only the same operation as in the period T02 of the second output period.

In addition, the capacitor 124 holds the output voltage on the negative polarity charged with in the second output period so that, as the switch 152 is turned on, the charge is supplied form the capacitor 124 to the data line capacity in the initial stage of the fourth output period. Therefore, the change in the voltage of the data line is accelerated.

In the unshown output periods after the fourth output period, the positive and negative output periods are alternately repeated, and so the output of the operational amplifier 10 can be corrected by alternately performing the operation in the third and fourth output periods according to the polarity. In addition, the charge held by the capacitor 123 or 124 is supplied to the data line capacity in the initial stage of each output period, and so the change in the voltage of the data line is accelerated.

Thus, in the driving circuit shown in FIG. 29, the capacitors 123, 124 are connected to the output terminal 8 of each gray scale level output circuit via the switches 151, 152 so that, once the capacitor 123 or 124 holds the corrected output voltage, the charge is supplied from the capacitor 123 or 124 to the data line in the output periods thereafter, and so the change in the output voltage is accelerated. For that reason, it is possible to curb a driving capability by lowering driving currents of the operational amplifier 10, and thus the power consumption can be rendered lower than that of the driving circuit shown in FIG. 22.

Figure 31:
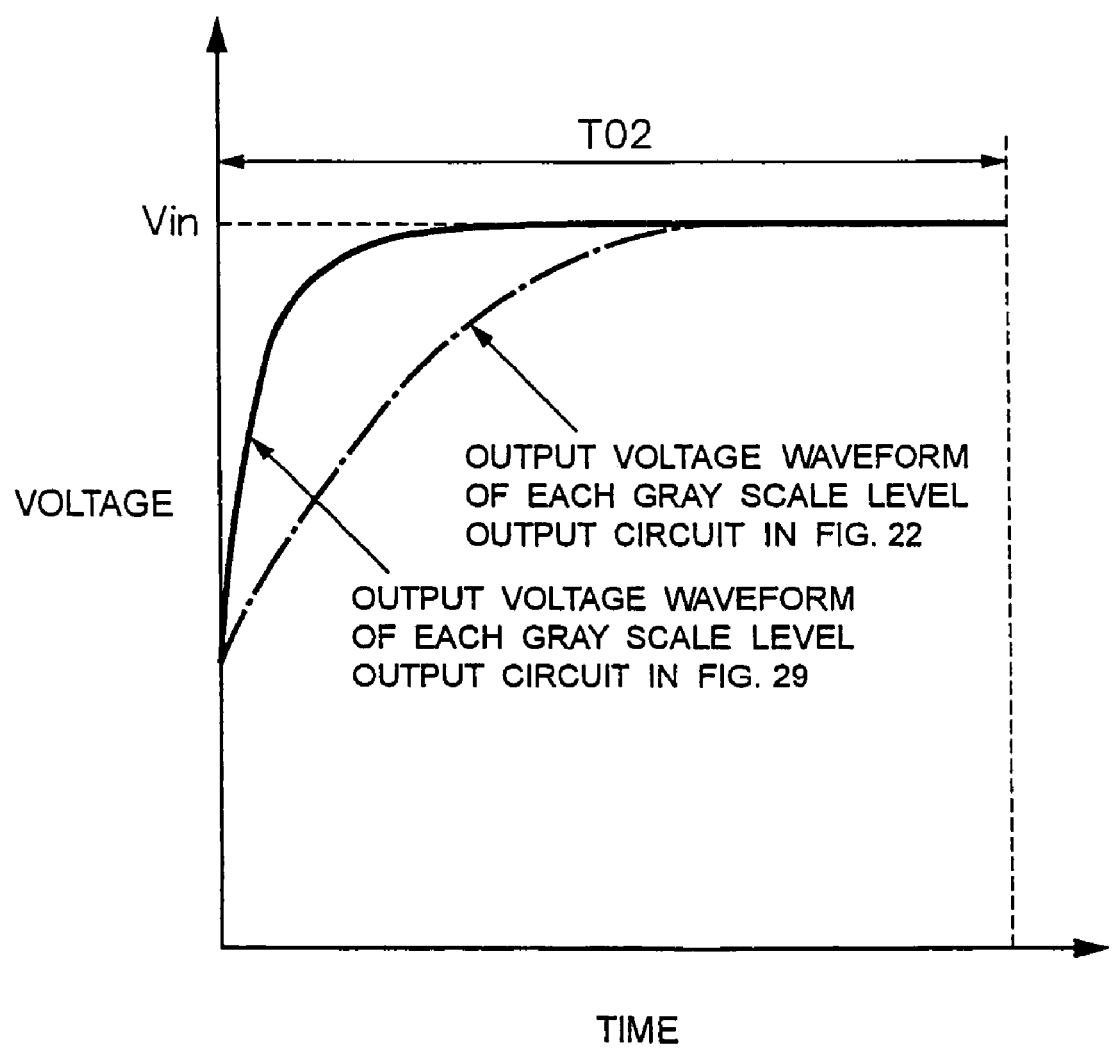
FIG. 31 is a diagram showing the output voltage waveform of each gray scale level output circuit in FIG. 29 and the output voltage waveform of each gray scale level output circuit in FIG. 22.

FIG. 31 is a diagram showing an output voltage waveform of each gray scale level output circuit of the driving circuit shown in FIG. 29 and an output voltage waveform of each gray scale level output circuit of the driving circuit shown in FIG. 22. Moreover, the output voltage waveforms shown in FIG. 31 are the waveforms in the period T02 for performing the correction voltage output. As shown in FIG. 31, in the initial stage of the period T02, the output voltage of each gray scale level output circuit in FIG. 29 changes at higher speed than the output voltage of each gray scale level output circuit in FIG. 22 because the charge is supplied from the capacitor 123 or 124 to the data line.

As described above, according to the third embodiment of the present invention, it is possible to realize the driving circuit of the display apparatus capable of the lower power consumption and high-precision output by using the gray scale level output circuit having the low-power-consumption and high-precision offset correcting function as in the second embodiment of the present invention. In addition, the capacitor 123, 124 are connected to the output terminal 8 of each gray scale level output circuit via the switches 151, 152 so that, once the capacitor 123 or 124 holds the corrected output voltage, the charge is supplied from the capacitor 123 or 124 to the data line in the output periods thereafter, and so the change in the output voltage becomes faster than that in the second embodiment. For that reason, it is possible to curb the driving capability of the operational amplifier 10 by lowering driving currents thereof, and thus the power consumption can be rendered lower than that in the second embodiment.

Furthermore, because of the configuration wherein the gray scale level output circuit is provided to each gray scale level, it is possible, by applying the driving circuit according to the third embodiment of the present invention to the driving circuit of the liquid crystal display having the number of the gray scale levels smaller than the number of the outputs, to reduce the number of the output circuits further than that in the configuration shown in FIG. 50 for providing the output circuit to each data line. Thus, it is possible to save the area of the circuits and realize reduction in costs.

Figure 32:
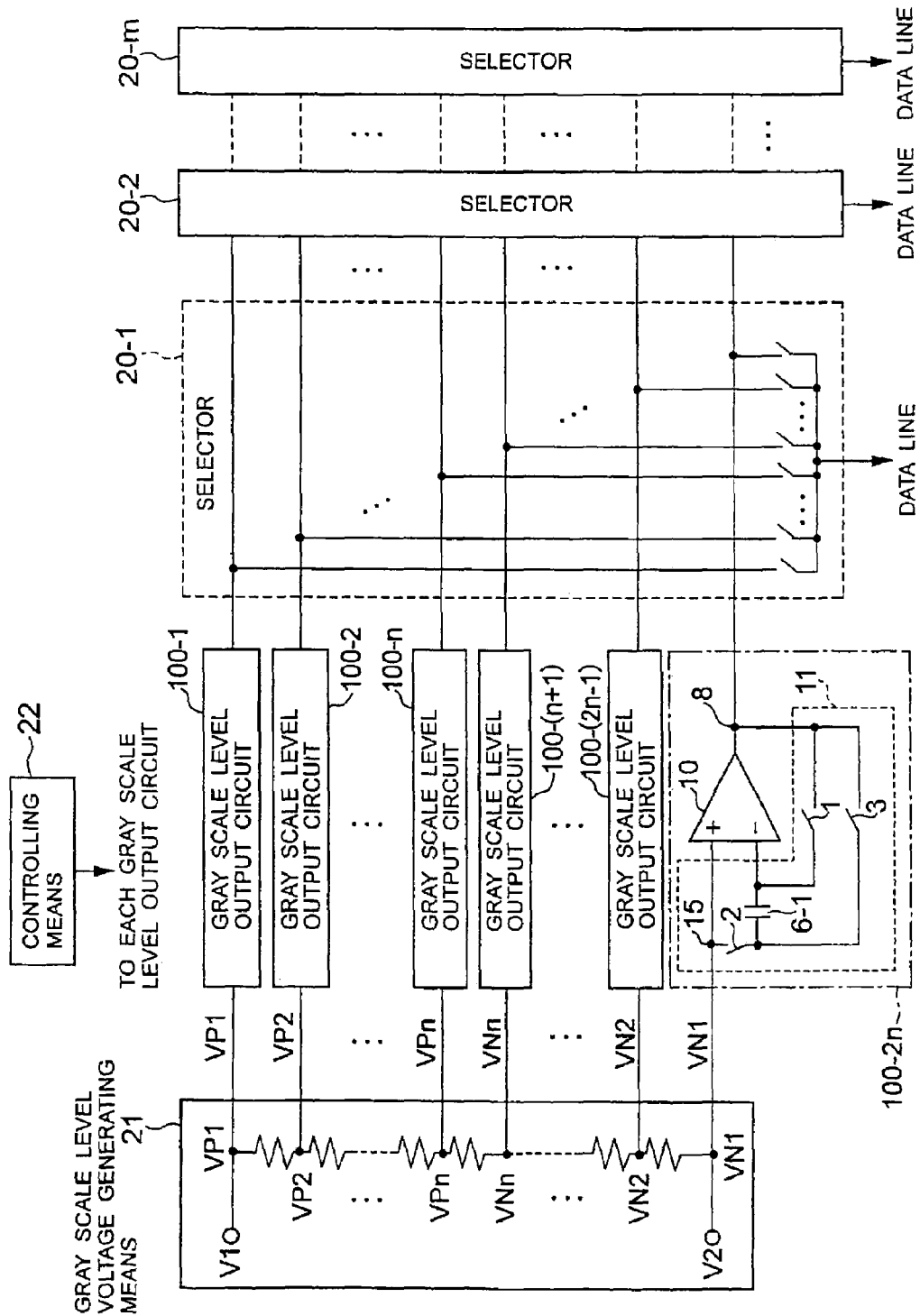
FIG. 32 is a diagram showing the configuration of the driving circuit of the display apparatus according to a fourth embodiment of the present invention.

FIG. 32 is a diagram showing the configuration of the driving circuit of the display apparatus according to a fourth embodiment of the present invention, where the same portions as those in FIG. 22 are indicated by the same symbols. The driving circuit shown in FIG. 32 has adopted the common DC driving method. The gray scale level voltage generating means 21 shown in FIG. 24A has the switches 11-1 to 11-n and the switches 12-1 to 12-n, and these switches were controlled so as to output the positive gray scale level voltages VP1 to VPn or the negative gray scale level voltages VN1 to VNn to the gray scale level output circuits 100-1 to 100-n shown in FIG. 22. However, the gray scale level voltage generating means 21 shown in FIG. 32 has no switch, and so it outputs the positive gray scale level voltages VP1 to VPn and the negative gray scale level voltages VN1 to VNn.

Thus, the driving circuit shown in FIG. 32 has 2n pieces of the gray scale level output circuits 100-1 to 100-2n provided to the positive and negative gray scale level voltages respectively. In addition, in each of the gray scale level output circuits 100-1 to 100-2n, a gray scale level voltage level of the input signals inputted from the gray scale level voltage generating means 21 shown in FIG. 32 is fixed so that it is sufficient to provide to each gray scale level output circuit shown in FIG. 32 one capacitor 6-1 as the capacitor for storing the offset voltage generated to the operational amplifier 10. Each of the selectors 20-1 to 20-m shown in FIG. 32 selects the signal necessary for driving, of the output signals outputted from the gray scale level output circuits 100-1 to 100-2n, and outputs it to the data line. Moreover, the switches 1 to 3 of each gray scale level output circuit are controlled by the controlling means 22.

Figure 33:
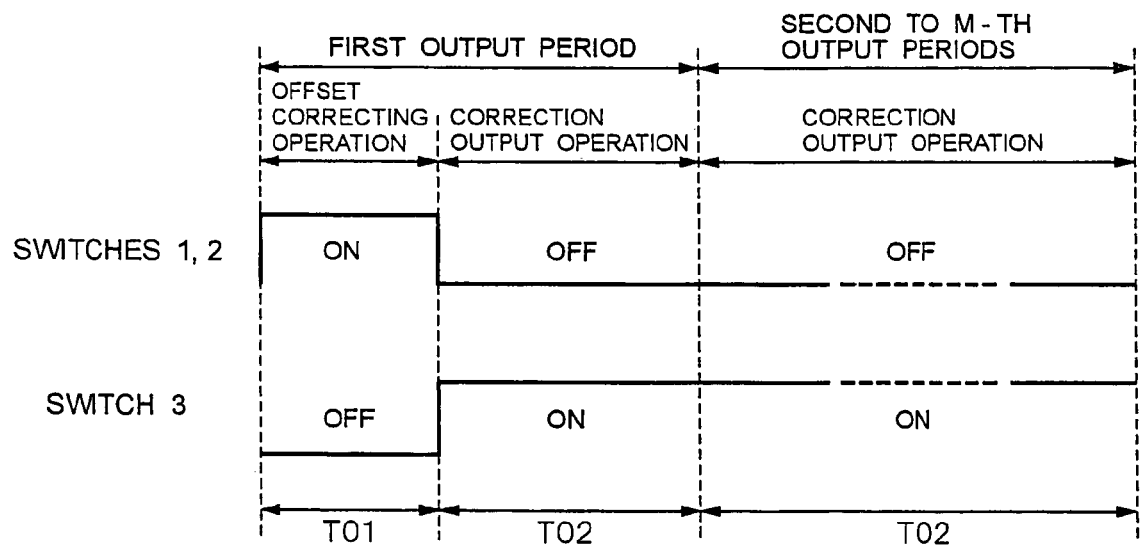
FIG. 33 is a timing chart showing the operation of each gray scale level output circuit in FIG. 32.

Next, the operation of the driving circuit of the display apparatus according to the fourth embodiment of the present invention will be described by referring to the drawings. FIG. 33 is a timing chart showing the operation of each gray scale level output circuit of the driving circuit in FIG. 32. With reference to FIGS. 33 and 32, first, in the first term T01 of the first output period, the switches 1 and 2 are turned on and the switch 3 is turned off, and the output voltage Vout of the operational amplifier 10 becomes Vin+Voff wherein Vin includes the offset voltage Voff. At this time, a potential of one terminal of the capacitor 6-1 becomes the input voltage Vin, the potential of the other terminal becomes Vout, and the capacitor 6-1 is charged with the charge equivalent to the offset voltage Voff generated to the operational amplifier 10 according to the input voltage Vin.

In the second term T02 of the first output period, the switches 1 and 2 are turned off and the switch 3 is turned on. At this time, the capacitor 6-1 is directly connected between the inverting input terminal of the operational amplifier 10 and the output terminal 8, and the offset voltage Voff is held by the capacitor 6-1. As the switch 3 is turned on, the offset voltage Voff is applied to the inverting input terminal of the operational amplifier 10 in reference to the potential of the output terminal 8. As a result of this, the output voltage Vout becomes Vout=Vin+Voff−Voff=Vin, and so the offset voltage is set off and the output voltage equal to input voltage Vin can be obtained.

In each of the gray scale level output circuits, the gray scale level voltages inputted in the first output period and those inputted in each of the second to M-th output periods are the same, and the charge equivalent to the offset voltage stored in the first output period is held by the capacitor 6-1 in each of the second to M-th output periods. Therefore, in each of the second to M-th output periods, it is possible to correct the output of the operational amplifier 10 by performing the operation of the term T02 without performing the operation of the term T01.

According to the fourth embodiment of the present invention, the gray scale level voltage inputted to each gray scale level output circuit is fixed. Therefore, once the capacitor stores and holds the offset voltage, it is not necessary to charge and discharge the capacitor in the output periods thereafter, and it is sufficient to replenish the charge changed due to the influence of the capacity coupling occurring on the switching. For that reason, the capacitor requires little power consumption due to the charge and discharge. In addition, there is little power consumption due to the charge and discharge once the capacitor stores the offset voltage, and so the output precision can be enhanced without increasing the power consumption even if the capacity of the capacitor is increased in order to curb the influence of the capacity coupling occurring on the switching.

Figure 34:
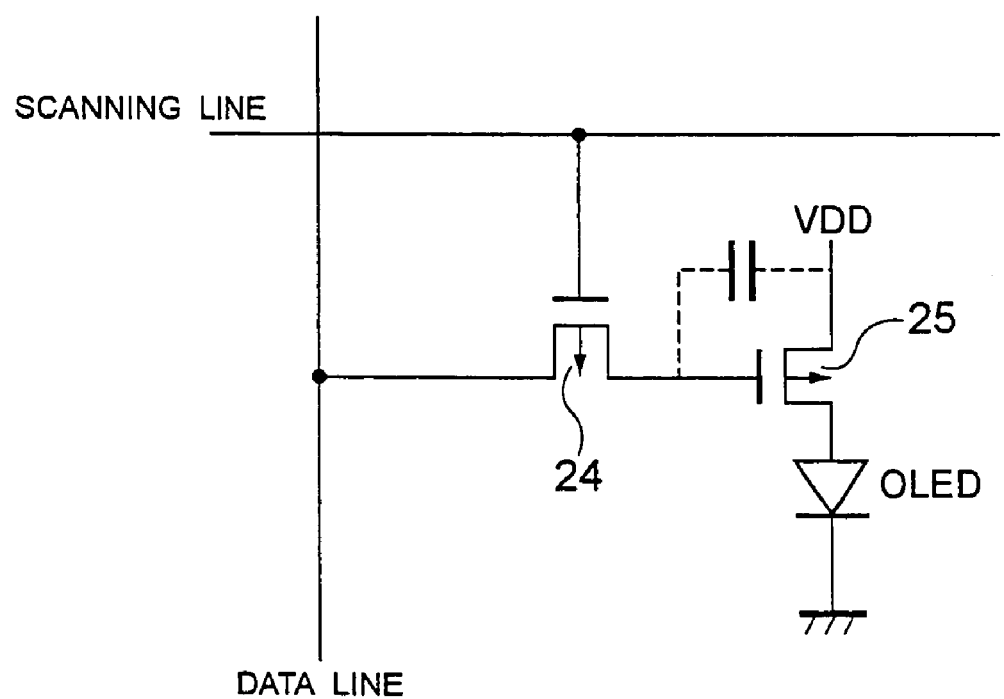
FIG. 34 is a diagram showing the simplest pixel configuration of an active-matrix type organic EL display apparatus.

FIG. 34 is a diagram showing the simplest pixel configuration of an active-matrix type organic EL display apparatus. The driving circuit having same configuration as that of the driving circuit shown in FIG. 32 is also applicable to the active-matrix type organic EL display apparatus having the pixel configuration shown in FIG. 34. In FIG. 34, the gray scale level voltage is applied to the gate of a transistor 25 from the data line via a transistor 24 and is held thereby, so that the current modulated by the gray scale level voltage flows to an organic light-emitting diode OLED constituting the pixel via the transistor 25, and light is emitted by an mount corresponding to the gray scale level voltage (current modulation method). The driving circuit having the same configuration as that shown in FIG. 32 is applicable as the driving circuit for supplying the gray scale level voltage to the gate of the transistor 25 of each pixel.

Unlike the liquid crystal display, the organic EL display apparatus does not need the inversion of the polarity. Consequently, the gray scale level voltages of the input signals inputted from the gray scale level voltage generating means to the gray scale level output circuits are fixed as with the fourth embodiment of the present invention. Therefore, it is sufficient to provide to each gray scale level output circuit one capacitor for storing the offset voltage generated to the operational amplifier as with the fourth embodiment of the present invention.

Moreover, a detailed description of the basic configuration of the active-matrix type organic EL display apparatus will be omitted since it is described in "4.2 Design of an Improved Pixel for a Polysilicon Active-Matrix Organic LED Display" by R. M. A. Dawson et al. SID 98 DIGEST, pp. 11 to 14.

As described above, according to the fourth embodiment of the present invention, it is possible, by using the gray scale level output circuits of the low power consumption and high-precision offset correcting function, to realize the driving circuit of the display apparatus capable of the low power consumption and high-precision output. In addition, according to the fourth embodiment of the present invention, the gray scale level output circuit is provided for each gray scale level so that, if the driving circuit according to the fourth embodiment is applied to the driving circuit of the display apparatus of which number of gray scale levels is smaller than the number of outputs, the number of output circuits can be further reduced compared to the configuration for providing the output circuit for each data line shown in FIG. 50. Thus, the area of the circuits can be reduced and the lower costs can be realized.

To describe the above second to fourth embodiments of the present invention further in detail, a description will be given by referring to the drawings as to the driving circuit of the display apparatus, as a representative, wherein each gray scale level output circuit is constituted by using the operational amplifier.

Figure 35:
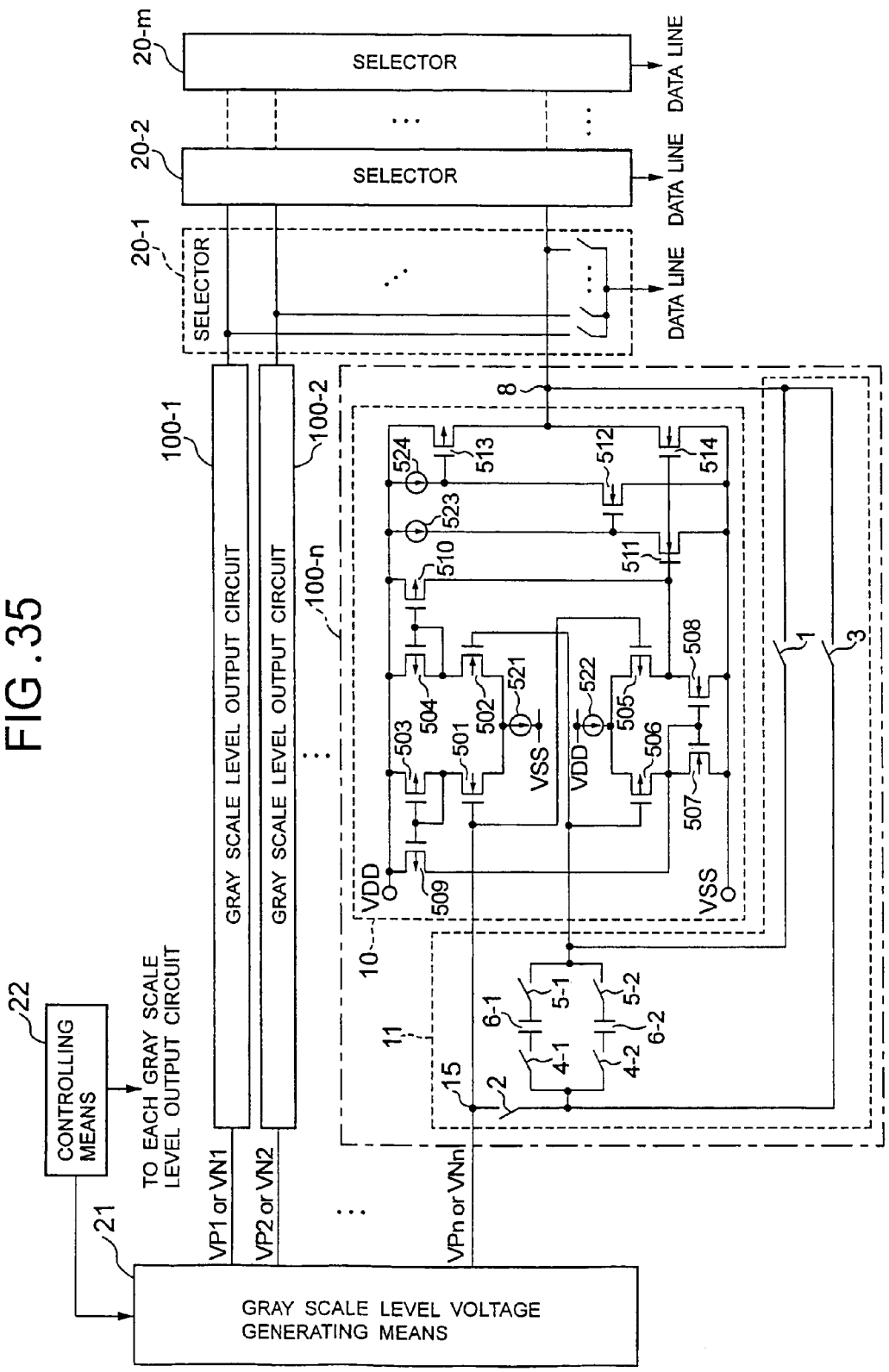
FIG. 35 is a diagram showing a configuration of the driving circuit in case of applying the operational amplifier in FIG. 18 to each gray scale level output circuit of the driving circuit in FIG. 22.

FIG. 35 is a diagram showing the configuration of the driving circuit in case of applying the operational amplifier shown in FIG. 18 to the operational amplifier 10 of each gray scale level output circuit of the driving circuit shown in FIG. 22. As already described by using FIG. 18, it is difficult for the operational amplifier shown in FIG. 18 to maintain the high-precision output under the condition of sufficiently low power supply voltage.

On the other hand, as for the driving circuit shown in FIG. 35, the controlling means 22 controls the switch groups 4-1, 4-2, 5-1, 5-2 and the switches 1 to 3 according to the polarity to have the offset voltage according to the input voltage level stored and held by the capacitor corresponding to the input voltage level one for one so as to correct the offset voltage. For that reason, even in the case where the power supply voltage is sufficiently low, the output of the operational amplifier 10 can be corrected with high precision so that each gray scale level output circuit shown in FIG. 35 is capable of the high-precision output.

In addition, there is little power consumption due to the charge and discharge of the charge in the offset correcting operation, and so the power consumption by the offset correcting operation can be curbed to the minimum. Therefore, the high output precision, low power consumption and wide input and output range can be realized as to each of the gray scale level output circuits 100-1 to 100-n shown in FIG. 35.

In addition, once the offset voltage is stored in the capacitor, there is little power consumption due to the charge and discharge, and so the output precision can be enhanced without increasing the power consumption even if the capacity of the capacitor is increased in order to curb the influence of the capacity coupling occurring on switching.

Furthermore, the output circuit is provided for each gray scale level so that, if the driving circuit shown in FIG. 35 is applied to the driving circuit of the liquid crystal display apparatus of which number of gray scale levels is smaller than the number of outputs, the number of the output circuits can be further reduced compared to the configuration for providing the output circuit for each data line shown in FIG. 50. Thus, the area of the circuits can be reduced and the lower costs can be realized.

Moreover, it is a matter of course that the operational amplifier shown in FIG. 18 is applicable not only to the operational amplifier of each gray scale level output circuit of the driving circuit shown in FIG. 22 but also to the operational amplifier of each gray scale level output circuit of the driving circuits shown in FIGS. 29 and 32. In addition, it is a matter of course that the operational amplifier of each gray scale level output circuit of the driving circuits shown in FIGS. 22, 29 and 32 is not limited to the operational amplifier shown in FIG. 18, but other operational amplifiers may also be used.

As for the driving circuits shown in FIGS. 22, 29 and 32, it is necessary to set the term T01 for performing the offset correcting operation (offset voltage storing operation) as a sufficient period for stabilizing the output voltage by driving both the data line load and capacitor. Thus, a switch is provided to the output terminal 8 of each gray scale level output circuit, the switch is turned off in the term T01 for performing the offset correcting operation to separate the load from each gray scale level output circuit, and the switch is turned on in the term T02 for performing the correction voltage output to connect each gray scale level output circuit to the load. As a result, in the term T01, it is necessary only to have the offset voltage stored by the capacitor without necessity of driving the data line load, so that it is possible to shorten the term T01.

Next, the liquid crystal display apparatus using the driving circuit of the display apparatus according to the second to fourth embodiments of the present invention will be described by using the drawings.

Figure 36:
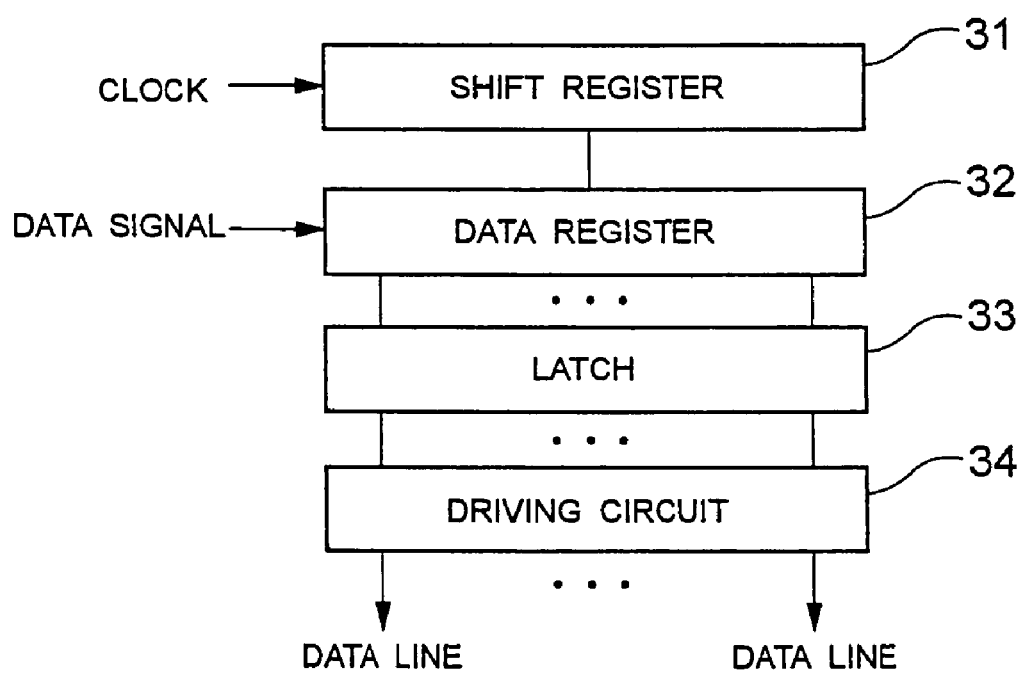
FIG. 36 is a diagram showing the configuration of a source driver of the liquid crystal display using the driving circuit of the display apparatus according to the second to fourth embodiments of the present invention.

FIG. 36 is a diagram showing the configuration of a source driver of the liquid crystal display apparatus using the driving circuit of the display apparatus according to the second to fourth embodiments of the present invention. The source driver shown in FIG. 36 has a digital signal according to the gray scale level inputted thereto and has the digital signals of all the outputs stored in a register 32 in order in synchronization with a clock. Thereafter, all the data is latched by a latch 33, and the digital signals are converted into analog signals corresponding to a voltage-transmittance characteristic of the liquid crystal through a driving circuit 34 which is the driving circuit according to the second to fourth embodiments of the present invention, and are outputted to the data lines. It is possible, by incorporating the driving circuit of the display apparatus according to the second to fourth embodiments into the source driver of the liquid crystal display apparatus, to realize the source driver capable of the lower power consumption and high-precision output.

Figure 37:
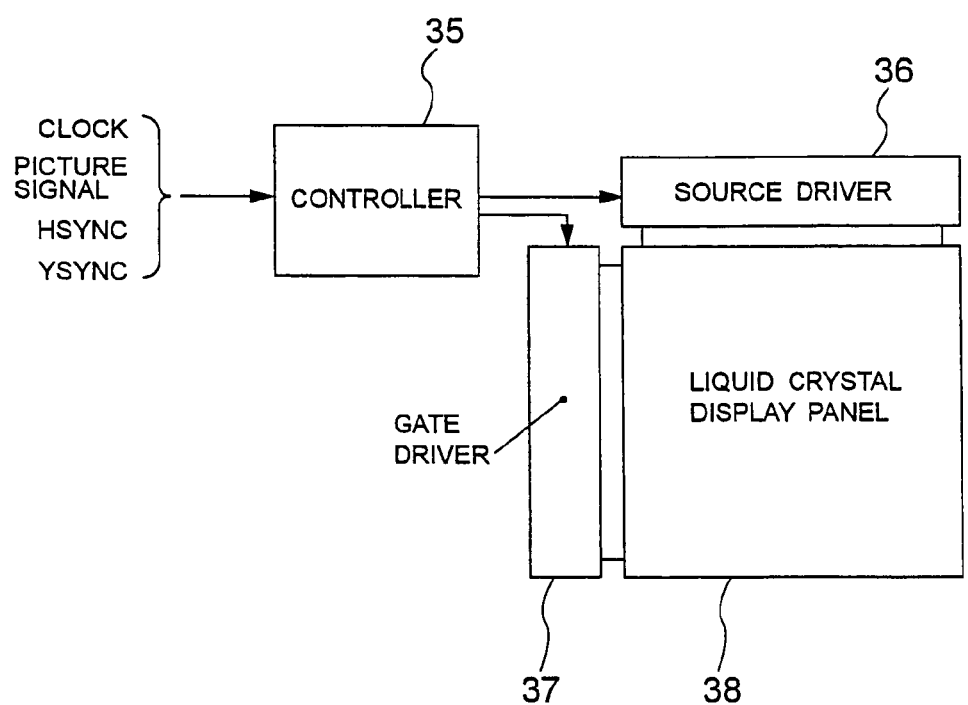
FIG. 37 is a diagram showing the configuration of the liquid crystal display of the active-matrix driving method incorporating the source driver using the driving circuit of the display apparatus according to the second to fourth embodiments of the present invention.

FIG. 37 is a diagram showing the configuration of the liquid crystal display apparatus of the active-matrix driving method incorporating the source driver using the driving circuit of the display apparatus according to the second to fourth embodiments of the present invention. In the liquid crystal display apparatus of the active-matrix driving method shown in FIG. 37, a controller 35 receives a picture signal, clock, vertical and horizontal synchronization signals to control a source driver 36 for outputting the signal of the gray scale level voltage and a gate driver 37 for outputting the scan signal. It is possible, by using the source driver in FIG. 36 as the source driver 36 of the liquid crystal display apparatus, to realize the liquid crystal display of the lower power consumption and high display quality.

Next, a description will be given as to a portable electronic apparatus using the driving circuit of the display apparatus according to the second to fourth embodiments of the present invention.

As for usage of the active-matrix type display apparatus using the driving circuit of the display apparatus according to the second to fourth embodiments of the present invention, the portable electronic apparatuses, and in particular, a handheld terminal represented by the portable telephone can be named. Hereafter, a description will be given by using the drawings as to the portable telephone as an example of the handheld terminal incorporating the active-matrix type display apparatus using the driving circuit of the display apparatus according to the second to fourth embodiments of the present invention.

Figure 38:
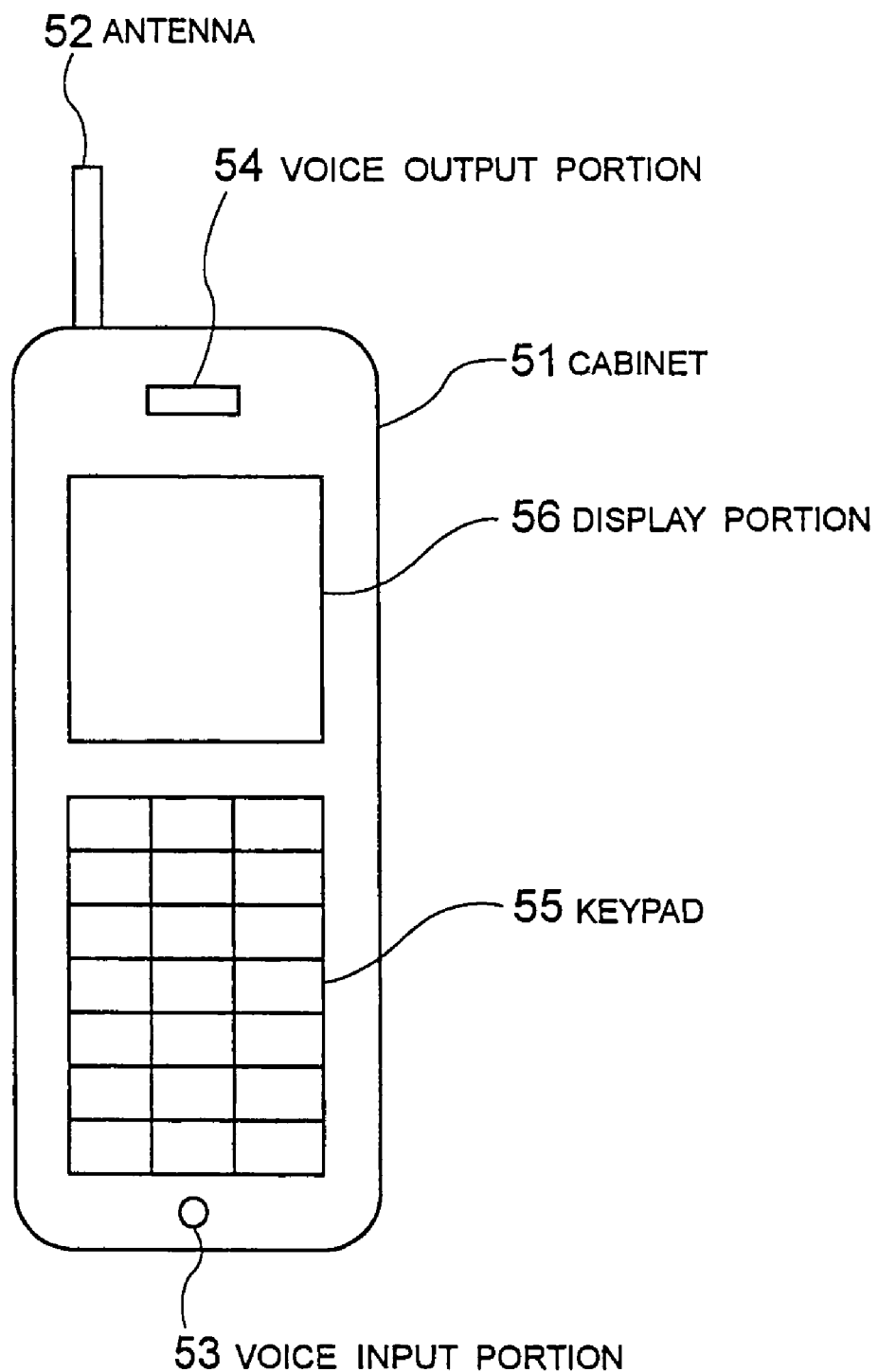
FIG. 38 is a diagram showing a portable telephone incorporating the active-matrix type display apparatus using the driving circuit of the display apparatus according to the second to fourth embodiments of the present invention.

FIG. 38 is a diagram showing the portable telephone incorporating the active-matrix type display apparatus using the driving circuit of the display apparatus according to the second to fourth embodiments of the present invention. In FIG. 38, the portable telephone is comprised of a cabinet 51, an antenna 52, a voice input portion 53, a voice output portion 54, a keypad 55 and a display portion 56. In the present invention, the display apparatus in FIG. 37 can be used for a display panel wherein the active-matrix type display apparatus is used. It is possible, by using the display apparatus in FIG. 37 for the display portion 56 of the portable telephone, to realize the portable telephone of the lower power consumption and high display quality.

Figure 39:
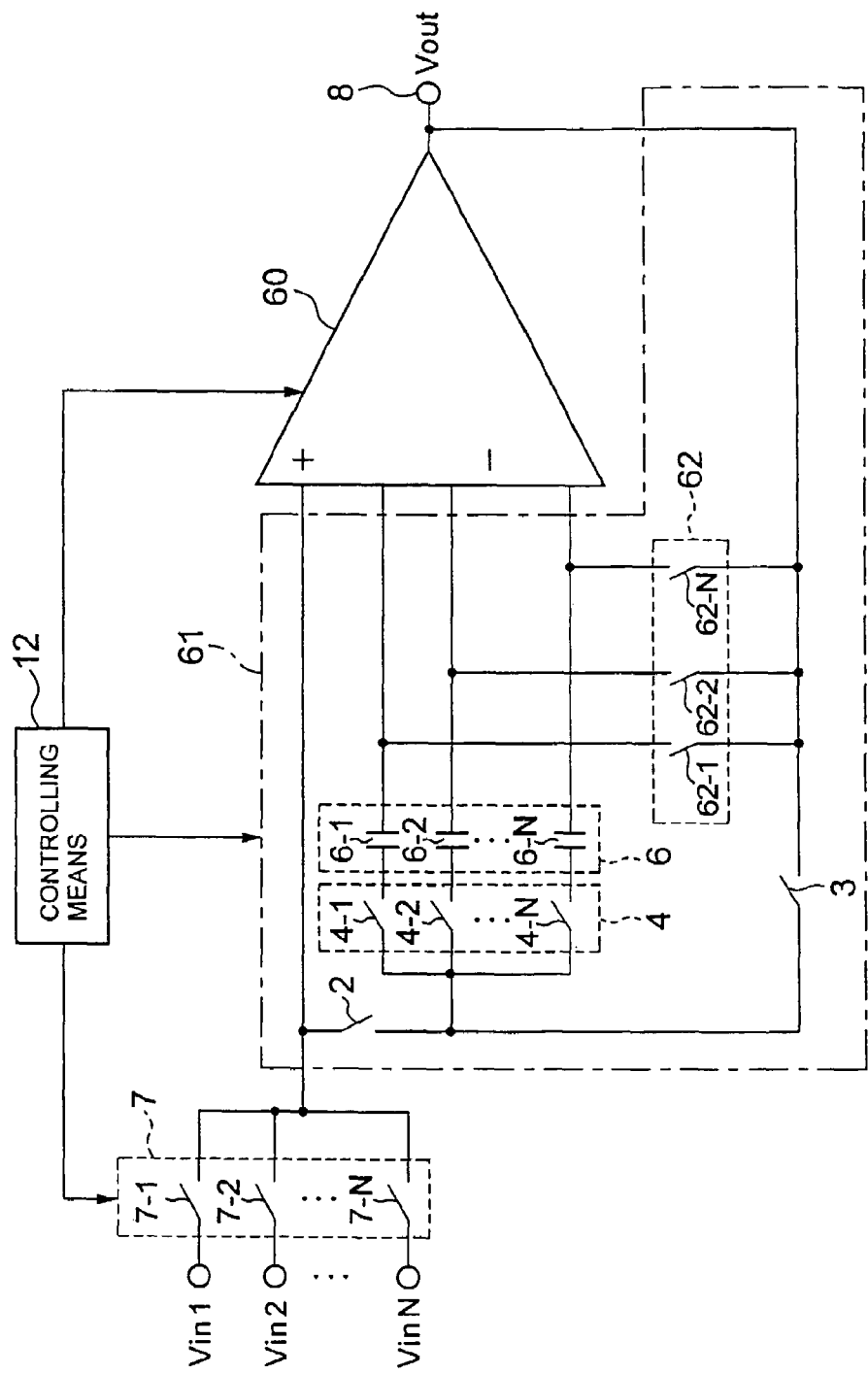
FIG. 39 is a diagram showing a modified example of the amplifier circuit shown in FIG. 1.

FIG. 39 is a diagram showing a modified example of the amplifier circuit shown in FIG. 1. It is possible to obtain a higher-precision corrected output voltage in the amplifier circuit shown in FIG. 39 than in the amplifier circuit in FIG. 1. The amplifier circuit shown in FIG. 39 is different from that shown in FIG. 1 in that a plurality of the inverting input terminals which are the same number as the capacitors in the capacitor group 6 are provided to an operational amplifier 60, and the plurality of the inverting input terminals are directly connected to the plurality of capacitors 6-1 to 6-N. The plurality of the inverting input terminals are connected to the output terminal via a switch group 62 (switches 62-1 to 62-N). Hereafter, the amplifier circuit in FIG. 39 will be described by referring to the drawings as to an exemplary case of using the operational amplifier shown in FIG. 7 as the operational amplifier 60 of the amplifier circuit in FIG. 39.

Figure 40:
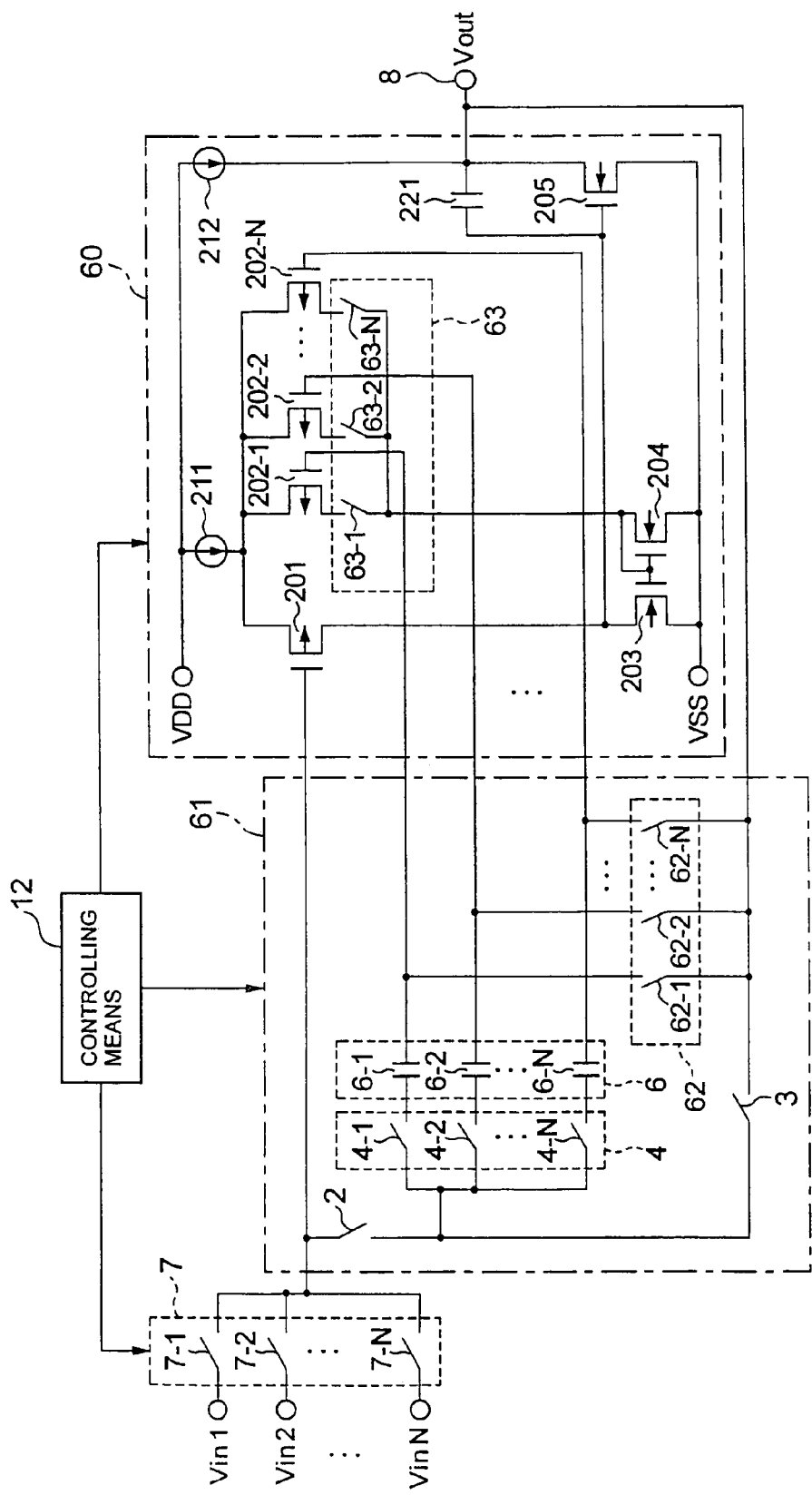
FIG. 40 is a diagram showing the configuration of the amplifier circuit in the case where the operational amplifier shown in FIG. 7 is used as the operational amplifier 60 of the amplifier circuit shown in FIG. 39.
Figure 41:
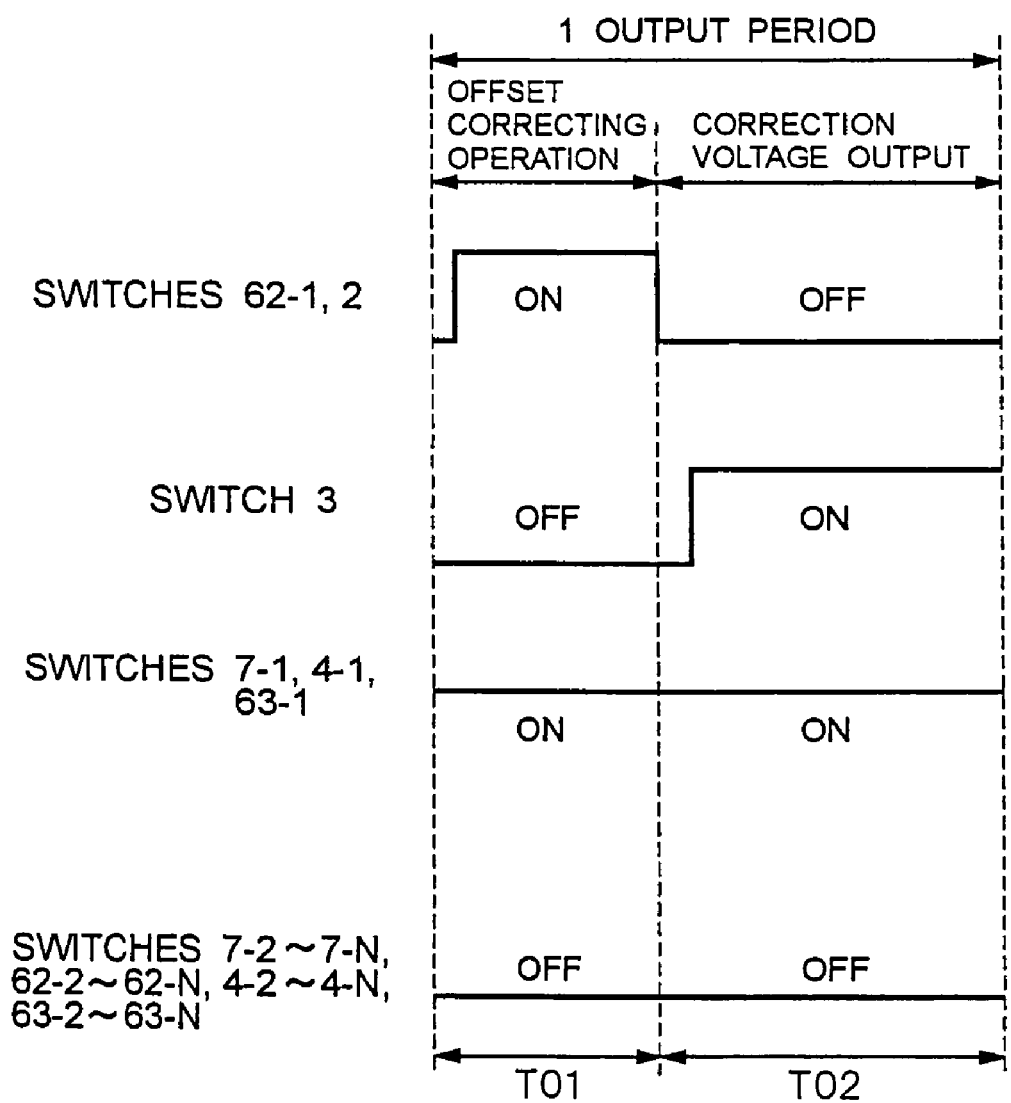
FIG. 41 is a timing chart showing an operation example of the amplifier circuit shown in FIG. 40.

FIG. 40 is a diagram showing the configuration of the amplifier circuit in the case where the operational amplifier shown in FIG. 7 is used as the operational amplifier 60 of the amplifier circuit shown in FIG. 39. As for the operational amplifier 60 in FIG. 40, a plurality of inverting input transistors 202-1 to 202-N corresponding to a plurality of inverting input terminals are provided therein in parallel to one non-inverting input transistor 201. In addition, each gate of the inverting input transistors 202-1 to 202-N is directly connected to the capacitor group 6, each drain is connected in common, and each source is connected in common via a switch group 63 (switches 63-1 to 63-N). FIG. 41 is a timing chart showing an operation example of the amplifier circuit shown in FIG. 40, which is the switching operation in the case where the voltage level of the input signal in one output period is Vin1. Moreover, the switching operation is controlled by the controlling means 12. Hereafter, the operation of the amplifier circuit in FIG. 40 will be described by using FIG. 41.

First, in the first term T01 in one output period in FIG. 41, the switches 7-1, 62-1, 2, 4-1 and 63-1 are turned on and the switches 7-2 to 7-N, 62-2 to 62-N, 4-2 to 4-N, 63-2 to 63-N, and 3 are turned off. Thus, the transistors 201 and 202-1 operate as the differential pair, and the capacitor 6-1 is charged with a charge equivalent to the offset voltage Voff generated to the operational amplifier 60 in the case where the input voltage is Vin1.

Next, in the second term T02 in the output period, the switches 62-1 and 2 are turned off and the switch 3 is turned on while the switches 7-1, 4-1 and 63-1 remain on and the switches 7-2 to 7-N, 62-2 to 62-N, 4-2 to 4-N and 63-2 to 63-N remain off, and so the offset voltage is set off and the output voltage Vout becomes the voltage equal to the input voltage Vin1 so that high-precision output voltage can be obtained.

While the above described the case where the input voltage in one output period is Vin1, it is also possible, in the case where the input voltage is Vin2 to VinN, to perform the high-precision offset correcting operation as in the case where the input voltage is Vin1. In addition, as the amplifier circuit in FIG. 40 can have the offset voltages according to a plurality of input voltages stored and held by the different capacitors, once the offset voltages are stored and held by the capacitors corresponding to the input voltages, there is no need to charge and discharge the capacitors in one output period in which the same input voltage is inputted next, and it is sufficient to replenish the charge changed due to the influence of the capacity coupling occurring on the switching. For that reason, the capacitor requires little power consumption due to the charge and discharge, and thus lower power consumption is possible. Furthermore, as for the amplifier circuit in FIG. 40, once the offset voltage is stored and held by the capacitor corresponding to the input voltage, it is possible to correct the output of the operational amplifier by using the offset voltage already held by the capacitor in the one output period in which the same input voltage is inputted next. Thus, it is possible, in the amplifier circuit in FIG. 39, to obtain the same effect as in the amplifier circuit in FIG. 1.

Next, differences between the amplifier circuit shown in FIG. 39 and that shown in FIG. 1 will be described. As for the amplifier circuit in FIG. 1, in the case of correcting the output of the operational amplifier by using the offset voltage already held by the capacitor, the capacitor corresponding to the input voltage level is connected to the inverting input terminal via the switch group 6 if the input voltage level changes. Although there exists a parasitic capacity such as a gate capacity in the inverting input terminal, this parasitic capacity is charged at a voltage corresponding to the input voltage level of the previous output period. For that reason, there are the cases where, if the input voltage level changes and the inverting input terminal is connected to a different capacitor via the switch group 6, the charge held by the capacitor changes so that the precision of the corrected output voltage lowers.

On the other hand, the amplifier circuit shown in FIG. 39 has a plurality of the inverting input terminals which are the same number as the capacitors in the capacitor group 6 (capacitors 6-1 to 6-N) provided to the operational amplifier 60, and the plurality of the inverting input terminals are directly connected to the capacitors 6-1 to 6-N respectively. For this reason, the charge held by the capacitor does not change, and so it is possible to obtain a higher-precision corrected output voltage than that in the amplifier circuit in FIG. 1.

Moreover, while the description was given by taking as an example the amplifier circuit in FIG. 40 using the operational amplifier shown in FIG. 7 as the operational amplifier 60 of the amplifier circuit in FIG. 39, other operational amplifiers are also applicable by providing via the switch group 63 a plurality of transistors constituting the differential pair of the operational amplifier of which gates are connected to the respective inverting input terminals corresponding to a plurality of the inverting input terminals.

Figure 42:
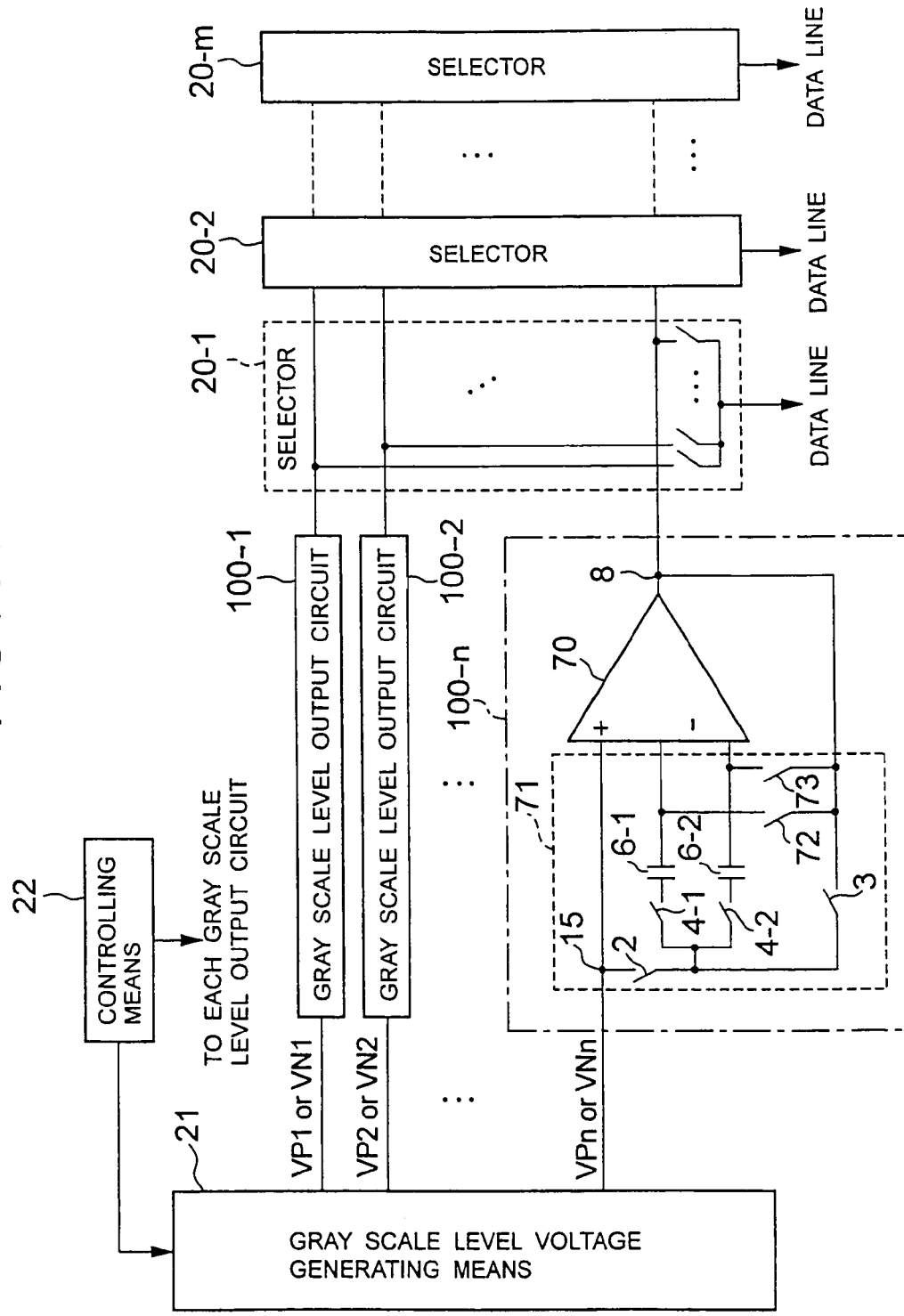
FIG. 42 is a diagram showing a modified example of the driving circuit of the display apparatus shown in FIG. 22.

FIG. 42 is a diagram showing a modified example of the driving circuit of the display apparatus shown in FIG. 22. Each of the gray scale level output circuits 100-1 to 100-n in the driving circuit of the display apparatus shown in FIG. 42 has the circuit input terminal 15, circuit output terminal 8, operational amplifier 70 having a non-inverting input terminal and two inverting input terminals and an offset correction circuit 71. The input terminal 15 has a positive or negative gray scale level voltage outputted from the gray scale level voltage generating means 21 inputted thereto. The operational amplifier 70 of the voltage follower outputs to the output terminal 8 a voltage equal to the positive or negative gray scale level voltage outputted from the gray scale level voltage generating means 21.

The offset correction circuit 71 is comprised of the switches 2, 3 and 72, 73, the capacitors 6-1, 6-2 and capacitor selection means constituted by the switches 4-1 and 4-2. The switches 72 and 73 are connected between the two inverting input terminals of the operational amplifier 70 and the output terminal 8 respectively, and the switches 2 and 3 are serially connected between the input terminal 15 and the output terminal 8. In addition, one end of each of the capacitors 6-1 and 6-2 is connected in common to the connection point of the switches 2 and 3 via the switches 4-1 and 4-2, and the other ends of the capacitors 6-1 and 6-2 are connected to the two inverting input terminals of the operational amplifier 70 respectively.

Next, the driving circuit of the display apparatus in FIG. 42 will be described with reference to the drawing by taking as an example a case of applying the operational amplifier shown in FIG. 18 to the operational amplifier 70 of each gray scale level output circuit in FIG. 42.

Figure 43:
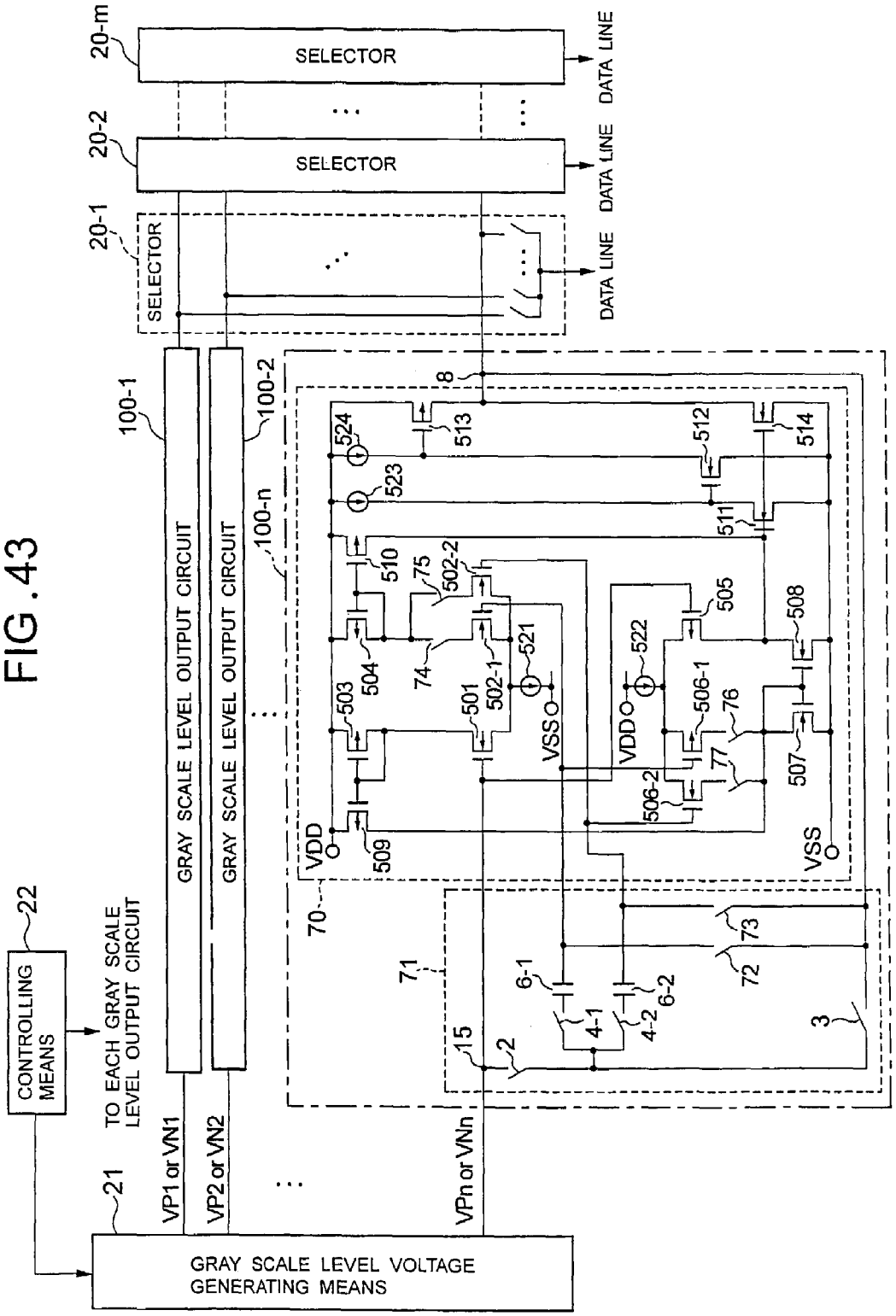
FIG. 43 is a diagram showing the configuration of the driving circuit in the case of applying the operational amplifier shown in FIG. 18 to the operational amplifier 70 of each gray scale level output circuit of the driving circuit shown in FIG. 42.

FIG. 43 is a diagram showing the configuration of the driving circuit in the case of applying the operational amplifier shown in FIG. 18 to the operational amplifier 70 of each gray scale level output circuit of the driving circuit of the display apparatus shown in FIG. 42. The operational amplifier 70 shown in FIG. 43 has two inverting input transistors 502-1 and 502-2 provided in parallel to a non-inverting input transistor 501, and two inverting input transistors 506-1 and 506-2 provided in parallel to a non-inverting input transistor 505.

The gate electrodes of the inverting input transistors 502-1 and 502-2 are corresponding to the two inverting input terminals of the operational amplifier 70 and directly connected to the capacitors 6-1 and 6-2. In addition, the drain electrodes of the inverting input transistors 502-1 and 502-2 are connected in common, and the source electrodes of the inverting input transistors 502-1 and 502-2 are connected in common via switches 74 and 75.

Likewise, the gate electrodes of the inverting input transistors 506-1 and 506-2 are corresponding to the two inverting input terminals of the operational amplifier 70 and directly connected to the capacitors 6-1 and 6-2. In addition, the drain electrodes of the transistors 506-1 and 506-2 are connected in common, and the source electrodes of the transistors 506-1 and 506-2 are connected in common via switches 76 and 77.

Figure 44:
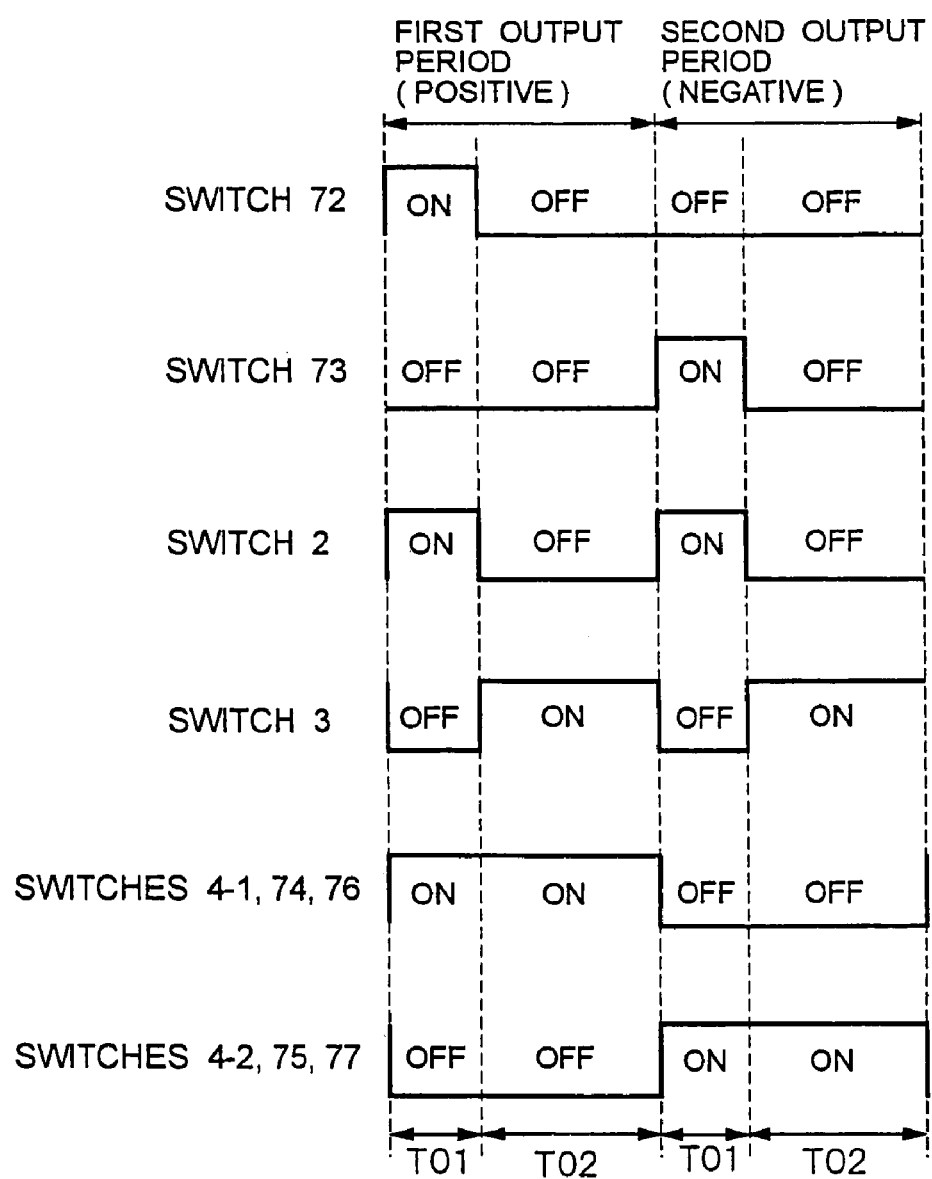
FIG. 44 is a timing chart showing an operation example of each gray scale level output circuit of the driving circuit shown in FIG. 43.

Next, the operation of the driving circuit of the display apparatus in FIG. 43 will be described. FIG. 44 is a timing chart showing an operation example of each gray scale level output circuit of the driving circuit shown in FIG. 43. FIG. 44 shows the state of the switches of each gray scale level output circuit in the two output periods of the first output period for outputting the positive gray scale level voltage and the second output period for outputting the negative gray scale level voltage in the case where the positive and negative gray scale level voltages are periodically and alternately outputted from each of the n pieces of output terminals of the gray scale level voltage generating means 21 in FIG. 43. Moreover, the switches 2, 3, 4-1, 4-2 and 72 to 77 are controlled by the controlling means 22.

With reference to FIGS. 44 and 43, first, in the first output period which is a positive output period, the capacitor 6-1 is selected by turning on the switch 4-1 and turning off the switch 4-2. In addition, as the switches 74, 76 are turned on and the switches 75, 77 are turned off, the transistors 501 and 502-1 operate as a differential pair and the transistors 505 and 506-1 also operate as a differential pair. In addition, the switch 73 is turned off in the first output period. The switches 72 and 2 are turned on and the switch 3 is turned off in the first term T01 of the first output period, and the output voltage Vout of the operational amplifier 70 becomes Vin+Voff wherein the input voltage Vin includes the offset voltage Voff. At this time, the potential of one end of the capacitor 6-1 becomes the input voltage Vin and the potential of the other end becomes the output voltage Vout, and so the capacitor 6-1 is charged with the charge equivalent to the offset voltage Voff generated to the operational amplifier 70 according to the positive gray scale level voltage which is the input voltage.

In the second term T02 of the first output period, the switches 72 and 2 are turned off and the switch 3 is turned on. As the switches 72 and 2 are turned off, the capacitor 6-1 has the offset voltage Voff held thereon. As the switch 3 is turned on, the offset voltage Voff is applied to the inverting input terminal of the operational amplifier 70 in reference to the potential of the output terminal 8. As a result of this, in each of the gray scale level output circuits 100-1 to 100-n, the output voltage Vout becomes Vout=Vin+Voff−Voff=Vin, and so the offset voltage is set off, and the output voltage equal to the input voltage Vin can be obtained.

Next, in the second output period which is a negative output period, the switch 4-2 is turned on and the switch 4-1 is turned off to select the capacitor 6-2. In addition, as the switches 74, 76 are turned off and the switches 75, 77 are turned on, the transistors 501 and 502-2 operate as the differential pair and the transistors 505 and 506-2 also operate as the differential pair. In addition, the switch 72 is turned off in the second output period. The switches 73 and 2 are turned on and the switch 3 is turned off in the first term T01 of the second output period, and the switches 73 and 2 are turned off and the switch 3 is turned on in the second term T02 of the second output period. Also in the second output period, in each of the gray scale level output circuits 100-1 to 100-n, the capacitor 6-2 is charged with the offset voltage generated to the operational amplifier 70 according to the negative gray scale level voltage which is the input voltage, and so the offset voltage is set off, and the output voltage equal to the input voltage Vin can be obtained as in the first output period.

In each unshown output period after the second output period elapsed, it is possible, by controlling the switches according to the polarity as above, to correct the offset voltage so as to obtain the output voltage equal to the input voltage. Of the gray scale level voltages current-amplified by the gray scale level output circuits 100-1 to 100-n, the voltage necessary for driving is selected by each of the selectors 20-1 to 20-m and is outputted to the data line.

Moreover, the timing chart in FIG. 44 shows the case where the switches have no delay and are simultaneously controlled by the controlling means 22. In the case where the switches have delay, however, the switches are controlled in consideration of the delays so that the switches 72 and 2 will not be turned on before the switch 3 is turned off in the first term T01 and the switch 3 will not be turned on before the switches 73 and 2 are turned off in the second term T02.

Figure 45:
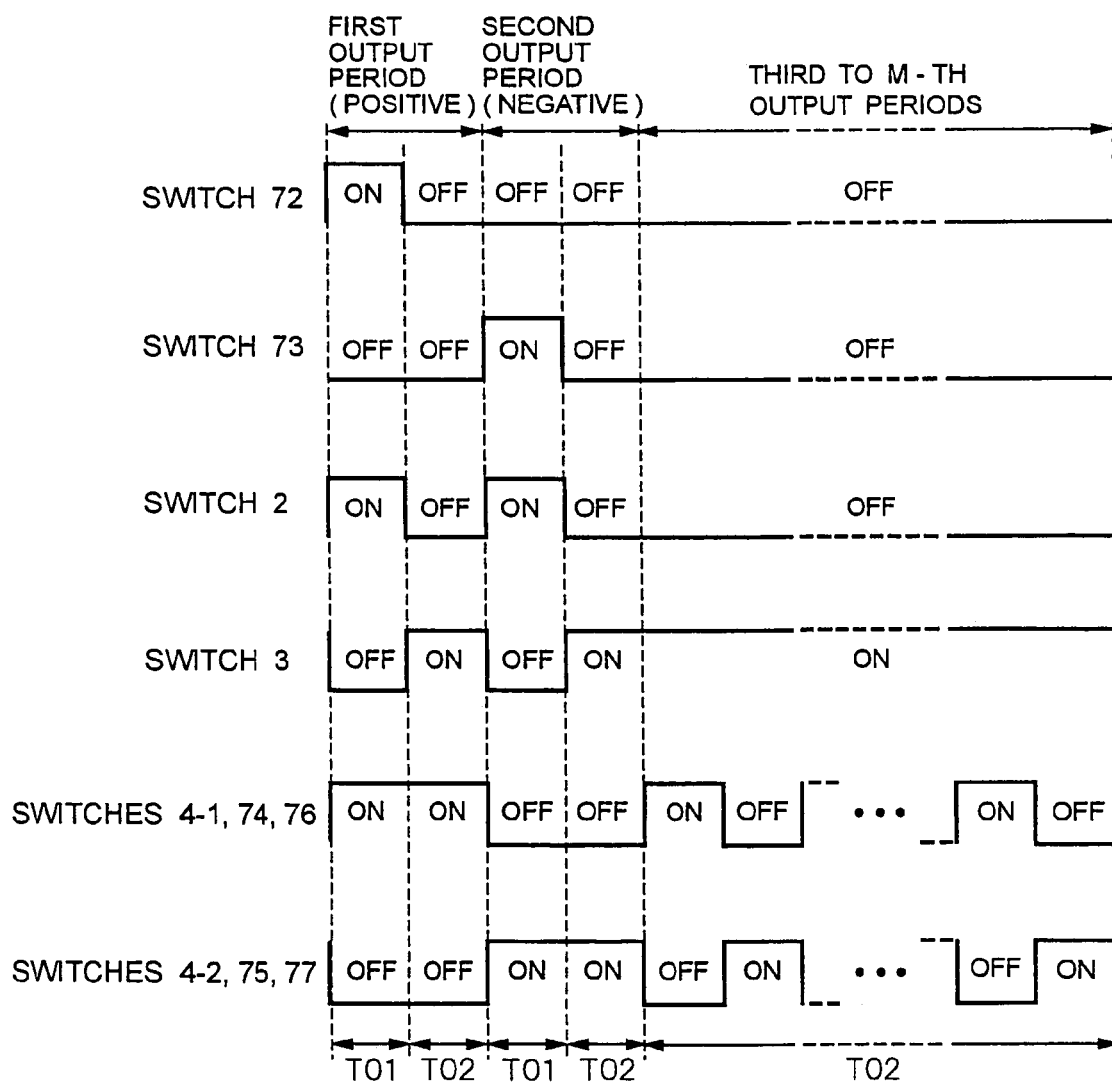
FIG. 45 is a timing chart showing another operation example of each gray scale level output circuit of the driving circuit shown in FIG. 43.
Figure 46:
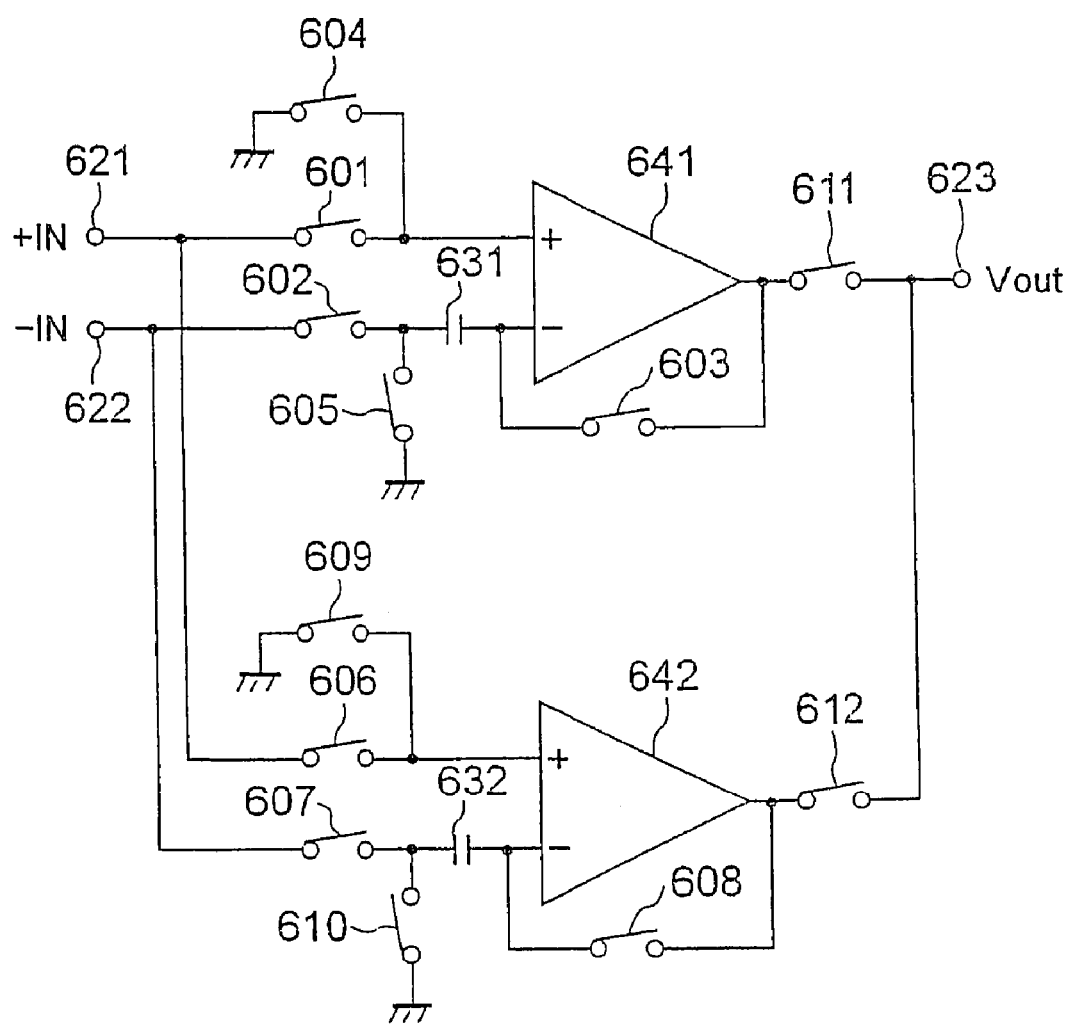
FIG. 46 is a diagram showing a configuration of a first amplifier circuit in the past.
Figure 47:
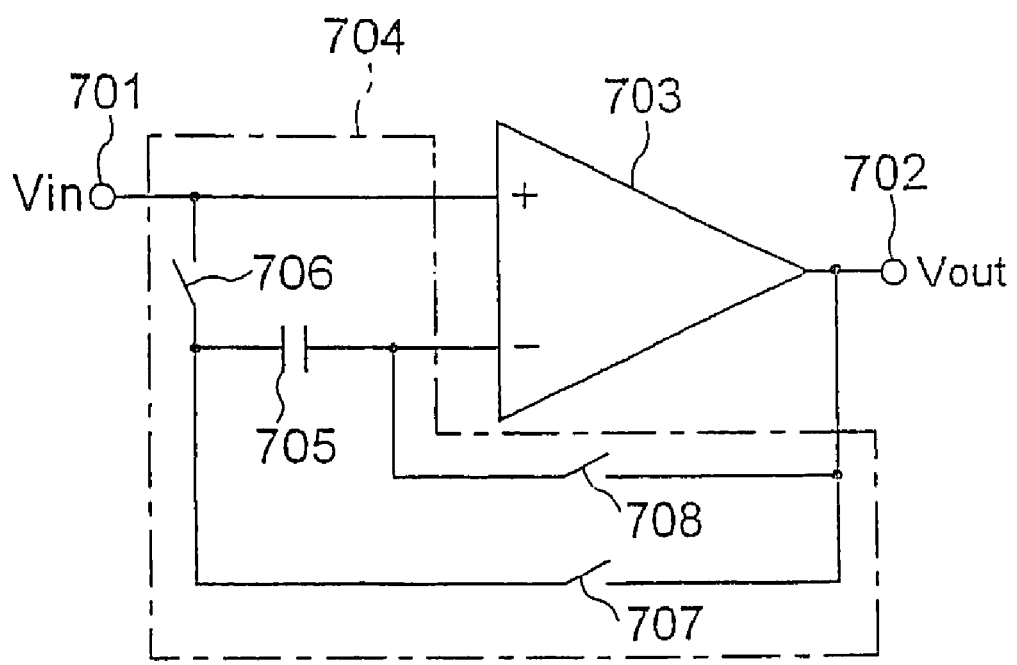
FIG. 47 is a diagram showing a configuration of a second amplifier circuit in the past.
Figure 48:
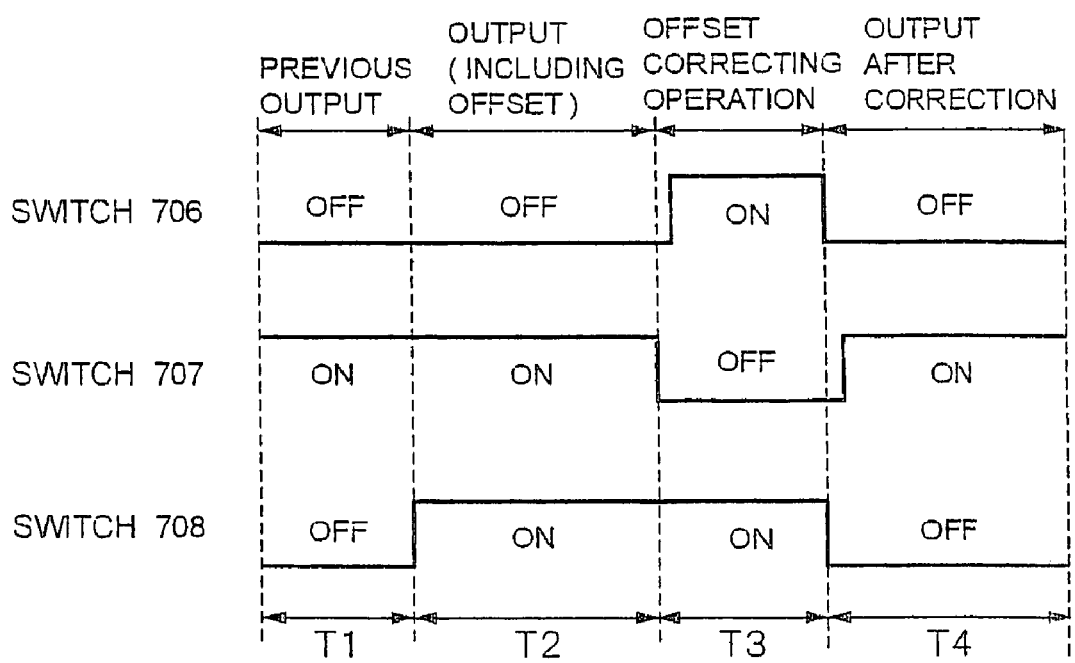
FIG. 48 is a timing chart showing the operation of the amplifier circuit in FIG. 47.
Figure 49:
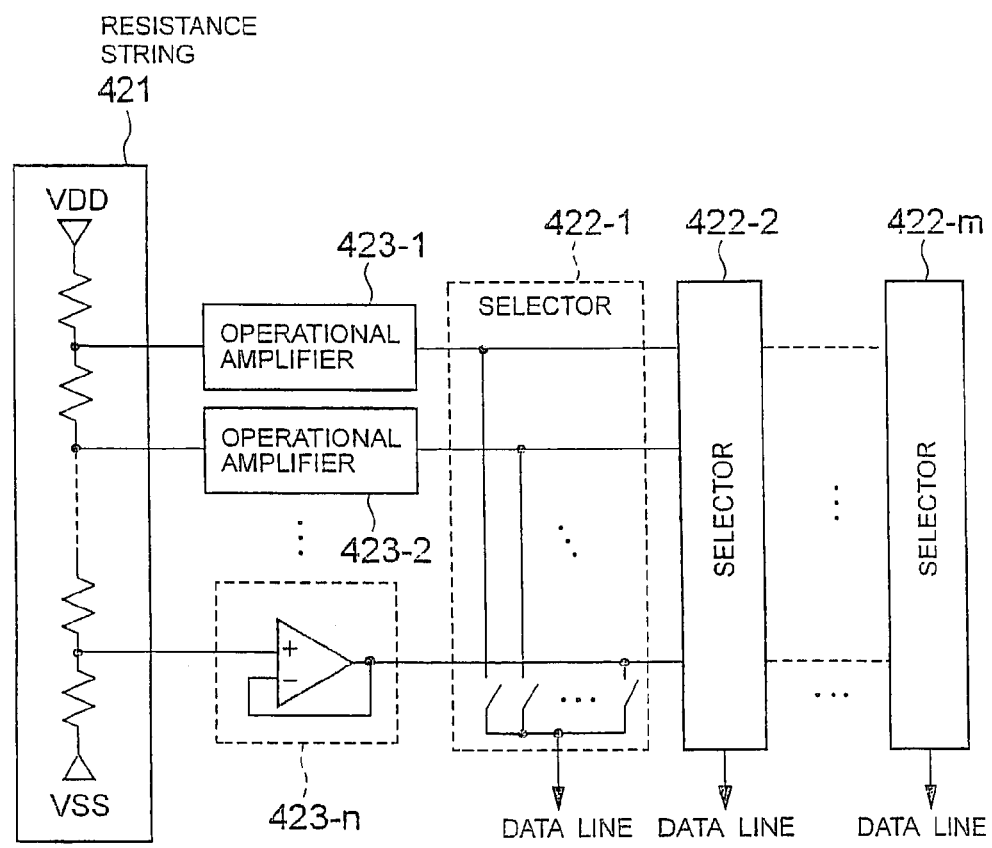
FIG. 49 is a diagram showing a configuration of a first data line driving circuit in the past.

FIG. 45 is a timing chart showing another operation example of each gray scale level output circuit of the driving circuit of the display apparatus shown in FIG. 43. In the timing chart in FIG. 45, the offset correcting operation and correction voltage output are only performed in the initial first and second output periods in the predetermined M (M is a positive even number of 4 or more) pieces of output period, and only the correction voltage output is performed in the third to M-th output periods. Moreover, the switches 2, 3, 4-1, 4-2 and 72 to 77 are controlled by the controlling means 22. In addition, the predetermined M pieces of output period must be set in periods in which the output precision of the gray scale level output circuits is not lowered due to a leak.

With reference to FIG. 45, in the first and second output periods, the same control as the switch control in the first and second output periods in FIG. 44 is performed. Therefore, in the first output period, the capacitor 6-1 is charged with and holds the offset voltage generated to the operational amplifier 70 according to the positive gray scale level voltage inputted to each gray scale level output circuit, and the output of the operational amplifier 70 is corrected by using the offset voltage stored on the capacitor 6-1 so that the output voltage equal to the input voltage can be obtained in each gray scale level output circuit.

Likewise, in the second output period, the capacitor 6-2 is charged with and holds the offset voltage generated to the operational amplifier 70 according to the negative gray scale level voltage inputted to each gray scale level output circuit, and the output of the operational amplifier 70 is corrected by using the offset voltage stored on the capacitor 6-2 so that the output voltage equal to the input voltage can be obtained in each gray scale level output circuit.

Next, of the third to M-th output periods, in the output periods for having the positive gray scale level voltage inputted to each gray scale level output circuit (positive output periods), the capacitor 6-1 stores and holds the charge equivalent to the offset voltage generated to the operational amplifier 70 according to the positive gray scale level voltage in the first output period, and so the output of the operational amplifier 70 can be corrected without performing the offset correcting operation to be performed in the term T01.

Likewise, of the third to M-th output periods, in the output periods for having the negative gray scale level voltage inputted to each gray scale level output circuit (negative output periods), the capacitor 6-2 stores and holds the charge equivalent to the offset voltage generated to the operational amplifier 70 according to the negative gray scale level voltage in the second output period, and so the output of the operational amplifier 70 can be corrected without performing the offset correcting operation to be performed in the term T01.

It is possible, by having the driving circuit shown in FIG. 43 operated by the controlling means 22 according to the operation example in FIG. 45, to correct the output of the operational amplifier 70 by performing the offset correcting operation only in the initial first and second output periods of the first to M-th output periods and without performing the offset correcting operation in the third to M-th output periods thereafter. Therefore, it is possible to curb the power consumption in the first to M-th output periods further than the operation according to the timing chart in FIG. 44.

Thus, it is possible, by performing the operation according to the timing chart in FIG. 45, to perform high-precision offset correction as with the operation according to FIG. 44 and also to realize the power consumption lower than the case of having the driving circuit shown in FIG. 43 operated according to FIG. 44. Moreover, the controlling means 22 may also exert control according to the external signal so as to perform the offset correcting operation without fail when turning on the power of the display apparatus using the driving circuit shown in FIG. 43 or when the driving circuit re-operates from a standstill.

Although in the above description the driving circuit shown in FIG. 42 is described by taking as an example the case of applying the operational amplifier shown in FIG. 18 to the operational amplifier 70, it is possible to use an operational amplifier in any form in the driving circuit of the display apparatus shown in FIG. 42 by providing two inverting input terminals as with the operational amplifier shown in FIG. 43. As described above, the driving circuit of the display apparatus in FIG. 42 can have the same effects as the driving circuit in FIG. 22.

Next, differences in performance between the driving circuit in FIG. 42 and the driving circuit in FIG. 22 will be described.

In the driving circuit in FIG. 22, the capacitor 6-1 or 6-2 is connected to the inverting input terminal of the operational amplifier 10 on the inversion of the polarity. The parasitic capacity such as the gate capacity exists in the inverting input terminal, and the parasitic capacity is charged with the voltage according to the input voltage level before the inversion of the polarity. In the third to M-th output periods in the operation example shown in FIG. 27, the output of the operational amplifier is corrected by using the offset voltages held by the capacitors in the first and second output periods without performing the offset correcting operation. In this instance, there are the cases where, if the inverting input terminal is connected to a different capacitor via the switch 5-1 or 5-2 after the inversion of the polarity, the charge held by the capacitor changes and the precision of the correction lowers because the parasitic capacity of the inverting input terminal is charged with the voltage according to the input voltage level before the inversion of the polarity.

On the other hand, the driving circuit shown in FIG. 42 has two inverting input terminals directly connected to the capacitors 6-1, 6-2 provided to the operational amplifier 70, and so there is no change in the charge held by the capacitor so that the correction voltage output of higher precision than the driving circuit in FIG. 22 becomes possible.

What is claimed is:

1. A driving circuit of a display apparatus comprising:
    gray scale level voltage generating means for generating a plurality of gray scale level voltages;
    a plurality of gray scale level output circuits, provided to a plurality of output terminals of the gray scale level voltage generating means respectively, each of them having an operational amplifier for impedance-converting an input signal inputted via the output terminal of said gray scale level voltage generating means;
    selection means for, of output signals of the plurality of gray scale level output circuits, selecting a signal necessary for driving the display apparatus; and
    controlling means for controlling each of said plurality of gray scale level output circuits,
    wherein each of said plurality of gray scale level output circuits has storing means for storing in advance each of offset voltages generated in said operational amplifier according to the level of the gray scale level voltage of said input signal, and said controlling means controls each of said plurality of gray scale level output circuits to correct output of said operational amplifier by using said offset voltages stored in said storing means; and
    wherein said storing means of each of said plurality of gray scale level output circuits is comprised of a plurality of capacitors for storing said offset voltages respectively.

2. The driving circuit of a display apparatus according to claim 1, wherein said controlling means controls each of said plurality of gray scale level output circuits to select one of said plurality of capacitors according to the level of the gray scale level voltage of said input signal and have the offset voltage of said operational amplifier stored by the selected capacitor in a first term of one output period.

3. The driving circuit of a display apparatus according to claim 2, wherein said controlling means controls each of said plurality of gray scale level output circuits to correct output of said operational amplifier by using said offset voltage stored in said selected capacitor in a second term of said one output period.

4. The driving circuit of a display apparatus according to claim 3, wherein, in the case where the level of the gray scale level voltage of said input signal in an output period later than said one output period is the same as the level of the gray scale level voltage of said input signal in said one output period, said controlling means only exerts control in said second term over each of said plurality of gray scale level output circuits throughout said later output period.

5. The driving circuit of a display apparatus according to claim 3,
    wherein, in the case where the level of the gray scale level voltage of said input signal in an output period later than said one output period is the same as the level of the gray scale level voltage of said input signal in said one output period, and the later output period is the output period within a predetermined period after said one output period elapses, said controlling means only exerts control in said second term over each of said plurality of gray scale level output circuits throughout said later output period.

6. The driving circuit of a display apparatus according to claim 2,
    wherein:
    a circuit input terminal to which said input signal is supplied is connected to one of a pair of input terminals of said operational amplifier in each of said plurality of gray scale level output circuits; and
    said controlling means controls each of said plurality of gray scale level output circuits to connect one end of said selected capacitor to said circuit input terminal and also connect the other end thereof to the other one of said pair of input terminals and an output terminal of said operational amplifier in the first term of said one output period.

7. The driving circuit of a display apparatus according to claim 6, wherein said controlling means controls each of said plurality of gray scale level output circuits to disconnect said one end from said circuit input terminal and disconnect said other end from the output terminal of said operational amplifier and also connect said one end to the output terminal of said operational amplifier in the second term of said one output period.

8. The driving circuit of a display apparatus according to claim 7, wherein said controlling means controls each of said plurality of gray scale level output circuits to disconnect the capacitor selected in a previous output period from the other one of said pair of input terminals and the output terminal of said operational amplifier in the first term of said one output period.

9. A driving circuit of a display apparatus comprising:
    gray scale level voltage generating means for generating a plurality of gray scale level voltages;
    a plurality of gray scale level output circuits, provided to a plurality of output terminals of the gray scale level voltage generating means respectively, each of them having an operational amplifier for impedance-converting an input signal inputted via the output terminal of said gray scale level voltage generating means;
    selection means for, of output signals of the plurality of gray scale level output circuits, selecting a signal necessary for driving the display apparatus; and
    controlling means for controlling each of said plurality of gray scale level output circuits,
    wherein each of said plurality of gray scale level output circuits has storing means for storing in advance each of offset voltages generated in said operational amplifier according to the level of the gray scale level voltage of said input signal, and said controlling means controls each of said plurality of gray scale level output circuits to correct output of said operational amplifier by using said offset voltages stored in said storing means;
    wherein each of said plurality of gray scale level output circuits further has a plurality of corrected output voltage holding capacitors for holding the gray scale level voltages of the output signals of said operational amplifier after correction respectively; and when correcting the output of said operational amplifier of each of said plurality of gray scale level output circuits, said controlling means controls each of said plurality of gray scale level output circuits to apply to the output terminal of said operational amplifier the voltage held by one of said corrected output voltage holding capacitors according to the level of the gray scale level voltage of said input signal.

10. A portable telephone characterized by using a driving circuit of a display apparatus according to claim 1.

11. A portable electronic apparatus characterized by using a driving circuit of a display apparatus according to claim 1.

12. A driving circuit of a display apparatus comprising:
gray scale level voltage generating means for generating a plurality of gray scale level voltages;

a plurality of gray scale level output circuits, provided to a plurality of output terminals of the gray scale level voltage generating means respectively, each of them having an operational amplifier for impedance-converting an input signal inputted via the output terminal of said gray scale level voltage generating means; and selection means for, of output signals of the plurality of gray scale level output circuits, selecting a signal necessary for driving the display apparatus, wherein one of a pair of input terminals of said operational amplifier is connected to a circuit input terminal of said gray scale level output circuit to which the input signal is supplied; and each of said plurality of gray scale level output circuits has a plurality of capacitors, a first switch connected between the other one of said pair of input terminals and the output terminal of said operational amplifier, a second switch of which one end is connected to the one of said pair of input terminals, a third switch connected between the other end of said second switch and said output terminal, a plurality of capacitor selection switches connected between the other end of said second switch and one ends of said plurality of capacitors respectively, a plurality of capacitor selection switches connected between the other one of said pair of input terminals and the other ends of said plurality of capacitors respectively; and switch controlling means for controlling said switches of each of said plurality of gray scale level output circuits to have an offset voltage of said operational amplifier stored in one of said plurality of capacitors according to the level of the gray scale level voltage of said input signal.

13. A driving circuit of a display apparatus comprising:
gray scale level voltage generating means for generating a plurality of gray scale level voltages;

a plurality of gray scale level output circuits, provided to a plurality of output terminals of the gray scale level voltage generating means respectively, each of them having an operational amplifier for impedance-converting an input signal inputted via the output terminal of said gray scale level voltage generating means; and selection means for, of output signals of the plurality of gray scale level output circuits, selecting a signal necessary for driving the display apparatus, wherein one of a pair of input terminals of said operational amplifier is connected to a circuit input terminal of said gray scale level output circuit to which the input signal is supplied; and each of said plurality of gray scale level output circuits has two capacitors, a first switch connected between the other one of said pair of input terminals and the output terminal of said operational amplifier, a second switch of which one end is connected to the one of said pair of input terminals, a third switch connected between the other end of said second switch and said output terminal, two capacitor selection switches connected between the other end of said second switch and one ends of said two capacitors respectively, two capacitor selection switches connected between the other one of said pair of input terminals and the other ends of said two capacitors respectively; and switch controlling means for controlling said switches of each of said plurality of gray scale level output circuits to have an offset voltage of said operational amplifier stored in one of said two capacitors according to a polarity of the gray scale level voltage of said input signal.

14. A controlling method of a driving circuit of a display apparatus having gray scale level voltage generating means for generating a plurality of gray scale level voltages, a plurality of gray scale level output circuits, provided to a plurality of output terminals of the gray scale level voltage generating means respectively, each of them having an operational amplifier for impedance-converting an input signal inputted via the output terminal of said gray scale level voltage generating means and a plurality of capacitors, and selection means for, of output signals of the plurality of gray scale level output circuits, selecting a signal necessary for driving the display apparatus, comprising:

a first step for controlling each of said plurality of gray scale level output circuits to select one of said plurality of capacitors according to the level of the gray scale level voltage of said input signal and have an offset voltage of said operational amplifier stored in the selected capacitor in a first term of one output period; and a second step for controlling each of said plurality of gray scale level output circuits to correct the output of said operational amplifier by using said offset voltage stored in said selected capacitor in a second term of said one output period.

15. The controlling method according to claim 14,
wherein a circuit input terminal to which said input signal is supplied is connected to one of a pair of input terminals of said operational amplifier in each of said plurality of gray scale level output circuits; and in said first step, each of said plurality of gray scale level output circuits is controlled to connect one end of said selected capacitor to said circuit input terminal and connect the other end thereof to the other one of said pair of input terminals and an output terminal of said operational amplifier, and in said second step, each of said plurality of gray scale level output circuits is controlled to disconnect said one end from said circuit input terminal and disconnect said other end from said output terminal of said operational amplifier, and also connect said one end to said output terminal of said operational amplifier.

16. The controlling method according to claim 15, wherein each of said plurality of gray scale level output circuits is controlled to disconnect the capacitor selected in the previous output period from the other one of said pair of input terminals and the output terminal of said operational amplifier in said first step.

17. The controlling method according to claim 14, wherein, in the case where the level of the gray scale level voltage of said input signal in an output period later than said one output period is the same as the level of the gray scale level voltage of said input signal in said one output period, only said second step is performed to each of said plurality of gray scale level output circuits throughout said later output period.

18. The controlling method according to claim 14, wherein, in the case where the level of the gray scale level voltage of said input signal in an output period later than said one output period is the same as the level of the gray scale level voltage of said input signal in said one output period, and the later output period is the output period within a predetermined period after said one output period elapses, only said second step is performed to each of said plurality of gray scale level output circuits throughout the later output period.

19. The controlling method according to claim 14, which is used as a method of controlling a driving circuit of a display apparatus of a portable telephone.

20. A controlling method of a driving circuit of a display apparatus comprising:

gray scale level voltage generating means for generating a plurality of gray scale level voltages;

a plurality of gray scale level output circuits, provided to a plurality of output terminals of the gray scale level voltage generating means respectively, each of them having an operational amplifier for impedance-converting an input signal inputted via the output terminal of said gray scale level voltage generating means; and selection means for, of output signals of the plurality of gray scale level output circuits, selecting a signal necessary for driving the display apparatus, and wherein:

one of a pair of input terminals of said operational amplifier is connected to a circuit input terminal of said gray scale level output circuit to which an input signal is supplied; and each of said plurality of gray scale level output circuits has two capacitors, a first switch connected between the other one of said pair of input terminals and the output terminal of said operational amplifier, a second switch of which one end is connected to one of said pair of input terminals, a third switch connected between the other end of said second switch and said output terminal, two capacitor selection switches connected between the other end of said second switch and one ends of said two capacitors respectively, two capacitor selection switches connected between the other one of said pair of input terminals and the other ends of said two capacitors respectively, and including a step of controlling each of said switches of said plurality of gray scale level output circuits to have an offset voltage of said operational amplifier stored in one of said two capacitors according to a polarity of the gray scale level voltage of said input signal.

* * * * *

UNITED STATES PATENT AND TRADEMARK OFFICE
CERTIFICATE OF CORRECTION

PATENT NO. : 7,586,504 B2  Page 1 of 1
APPLICATION NO. : 11/294605
DATED : September 8, 2009
INVENTOR(S) : Nakahira et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 736 days.

Signed and Sealed this

Fourteenth Day of September, 2010

David J. Kappos
*Director of the United States Patent and Trademark Office*